United States Patent
Burkhart et al.

(10) Patent No.: US 11,999,819 B2
(45) Date of Patent: Jun. 4, 2024

(54) FORMULATION CONTAINING A HIGHLY BRANCHED POLYMER, HIGHLY BRANCHED POLYMER AND ELECTRO-OPTICAL DEVICE CONTAINING THIS HIGHLY BRANCHED POLYMER

(71) Applicant: Merck Patent GmbH, Darmstadt (DE)

(72) Inventors: Beate Burkhart, Darmstadt (DE); Miriam Engel, Darmstadt (DE); Matthias Hengst, Aschaffenburg (DE); Holger Heil, Frankfurt am Main (DE); Manuel Hamburger, Mannheim (DE); Christoph Leonhard, Otzberg (DE); Gaelle Bealle, Heidelberg (DE)

(73) Assignee: Merck Patent GmbH, Darmstadt (DE)

( * ) Notice: Subject to any disclaimer, the term of this patent is extended or adjusted under 35 U.S.C. 154(b) by 565 days.

(21) Appl. No.: 17/260,202

(22) PCT Filed: Jul. 8, 2019

(86) PCT No.: PCT/EP2019/068227
§ 371 (c)(1),
(2) Date: Jan. 13, 2021

(87) PCT Pub. No.: WO2020/011701
PCT Pub. Date: Jan. 16, 2020

(65) Prior Publication Data
US 2021/0277176 A1 Sep. 9, 2021

(30) Foreign Application Priority Data
Jul. 11, 2018 (EP) .................................. 18182941

(51) Int. Cl.
*C08G 61/12* (2006.01)
*C08G 73/02* (2006.01)
(Continued)

(52) U.S. Cl.
CPC ........... *C08G 61/12* (2013.01); *C08G 73/026* (2013.01); *C09D 165/00* (2013.01);
(Continued)

(58) Field of Classification Search
CPC ...... C08G 61/12; C08G 61/122; C08G 73/26; C08G 2261/135; C08G 2261/1412;
(Continued)

(56) References Cited

U.S. PATENT DOCUMENTS 9,825,228 B2 11/2017 Schulte et al.
2008/0061685 A1* 3/2008 Chesterfield ......... H10K 85/115
313/504

(Continued)

FOREIGN PATENT DOCUMENTS

DE 102006006412 8/2007
EP 2272894 1/2011
(Continued)

OTHER PUBLICATIONS

G. Kheter et al. "Cross-Linked Hyperbranched Arylamine Polymers as Hole-Transporting Materials for Polymer LEDs"; Macromolecules, 2006, 39, pp. 7789-7792.
(Continued)

*Primary Examiner* — Shane Fang
(74) *Attorney, Agent, or Firm* — Faegre Drinker Biddle & Reath

(57) ABSTRACT

The present invention relates to formulations comprising at least one hyper-branched polymer which contains 30 to 70 mol % of at least one hole-transporting recurring unit A, 5 to 30 mol % of least one branching recurring unit B, 5 to 30 mol % of at least one further recurring unit C and 5 to 40 mol % of least one end group E, where the recurring units A, B and C are different from one another, and at least one organic solvent, characterised in that the formulation has a viscosity
(Continued)

Figure 1:
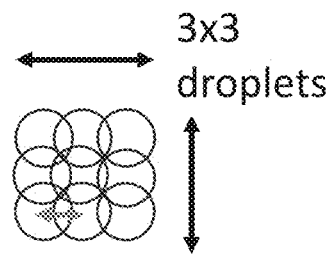

of ≤25 mPas. The present invention furthermore relates to the corresponding hyperbranched polymers and to processes for the preparation thereof. The present invention additionally also relates to the use of the hyperbranched polymers according to the invention in electronic or opto-electronic devices, and to electronic or opto-electronic devices containing these polymers.

12 Claims, 4 Drawing Sheets

(51) Int. Cl.
 *C09D 165/00* (2006.01)
 *H10K 50/15* (2023.01)
 *H10K 71/00* (2023.01)
 *H10K 71/15* (2023.01)
 *H10K 85/10* (2023.01)

(52) U.S. Cl.
 CPC .......... *H10K 85/111* (2023.02); *H10K 85/115* (2023.02); *H10K 85/151* (2023.02); *C08G 2261/135* (2013.01); *C08G 2261/1412* (2013.01); *C08G 2261/148* (2013.01); *C08G 2261/312* (2013.01); *C08G 2261/3142* (2013.01); *C08G 2261/3162* (2013.01); *C08G 2261/411* (2013.01); *C08G 2261/512* (2013.01); *C08G 2261/76* (2013.01); *C08G 2261/95* (2013.01); *H10K 50/15* (2023.02); *H10K 71/00* (2023.02); *H10K 71/15* (2023.02)

(58) Field of Classification Search
 CPC ........ C08G 2261/148; C08G 2261/411; C08G 2261/124; C08G 2261/18; C08G 2261/228; C08G 2261/312; C08G 2261/3142; C08G 2261/3221; C08G 2261/512; C08G 2261/3162; C08G 2261/76; C08G 2261/95; H10K 85/151; H10K 85/115; H10K 85/111; C09D 165/00; H01L 51/0043; H01L 51/0039; H01L 51/5012; H01L 51/5056; G01N 24/087; C08L 79/02
 See application file for complete search history.

(56) References Cited

U.S. PATENT DOCUMENTS

| | | | |
|---|---|---|---|
| 2008/0097076 A1* | 4/2008 | Radu | H10K 85/151 313/507 |
| 2011/0065222 A1 | 3/2011 | Meyer et al. | |
| 2013/0329497 A1 | 12/2013 | Yoon et al. | |
| 2016/0329497 A1 | 11/2016 | Radu et al. | |
| 2018/0308419 A1* | 10/2018 | Asada | H10K 50/81 |
| 2021/0277176 A1* | 9/2021 | Burkhart | C09D 165/00 |
| 2023/0167256 A1* | 6/2023 | Burtovyy | C09D 5/32 252/589 |

FOREIGN PATENT DOCUMENTS

| | | | | |
|---|---|---|---|---|
| EP | 2439804 A1 * | 4/2012 | | C08G 61/12 |
| EP | 2832761 | 2/2015 | | |
| EP | 2771386 B1 | 3/2017 | | |
| EP | 2439804 | 4/2021 | | |
| JP | 2008-280506 | 11/2008 | | |
| WO | WO-2017102048 A1 * | 6/2017 | | C09D 11/36 |

OTHER PUBLICATIONS

English Translation of the International Search Report for PCT/EP2019/068227, dated Oct. 22, 2019, 2 pages.

* cited by examiner

Figure 6:

| Exposure time [sec] | 0 | 60 | 120 | 180 | 300 | dry |
|---|---|---|---|---|---|---|
| Damage to the layer | | | | | | |
| Layer stable | | | | | | |
| Determination of droplet diameter | | | | | | |

Figure 7:

| KPI | Description | LDI | Picture |
|---|---|---|---|
| 0 – 2 | Very stable | ++ | |
| 3 – 5 | Stable | + | |
| 6 – 20 | Usable | o | |
| > 20 | Dissolution | -- | |

FORMULATION CONTAINING A HIGHLY BRANCHED POLYMER, HIGHLY BRANCHED POLYMER AND ELECTRO-OPTICAL DEVICE CONTAINING THIS HIGHLY BRANCHED POLYMER

CROSS-REFERENCE TO RELATED APPLICATIONS

This application is a national stage application (under 35 U.S.C. § 371) of PCT/EP2019/068227, filed Jul. 8, 2019 which claims benefit of European Application No. 18182941.7, filed Jul. 11, 2018, both of which are incorporated herein by reference in their entirety.

The present invention relates to formulations comprising at least one highly branched polymer which contains 30 to 70 mol % of at least one hole-transporting recurring unit A, 5 to 30 mol % of least one branching recurring units B, 5 to 30 mol % of at least one further recurring unit C and 5 to 40 mol % of least one end group E, where the recurring units A, B and C are different from one another, and at least one organic solvent, characterised in that the formulation has a viscosity of 25 mPas.

The present invention furthermore relates to highly branched polymers which contain 30 to 70 mol % of at least one hole-transporting recurring unit A, 5 to 30 mol % of least one branching recurring unit B, 5 to 30 mol % of at least one further recurring unit C and 5 to 40 mol % of least one end group E, where the recurring units A, B and C are different from one another, and to processes for the preparation thereof.

The present invention additionally also relates to the use of the highly branched polymers according to the invention in electronic or opto-electronic devices, in particular in organic electroluminescent devices, so-called OLEDs (OLED=organic light-emitting diode), and to organic electro-luminescent devices containing these polymers.

JP 2008/230506 A discloses crosslinkable, light-emitting polymers which contain light-emitting iridium complexes in the main chain. The polymers disclosed contain crosslinker groups solely as end groups. Polymers containing branching units are not disclosed.

EP 2 439 804 A1 discloses crosslinkable, hole-transporting polymers which contain phenyl groups as branching units in the main chain. The polymers disclosed contain crosslinker groups solely as end groups.

Crosslinkable, highly branched triaryl polymers as hole-transport materials are described by Paul et al., in Macromolecules 2006, 39, 7789-7792. The polymers disclosed are homopolymers comprising triarylamine units, where each recurring unit is crosslinked and/or branched.

US 2016/0329497 A1 discloses branched, hole-transporting polymers which, in addition, may contain branching units in the main chain. These polymers are processed from solution by spin coating.

Starting from the known prior art, it can be regarded as an object of the present invention to provide formulations which comprise polymers. The polymers here must have the desired electro-optical properties and have adequate solubility in the solvent or solvent mixture used. The solvents must be selected with their properties so that they dissolve the polymer in sufficient amount, and that they have corresponding physical properties, such as, for example, viscosity and boiling point, so that the formulations obtained can be processed by printing and coating techniques, such as, for example, ink-jet printing.

This object is achieved in accordance with the invention by the provision of formulations comprising a highly branched polymer and at least one organic solvent, characterised in that the formulation has a viscosity of ≤25 mPas.

The highly branched polymers here contain:
- 30 to 70 mol % of at least one hole-transporting recurring unit A,
- 5 to 30 mol % of at least one branching recurring unit B,
- 5 to 30 mol % of at least one further recurring unit C, and
- 5 to 40 mol % of at least one end group E,
where the recurring units A, B and C are different from one another.

The present invention relates to formulations comprising a highly branched polymer which contains 30 to 70 mol % of at least one hole-transporting recurring unit A, 5 to 30 mol % of least one branching recurring unit B, 5 to 30 mol % of at least one further recurring unit C and 5 to 40 mol % of least one end group E, where the recurring units A, B and C are different from one another, and at least one organic solvent, characterised in that the formulation has a viscosity of ≤25 mPas.

The present invention additionally relates to highly branched polymers which contain 30 to 70 mol % of at least one hole-transporting recurring unit A, 5 to 30 mol % of least one branching recurring unit B, 5 to 30 mol % of at least one further recurring unit C and 5 to 40 mol % of least one end group E, where the recurring units A, B and C are different from one another.

In a first preferred embodiment, the formulation according to the invention comprises an organic solvent. In a second preferred embodiment, the formulation according to the invention comprises two or more, particularly preferably two, three or four, organic solvents.

The formulation according to the invention has a viscosity of ≤25 mPas. The formulation preferably has a viscosity in the range from 2 to 20 mPas and particularly preferably in the range from 2 to 15 mPas.

The viscosity of the formulations according to the invention and of the solvents is measured using a Discovery AR3 1° plate-and-cone rotational viscometer (Thermo Scientific). The equipment allows precise control of the temperature and shear rate. The measurement of the viscosity is carried out at a temperature of 25.0° C. (+/−0.2° C.) and a shear rate of 500 s$^{-1}$. Each sample is measured three times, and the measured values obtained are averaged.

The formulation according to invention preferably has a surface tension in the range from 15 to 70 mN/m, particularly preferably in the range from 20 to 50 mN/in and very particularly preferably in the range from 25 to 40 mN/m.

The organic solvent or solvent mixture preferably has a surface tension in the range from 15 to 70 mN/m, particularly preferably in the range from 20 to 50 mN/m and very particularly preferably in the range from 25 to 40 mN/m.

The surface tension can be measured using an FTA (First Ten Angstrom) 1000 contact angle goniometer at 20° C. Details on the method are available from First Ten Angstrom, such as from Roger P. Woodward, Ph.D. "Surface Tension Measurements using the Drop Shape Method". The pendant drop method can preferably be used for determination of the surface tension. This measurement technique utilises a hanging drop from a needle into a liquid or gaseous phase. The shape of the drop arises from the relationship between the surface tension, gravity and the density differences. With the aid of the pendant drop method, the surface tension can be calculated from the silhouette of a pendant drop under http://www.kruss.de/services/education-theory/glossary/drop-shape-analysis. A generally used and commercially available precision drop contour analysis tool, namely FTA1000 from First Ten Angström, was used in order to carry out all surface tension measurements. The surface tension is determined by the FTA1000 software. All measurements were carried out at room temperature in the range between 20° C. and 25° C. The standard operating procedure comprises determination of the surface tension of each formulation using a fresh disposable drop dispensing system (syringe and needle). Each drop is measured over the duration of one minute using 60 measurements, which are later averaged. Three drops are measured for each formulation. The final value is averaged over these measurements. The tool is regularly checked against various liquids of known surface tension.

In addition, the at least one organic solvent has a boiling point at atmospheric pressure of at least 2000C, preferably a boiling point of at least 220° C., particularly preferably a boiling point of at least 240° C.

Suitable organic solvents are preferably organic solvents, which include, inter alia, ketones, ethers, esters, amides (such as, for example, di-$C_{1-2}$-alkylformamides), sulfur compounds, nitro compounds, hydrocarbons, halogenated hydrocarbons (for example chlorinated hydrocarbons), aromatic and heteroaromatic hydrocarbons (for example naphthalene derivatives) and halogenated aromatic and heteroaromatic hydrocarbons.

The organic solvent can preferably be selected from one of the following groups: substituted and unsubstituted aromatic or linear ethers, such as 3-phenoxytoluene or anisole; substituted or unsubstituted arene derivatives, such as cyclohexylbenzene; substituted or unsubstituted indanes, such as hexamethylindane; substituted and unsubstituted aromatic or linear ketones, such as dicyclohexylmethanone; substituted and unsubstituted heterocycles, such as pyrrolidinones, pyridines, pyrazines; other fluorinated or chlorinated aromatic hydrocarbons, substituted or unsubstituted naphthalenes, such as alkyl-substituted naphthalenes, such as 1-ethylnaphthalene.

Particularly preferred organic solvents are, for example, 1-ethylnaphthalene, 2-ethylnaphthalene, 2-propylnaphthalene, 2-(1-methylethyl)naphthalene, 1-(1-methylethyl)naphthalene, 2-butylnaphthalene, 1,6-dimethylnaphthalene, 2,2'-dimethylbiphenyl, 3,3'-dimethylbiphenyl, 1-acetyinaphthalene, 1,2,3,4-tetramethylbenzene, 1,2,3,5-tetramethylbenzene, 1,2,4,5-tetramethylbenzene, 1,2,4-trichlorobenzene, 1,2-dihydronaphthalene, 1,2-dimethylnaphthalene, 1,3-benzodioxole, 1,3-diisopropylbenzene, 1,3-dimethylnaphthalene, 1,4-benzodioxane, 1,4-diisopropylbenzene, 1,4-dimethylnaphthalene, 1,5-dimethyltetralin, 1-benzothiophene, thianaphthalene, 1-bromonaphthalene, 1-chloromethylnaphthalene, 1-methoxynaphthalene, 1-methylnaphthalene, 2 bromo-3-bromomethylnaphthalene, 2-bromomethylnaphthalene, 2-bromonaphthalene, 2-ethoxynaphthalene, 2-isopropylanisole, 3,5-dimethylanisole, 5-methoxyindene, 5-methoxyindole, 5-tert-butyl-m-xylene, 6-methylquinoline, 8-methylquinoline, acetophenone, benzothiazole, benzyl acetate, butyl phenyl ether, cyclohexylbenzene, decahydronaphthol, dimethoxytoluene, 3-phenoxytoluene, diphenyl ether, propiophenone, hexylbenzene, hexamethylindane, isochroman, phenyl acetate, propiophenone, veratrol, pyrrolidinone, N,N-dibutylaniline, cyclohexyl hexanoate, menthyl isovalerate, dicyclohexylmethanone, ethyl laurate, ethyl decanoate, (-)-fenchone, 2-methylbenzothiazole, 2-phenoxy-ethanol, 2-pyrrolidinone, 3-methylanisole, 4-methylanisole, 3,4-dimethylanisole, 3,5-dimethylanisole, α-terpineol, butyl benzoate, cumene, cyclo-hexanol, decalin, dodecylbenzene, ethyl benzoate, indane, methyl benzoate, NMP, p-cymene, phenetole, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, heptylbenzene, octylbenzene, 1,1-bis(3,4-dimethylphenyl)ethane.

The highly branched polymer preferably has a solubility of ≤5 g/l and particularly preferably a solubility of ≤10 g/A in the at least one organic solvent.

The concentration of the highly branched polymer in the formulation is preferably in the range from 5 to 50 g/l, particularly preferably in the range from 10 to 50 g/l.

The highly branched polymer preferably has a molecular weight $M_w$ in the range from 15,000 to 1,000,000 g/mol, particularly preferably in the range from 20,000 to 750,000 g/mol and very particularly preferably from 25,000 to 500,000 g/mol. The determination of the molecular weight $M_w$ is carried out by means of GPC(=gel permeation chromatography) against an internal polystyrene standard.

The highly branched polymer contains
30 to 70 mol % of at least one hole-transporting recurring unit A,
5 to 30 mol % of at least one branching recurring unit B,
5 to 30 mol % of at least one further recurring unit C, and
5 to 40 mol % of at least one end group E,
where the recurring units A, B and C are different from one another.

In addition, the highly branched polymer may in a preferred embodiment additionally contain 1 to 35 mol % of at least one crosslinkable unit D.

The highly branched polymer contains 30 to 70 mol %, preferably 30 to 60 mol % and particularly preferably 30 to 50 mol %, of at least one hole-transporting recurring unit A.

Hole-transporting recurring units A that can be employed are all recurring units having hole-transporting properties that are known to the person skilled in the art.

Preferred recurring units which have hole-transporting properties are, for example, triarylamine, benzidine, tetraaryl-para-phenylenediamine, triaryl-phosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles.

Particularly preferred recurring units which have hole-transporting properties are units comprising triarylamine derivatives.

The triarylamine derivatives here particularly preferably have the structure of the following formula (A):

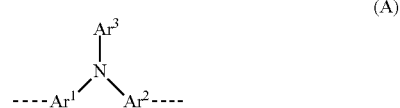

(A)

where
Ar¹ to Ar³ are on each occurrence, in each case identically or differently, a mono- or polycyclic, aromatic or heteroaromatic ring system having 5 to 60 aromatic ring atoms, which may be substituted by one or more radicals R;
R is on each occurrence, identically or differently, H, D, F, Cl, Br, I, N(R¹)₂, CN, NO₂, Si(R¹)₃, B(OR¹)₂, C(=O)R¹, P(=O)(R¹)₂, S(=O)R¹, S(=O)₂R¹, OSO$_2$R$^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals R$^1$, where one or more non-adjacent CH$_2$ groups may be replaced by R$^1$C=CR$^1$, C≡C, Si(R$^1$)$_2$, C=O, C=S, C=NR$^1$, P(=O)(R$^1$), SO, SO$_2$, NR$^1$, O, S or CONR$^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals R$^1$, or an aryloxy or heteroaryloxy group having 5 to 60 aromatic ring atoms, which may be substituted by one or more radicals R$^1$, or an aralkyl or heteroarylaralkyl group having 5 to 60 aromatic ring atoms, which may be substituted by one or more radicals R$^1$, or a diarylamino group, diheteroarylamino group or arylheteroarylamino group having 10 to 40 aromatic ring atoms, which may be substituted by one or more radicals R$^1$, or a cross-linkable group Q, where two or more radicals R may also form a mono- or polycyclic, aliphatic, aromatic and/or benzo-fused ring system with one another;

R$^1$ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents R$^1$ may also form a mono- or polycyclic, aliphatic or aromatic ring system with one another; and the dashed lines represent bonds to adjacent structural units in the polymer.

The term "structural unit" in the present application is taken to mean a unit which, starting from a monomer unit which contains at least two, preferably two, reactive groups, is incorporated into the polymer backbone as a part thereof by reaction with bond formation and is thus present in the polymer prepared as linked recurring unit.

The term "mono- or polycyclic, aromatic ring system" in the present application is taken to mean an aromatic ring system having 6 to 60, preferably 6 to 30 and particularly preferably 6 to 24 aromatic ring atoms, which does not necessarily contain only aromatic groups, but instead in which a plurality of aromatic units may also be interrupted by a short non-aromatic unit (<10% of the atoms other than H, preferably <5% of the atoms other than H), such as, for example, an sp$^3$-hybridised C atom or O or N atom, a CO group, etc. Thus, for example, systems such as, for example, 9,9'-spirobifluorene, 9,9-diarylfluorene and 9,9-dialkylfluorene are also intended to be taken to be aromatic ring systems.

The aromatic ring systems can be mono- or polycyclic, i.e. they can contain one ring (for example phenyl) or a plurality of rings, which may also be condensed (for example naphthyl) or covalently linked (for example biphenyl), or contain a combination of condensed and linked rings.

Preferred aromatic ring systems are, for example, phenyl, biphenyl, terphenyl, [1,1':3',1" ]terphenyl-2'-yl, quaterphenyl, naphthyl, anthracene, binaphthyl, phenanthrene, dihydrophenanthrene, pyrene, dihydropyrene, chrysene, perylene, tetracene, pentacene, benzopyrene, fluorene, indene, indenofluorene and spirobifluorene.

The term "mono- or polycyclic, heteroaromatic ring system" in the present application is taken to mean an aromatic ring system having 5 to 60, preferably 5 to 30 and particularly preferably 5 to 24 aromatic ring atoms, where one or more of these atoms is (are) a heteroatom. The "mono- or polycyclic, heteroaromatic ring system" does not necessarily contain only aromatic groups, but instead may also be interrupted by a short non-aromatic unit (<10% of the atoms other than H, preferably <5% of the atoms other than H), such as, for example, an sp$^3$-hybridised C atom or O or N atom, a CO group, etc.

The heteroaromatic ring systems can be mono- or polycyclic, i.e. they can contain one ring or a plurality of rings, which may also be condensed or covalently linked (for example pyridylphenyl), or contain a combination of condensed and linked rings. Preference is given to fully conjugated hetero-aryl groups.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or groups having a plurality of rings, such as carbazole, indenocarbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzo-pyrimidine, quinoxaline, phenazine, naphthyridine, azacarbazole, benzocarboline, phenanthridine, phenanthroline, thieno[2,3b]thiophene, thieno-[3,2b]thiophene, dithienothiophene, isobenzothiophene, dibenzothiophene, benzothiadiazothiophene or combinations of these groups.

The mono- or polycyclic, aromatic or heteroaromatic ring system can be unsubstituted or substituted. Substituted in the present application means that the mono- or polycyclic, aromatic or heteroaromatic ring system contains one or more substituents R.

R is preferably on each occurrence, identically or differently, H, D, F, Cl, Br, I, N(R$^1$)$_2$, CN, NO$_2$, Si(R$^1$)$_3$, B(OR$^1$)$_2$, C(=O)R$^1$, P(=O)(R$^1$)$_2$, S(=O)R$^1$, S(=O)$_2$R$^1$, OSO$_2$R$^1$, a straight-chain alkyl, alkoxy or thioalkoxy group having 1 to 40 C atoms or an alkenyl or alkynyl group having 2 to 40 C atoms or a branched or cyclic alkyl, alkoxy or thioalkoxy group having 3 to 40 C atoms, which may in each case be substituted by one or more radicals R$^1$, where one or more non-adjacent CH$_2$ groups may be replaced by R$^1$C=CR$^1$, C≡C, Si(R$^1$)$_2$, C=O, C=S, C=NR$^1$, P(=O)(R$^1$), SO, SO$_2$, NR$^1$, O, S or CONR$^1$ and where one or more H atoms may be replaced by D, F, Cl, Br, I or CN, or an aromatic or heteroaromatic ring system having 5 to 60 aromatic ring atoms, which may in each case be substituted by one or more radicals R$^1$, or an aryloxy or heteroaryloxy group having 5 to 60 aromatic ring atoms, which may be substituted by one or more radicals R$^1$, or an aralkyl or heteroaralkyl group having 5 to 60 aromatic ring atoms, which may be substituted by one or more radicals R$^1$, or a diarylamino group, diheteroarylamino group or arylheteroarylamino group having 10 to 40 aromatic ring atoms, which may be substituted by one or more radicals R$^1$, or a crosslinkable group Q; two or more radicals R here may also form a mono- or polycyclic, aliphatic, aromatic and/or benzo-fused ring system with one another.

R is particularly preferably on each occurrence, identically or differently, H, D, F, Cl, Br, I, N(R$^1$)$_2$, Si(R$^1$)$_3$, B(OR$^1$)$_2$, C(=O)R$^1$, P(=O)(R$^1$)$_2$, a straight-chain alkyl or alkoxy group having 1 to 20 C atoms or an alkenyl or alkynyl group having 2 to 20 C atoms or a branched or cyclic alkyl or alkoxy group having 3 to 20 C atoms, which may in each case be substituted by one or more radicals R$^1$, where one or more non-adjacent CH$_2$ groups may be replaced by R$^1$C=CR$^1$, C=C, Si(R$^1$)$_2$, C=O, C=NR$^1$, P(=O)(R$^1$), NR$^1$, O or CONR$^1$ and where one or more H atoms may be replaced by F, Cl, Br or I, or an aromatic or heteroaromatic ring system having 5 to 30 aromatic ring atoms, which may in each case be substituted by one or more radicals R$^1$, or an aryloxy or heteroaryloxy group having 5 to 30 aromatic ring atoms, which may be substituted by one or more radicals R$^1$, or an aralkyl or heteroalkyl group having 5 to 30 aromatic ring atoms, which may be substituted by one or more radicals R$^1$, or a diarylamino group, diheteroarylamino group or arylheteroarylamino group having 10 to 20 aromatic ring atoms, which may be substituted by one or more radicals R$^1$, or a cross-linkable group Q; two or more radicals R here may also form a mono- or polycyclic, aliphatic, aromatic and/or benzo-fused ring system with one another.

R is very particularly preferably on each occurrence, identically or differently, H, a straight-chain alkyl or alkoxy group having 1 to 10 C atoms or an alkenyl or alkynyl group having 2 to 10 C atoms or a branched or cyclic alkyl or alkoxy group having 3 to 10 C atoms, which may in each case be substituted by one or more radicals R$^1$, where one or more non-adjacent CH$_2$ groups may be replaced by R$^1$C=CR$^1$, C=C, C=O, C=NR$^1$, NR$^1$, O or CONR$^1$, or an aromatic or heteroaromatic ring system having 5 to 20 aromatic ring atoms, which may in each case be substituted by one or more radicals R$^1$, or an aryloxy or heteroaryloxy group having 5 to 20 aromatic ring atoms, which may be substituted by one or more radicals R$^1$, or an aralkyl or heteroalkyl group having 5 to 20 aromatic ring atoms, which may be substituted by one or more radicals R$^1$, or a diarylamino group, diheteroarylamino group or arylheteroarylamino group having 10 to 20 aromatic ring atoms, which may be substituted by one or more radicals R$^1$, or a crosslinkable group Q; two or more radicals R here may also form a mono- or polycyclic, aliphatic, aromatic and/or benzo-fused ring system with one another.

In a preferred embodiment, the triarylamine derivatives have the structure of the following formula (A):

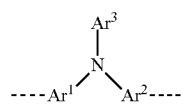

(A)

where Ar$^1$, Ar$^2$ and Ar$^3$ can adopt the meanings indicated above, but characterised in that Ar$^3$ is substituted by Ar$^4$ in at least one, preferably in one, of the two ortho positions, where Ar$^4$ is a mono- or polycyclic, aromatic or heteroaromatic ring system having 5 to 60 aromatic ring atoms, which may be substituted by one or more radicals R, where R can adopt the meanings indicated above.

Ar$^4$ here can be linked to Ar$^3$ either directly, i.e. via a single bond, or alternatively via a linking group X.

In a first embodiment, the structural unit of the formula (A) thus preferably has the structure of the following formula (A1):

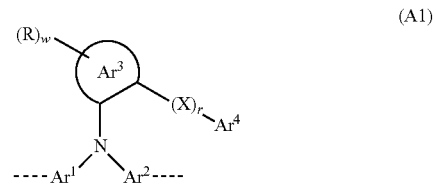

(A1)

where Ar$^1$, Ar$^2$, Ar$^3$, Ar$^4$ and R can adopt the meanings indicated above in relation to formula A, w=0, 1, 2, 3, 4, 5 or 6, preferably 0, 1, 2, 3 or 4, X=CR$_2$, NR, SiR$_2$, O, S, C=O or P=O, preferably CR$_2$, NR, O or S, and r=0 or 1, preferably 0.

In a second embodiment of the present invention, the at least one structural unit of the formula (A) of the polymer according to the invention is characterised in that Ar$^3$ is substituted by Ar$^4$ in one of the two ortho positions, and Ar$^3$ is additionally linked to Ar$^4$ in the meta-position adjacent to the substituted ortho position.

In a second embodiment, the structural unit of the formula (A) thus preferably has the structure of the following formula (A2):

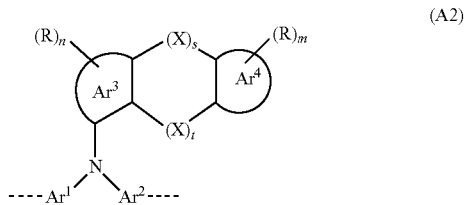

(A2)

where Ar$^1$, Ar$^2$, Ar$^3$, Ar$^4$ and R can adopt the meanings indicated above in relation to formula A, m=0, 1, 2, 3 or 4, n=0, 1, 2 or 3, X=CR$_2$, NR, SiR$_2$, O, S, C=O or P=O, preferably CR$_2$, NR, O or S, and s and t are each 0 or 1, where the sum (s+t)=1 or 2, preferably 1.

In a preferred embodiment, the at least one structural unit of the formula (A) is selected from the structural units of the following formulae (A3), (A4) and (A5):

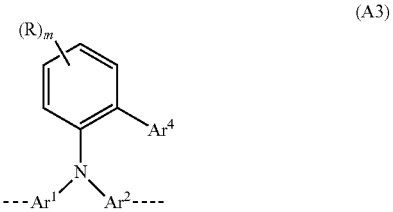

(A3)

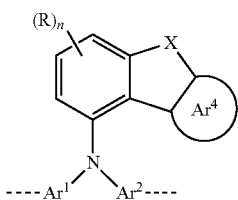

(A4)

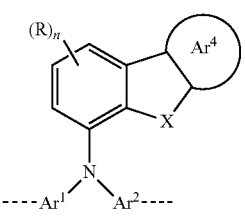

(A5)

where $Ar^1$, $Ar^2$, $Ar^4$ and R can adopt the meanings indicated above in relation to formula A, m=0, 1, 2, 3 or 4, n=0, 1, 2 or 3, and $X=CR_2$, NR, $SiR_2$, O, S, C=O or P=O, preferably $CR_2$, NR, O or S.

In a particularly preferred embodiment, the at least one structural unit of the formula (A3) is selected from the structural unit of the following formula (A6):

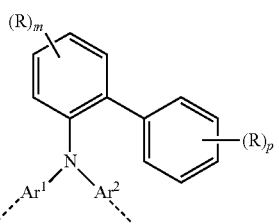

(A6)

where $Ar^1$, $Ar^2$, R and m can adopt the meanings indicated above in relation to formulae A and A2, and p=0, 1, 2, 3, 4 or 5.

Examples of preferred structural units of the formula (A6) are depicted in the following table:

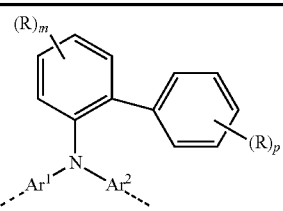

(A6a)

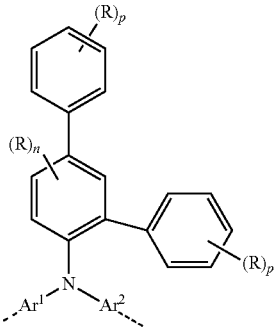

(A6b)

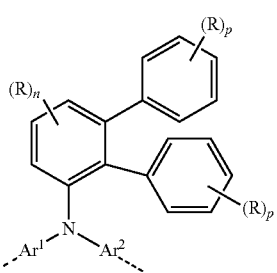

(A6c)

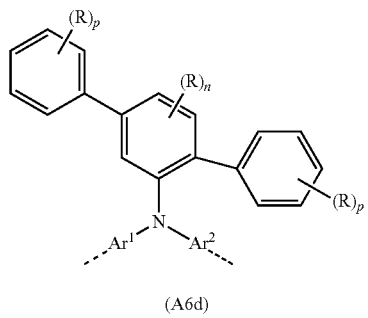

(A6d)

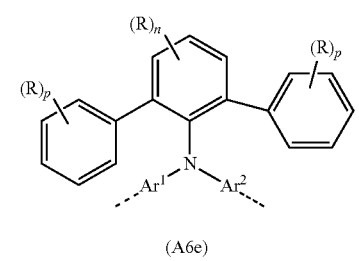

(A6e)

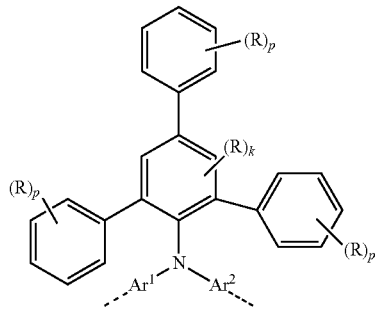

(A6f)

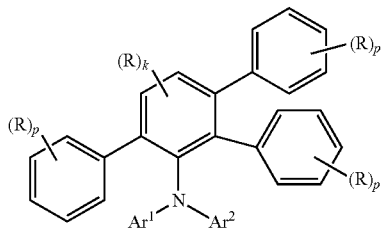

(A6g)

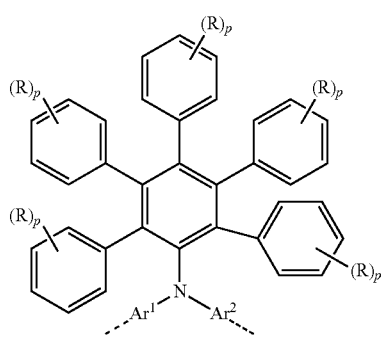

(A6h)

where Ar$^1$, Ar$^2$, R, m, n and p can adopt the meanings indicated above, and k=0, 1 or 2.

In a further particularly preferred embodiment, the at least one structural unit of the formula (A4) is selected from the structural unit of the following formula (A7):

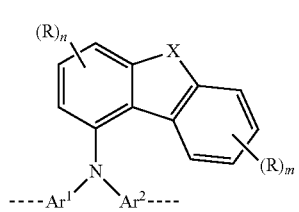

(A7)

where Ar$^1$, Ar$^2$, X, R, m and n can adopt the meanings indicated above in relation to the formulae A, A1 and A2.

Examples of preferred structural units of the formula (A7) are depicted in the following table:

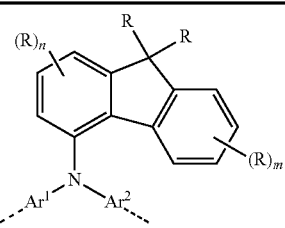

(A7a)

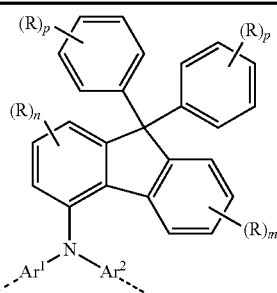

(A7b)

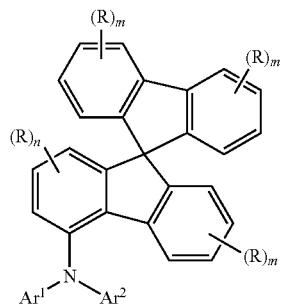

(A7c)

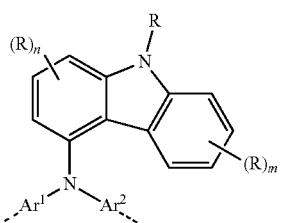

(A7d)

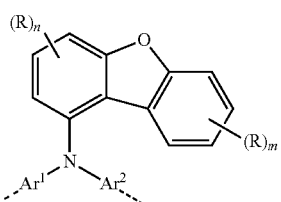

(A7e)

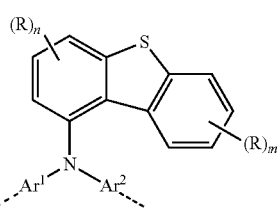

(A7f)

where Ar$^1$, Ar$^2$, R, m, n and p can adopt the meanings indicated above in relation to the formulae A, A2 and A6.

In still a further particularly preferred embodiment, the at least one structural unit of the formula (A5) is selected from the structural unit of the following formula (A8):

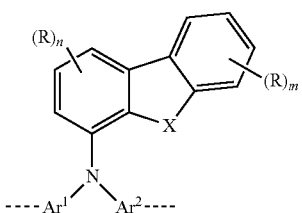

(A8)

where Ar¹, Ar², X, R, m and n can adopt the meanings indicated above in relation to the formulae A, A1 and A2.

Examples of preferred structural units of the formula (A8) are depicted in the following table:

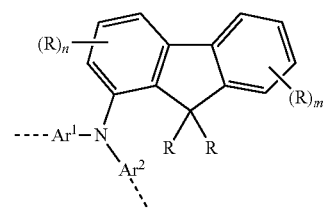

(A8a)

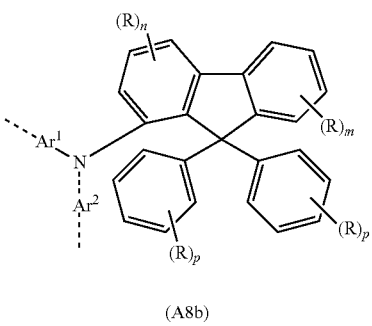

(A8b)

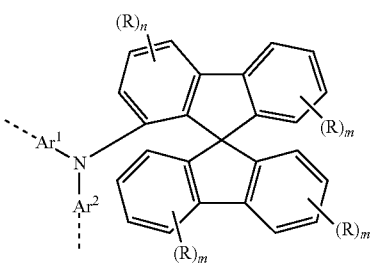

(A8c)

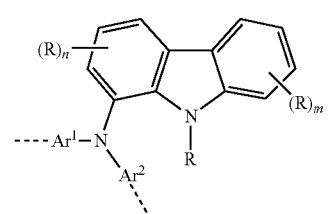

(A8d)

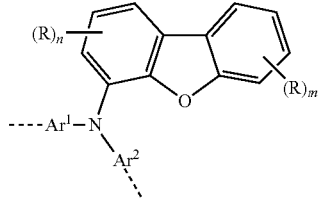

(A8e)

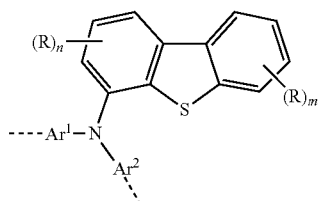

(A8f)

where Ar¹, Ar², R, m, n and p can adopt the meanings indicated above in relation to the formulae A, A2 and A6.

In a very particularly preferred embodiment, the at least one structural unit of the formula (A6) is selected from the structural unit of the following formula (A9):

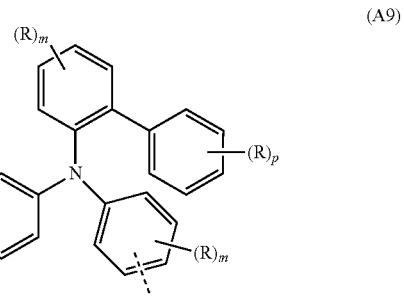

(A9)

where R, m and p can adopt the meanings indicated above in relation to the formulae A, A2 and A6.

Examples of preferred structural units of the formula (A9) are depicted in the following table:

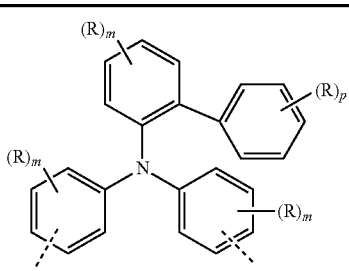

(A9a)

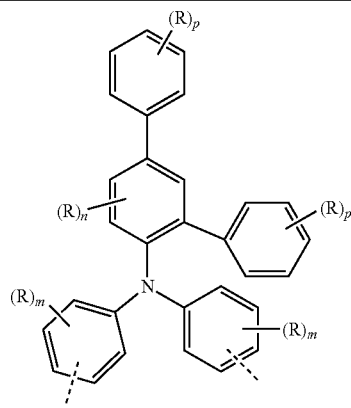
(A9b)
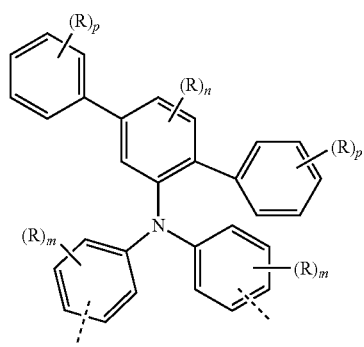
(A9c)
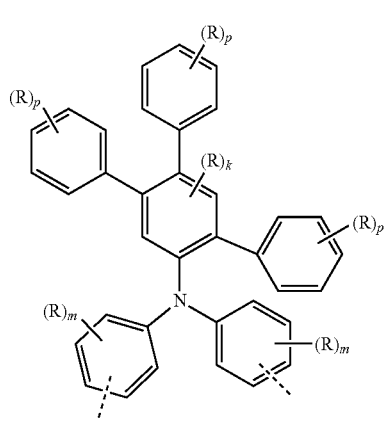
(A9d)
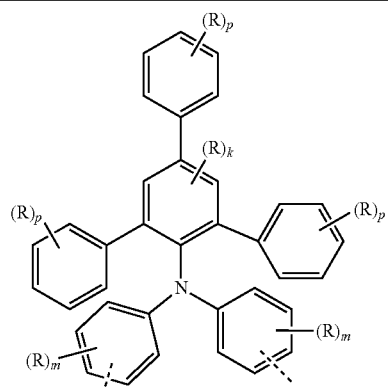
(A9e)
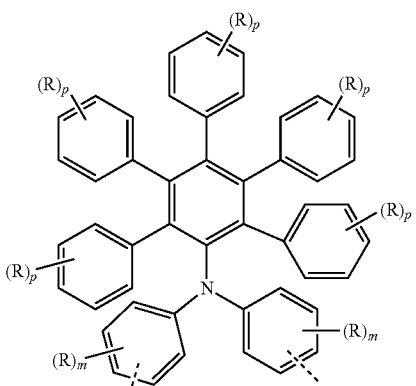
(A9f)
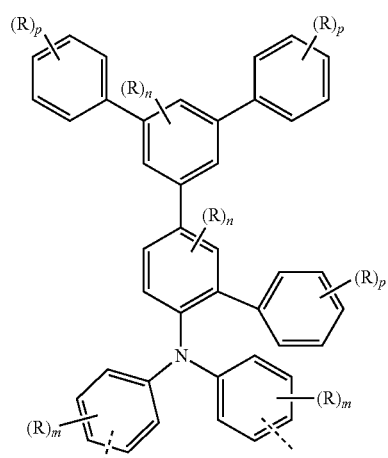
(A9g)

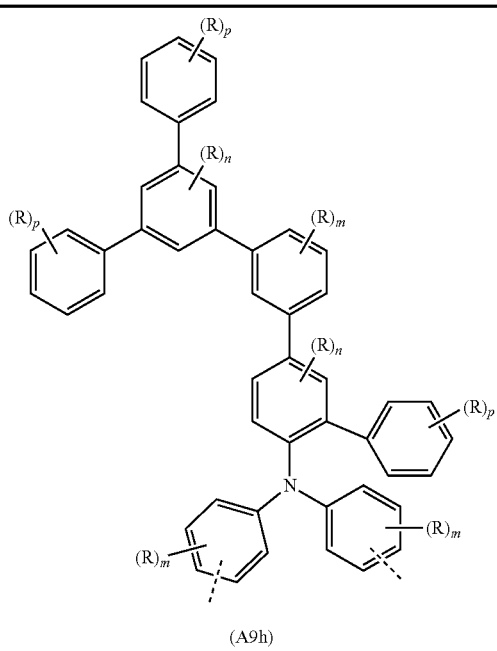

(A9h)

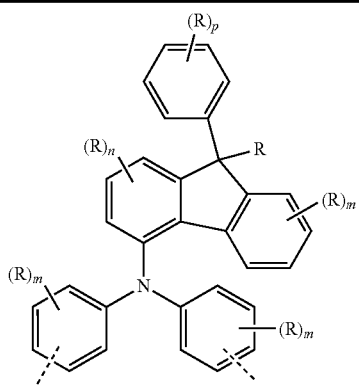

(A10b)

where R, k, m, n and p can adopt the meanings indicated above in relation to the formulae A, A2 and A6.

In a further very particularly preferred embodiment, the at least one structural unit of the formula (A1) is selected from the structural unit of the following formula (A10):

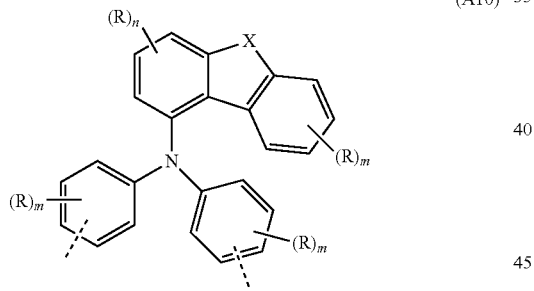 (A10)

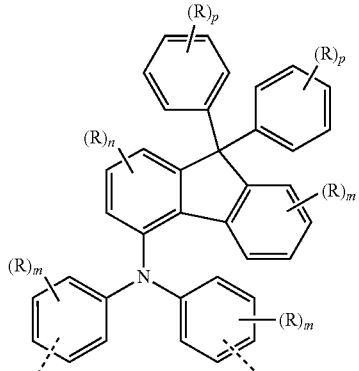

(A10c)

where R, X, m and n can adopt the meanings indicated above in relation to the formulae A, A1 and A2.

Examples of preferred structural units of the formula (A10) are depicted in the following table:

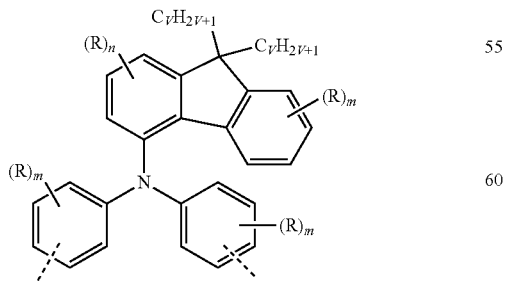

(A10a)

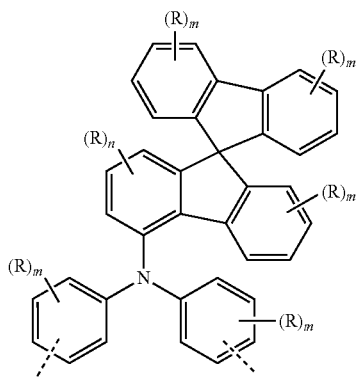

(A10d)

Examples of preferred structural units of the formula (A11) are depicted in the following table:

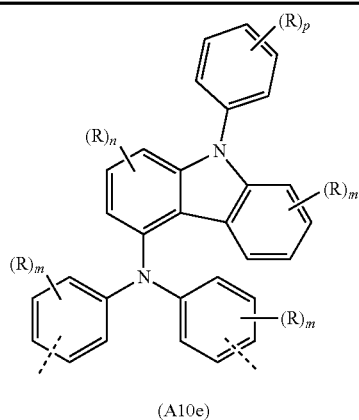

(A10e)

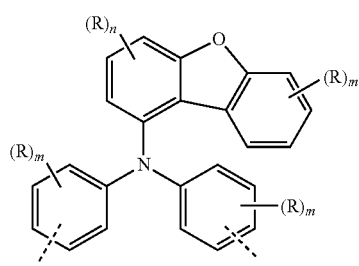

(A10f)

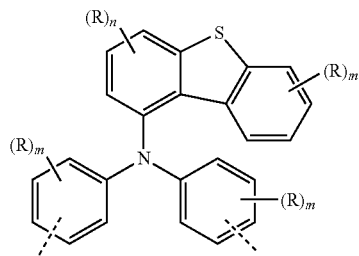

(A10g)

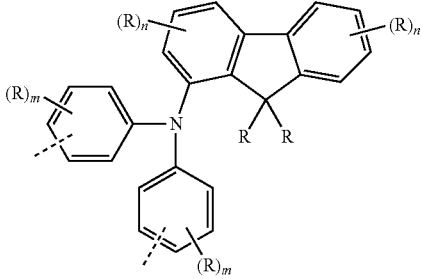

(A11a)

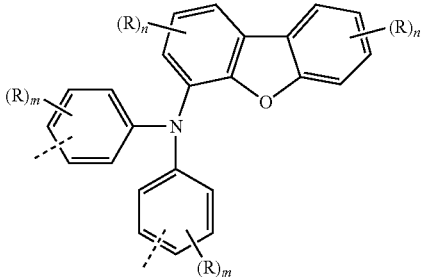

(A11b)

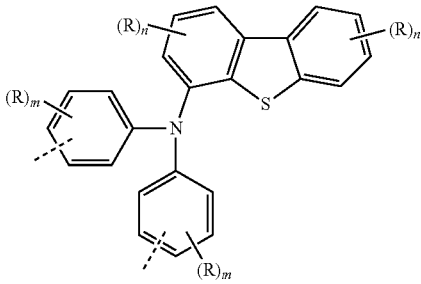

(A11c)

where R, m, n and p can adopt the meanings indicated above in relation to
the formulae A, A2 and A6, and
v=1 to 20, preferably 1 to 10.

In still a further very particularly preferred embodiment, the at least one structural unit of the formula (A8) is selected from the structural unit of the following formula (A11):

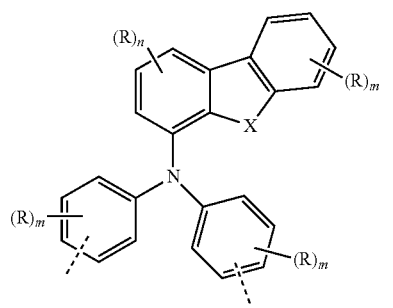

(A11)

where R, X, m and n can adopt the meanings indicated above in relation to the formulae A, A1 and A2.

where R, m and n can adopt the meanings indicated above in relation to the formulae A and A2.

In the formulae (A9), (A10) and (A11), and their preferred embodiments of the formulae (A9a) to (A9h), (A10a) to (A10g) and (A11a) to (A11c), the dashed lines represent the bonds to the adjacent structural units in the polymer. They can be arranged, independently of one another, identically or differently, in the ortho, meta or para position, preferably identically in the ortho, meta or para position, particularly preferably in the meta or para position and very particularly preferably in the para position.

The highly branched polymer contains 5 to 30 mol %, preferably 5 to 25 mol % and particularly preferably 10 to 25 mol %, of at least one branching recurring unit B.

Branching recurring units B that can be employed are all recurring units known to the person skilled in the art that have at least three or more, preferably three or four, bonds to adjacent structural units in the polymer.

Preferred branching recurring units B are the structural units of the formulae (B1) to (B5) depicted in the following table.

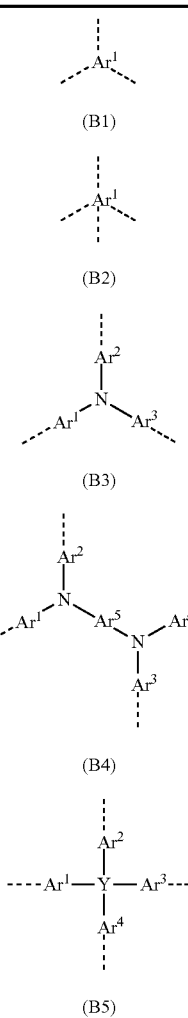

(B1)

(B2)

(B3)

(B4)

(B5)

where
- Ar$^1$ to Ar$^5$ are on each occurrence, in each case identically or differently, a mono- or polycyclic, aromatic or heteroaromatic ring system having 5 to 60 aromatic ring atoms, which may be substituted by one or more radicals R;
- R is on each occurrence, identically or differently, H, D, F, Cl, Br, I, N(R$^1$)$_2$, CN, NO$_2$, Si(R$^1$)$_3$, B(OR$^1$)$_2$, C(=O)R$^1$, P(=O)(R$^1$)$_2$, S(=O)R$^1$, S(=O)$_2$R$^1$, OSO$_2$R$^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals R$^1$, where one or more non-adjacent CH$_2$ groups may be replaced by R$^1$C=CR$^1$, C≡C, Si(R$^1$)$_2$, C=O, C=S, C=NR$^1$, P(=O)(R$^1$), SO, SO$_2$, NR$^1$, O, S or CONR$^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals R$^1$, or an aryloxy or heteroaryloxy group having 5 to 60 aromatic ring atoms, which may be substituted by one or more radicals R$^1$, or an aralkyl or heteroarylaralkyl group having 5 to 60 aromatic ring atoms, which may be substituted by one or more radicals R$^1$, or a diarylamino group, diheteroarylamino group or arylheteroarylamino group having 10 to 40 aromatic ring atoms, which may be substituted by one or more radicals R$^1$, or a cross-linkable group Q, where two or more radicals R may also form a mono- or polycyclic, aliphatic, aromatic and/or benzo-fused ring system with one another;
- R$^1$ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents R$^1$ may also form a mono- or polycyclic, aliphatic or aromatic ring system with one another;
- Y is C or Si, and
- the dashed lines represent bonds to adjacent structural units in the polymer.

Particularly preferred branching recurring units B are the structural units of the formulae (B1a) to (B5d) depicted in the following table.

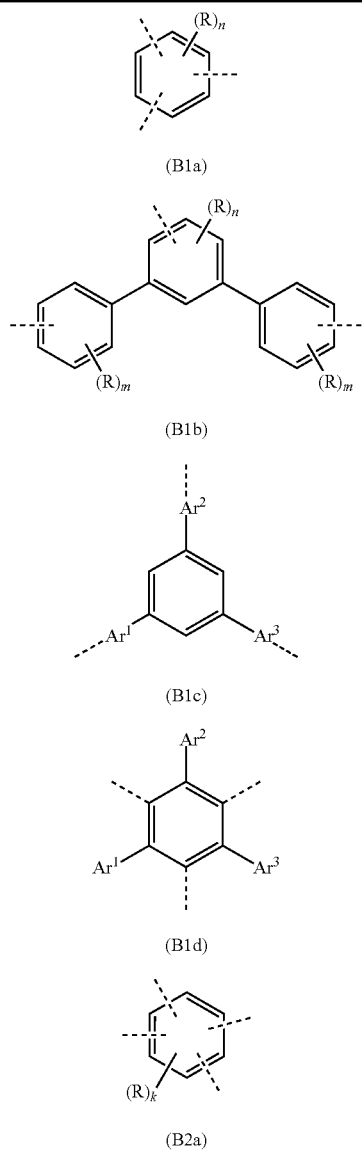

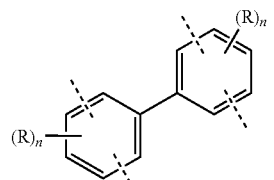
(B2b)
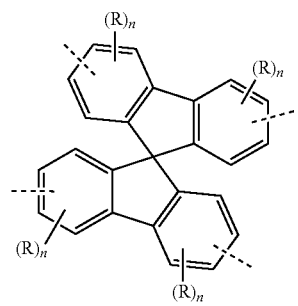
(B2c)
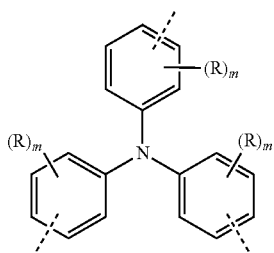
(B3a)
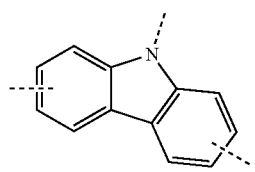
(B3b)
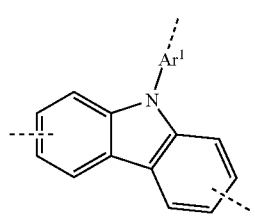
(B3c)
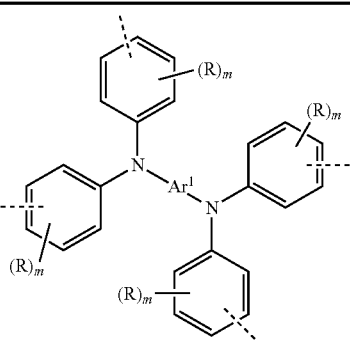
(B4a)
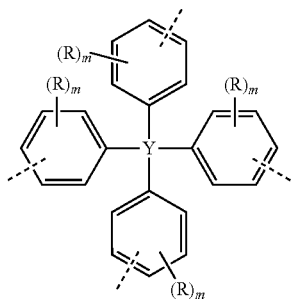
(B5a)
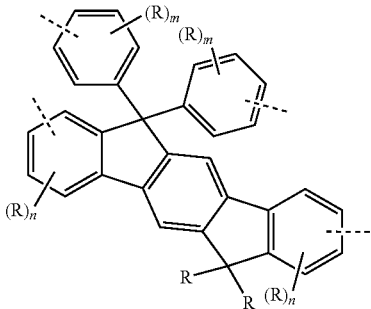
(B5b)
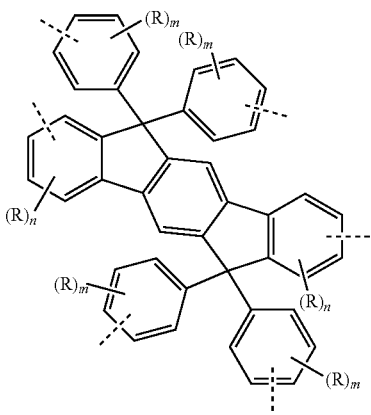
(B5c)

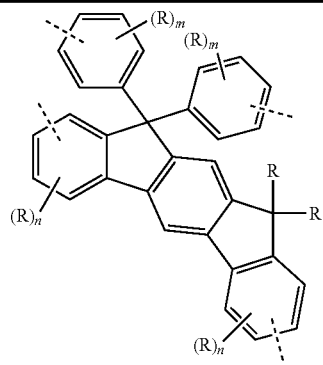
(B5d)
where Ar$^1$, Ar$^2$, Ar$^3$, R and Y can adopt the meanings indicated in relation to the formulae (B1) to (B5),
m=0, 1, 2, 3 or 4,
n=0, 1, 2 or 3 and
k=0, 1 or 2.
Very particularly preferred branching recurring units B are the structural units of the formulae (B1a1) to (B5b1) depicted in the following table.
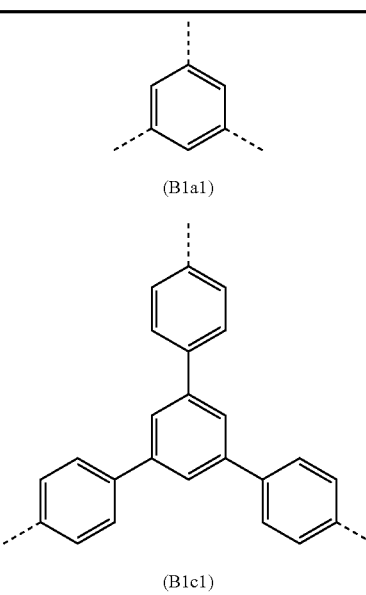
(B1a1)
(B1c1)
(B1c2)
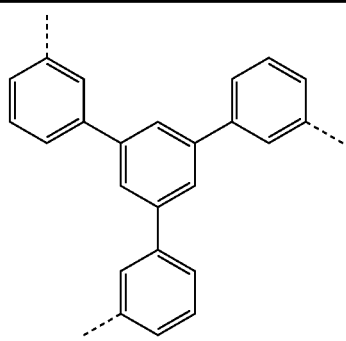
(B1c3)
(B1d1)
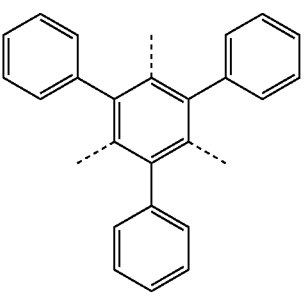
(B2c1)
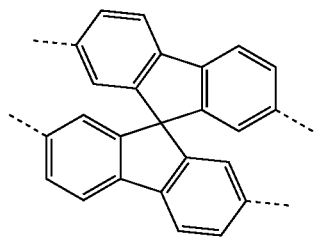
(B3a1)
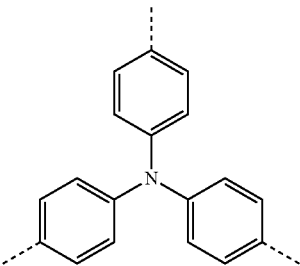

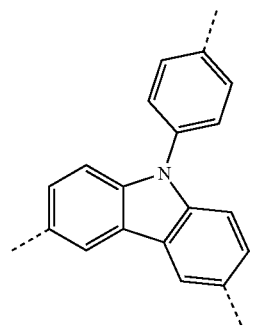

(B3c1)

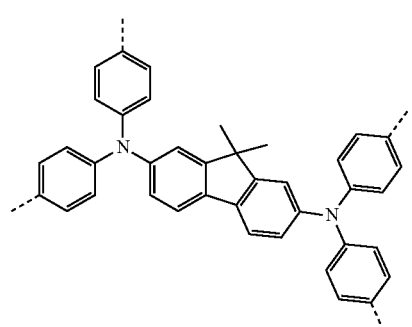

(B4a1)

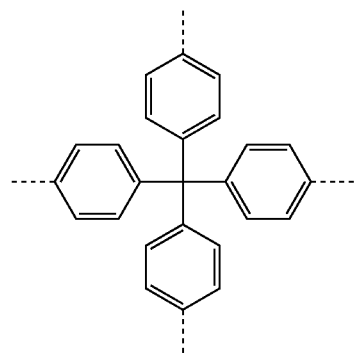

(B5a1)

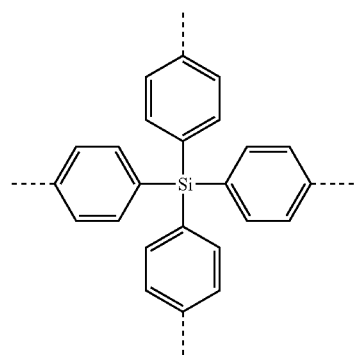

(B5a2)

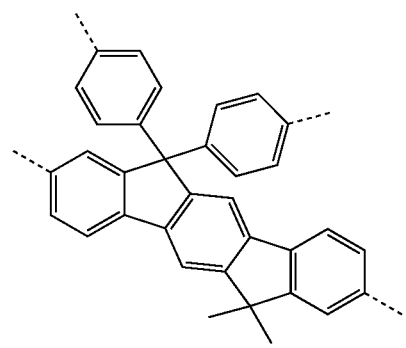

(B5b1)

A very particularly preferred branching recurring unit B is the structural unit of the formula (B1a1).

The highly branched polymer contains 5 to 30 mol %, preferably 5 to 25 mol %, of at least one further recurring unit C.

Further recurring units C that can be employed are all recurring units known to the person skilled in the art that have two bonds to adjacent structural units in the polymer.

Preferred further structural units C are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, but also 1,2-, 1,3- or 1,4-phenylene, 1,2-, 1,3- or 1,4-naphthylene, 2,2'-, 3,3'- or 4,4'-biphenylylene, 2,2''-, 3,3''- or 4,4''-terphenylylene, 2,2'-, 3,3'- or 4,4'-bi-1,1'-naphthylylene or 2,2'''-, 3,3'''- or 4,4'''-quaterphenylylene derivatives.

Preferred further recurring units C are the structural units of the formulae (C1) to (C9) depicted in the following table.

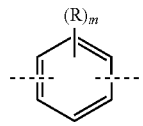

(C1)

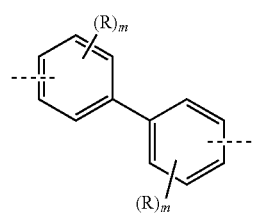

(C2a)

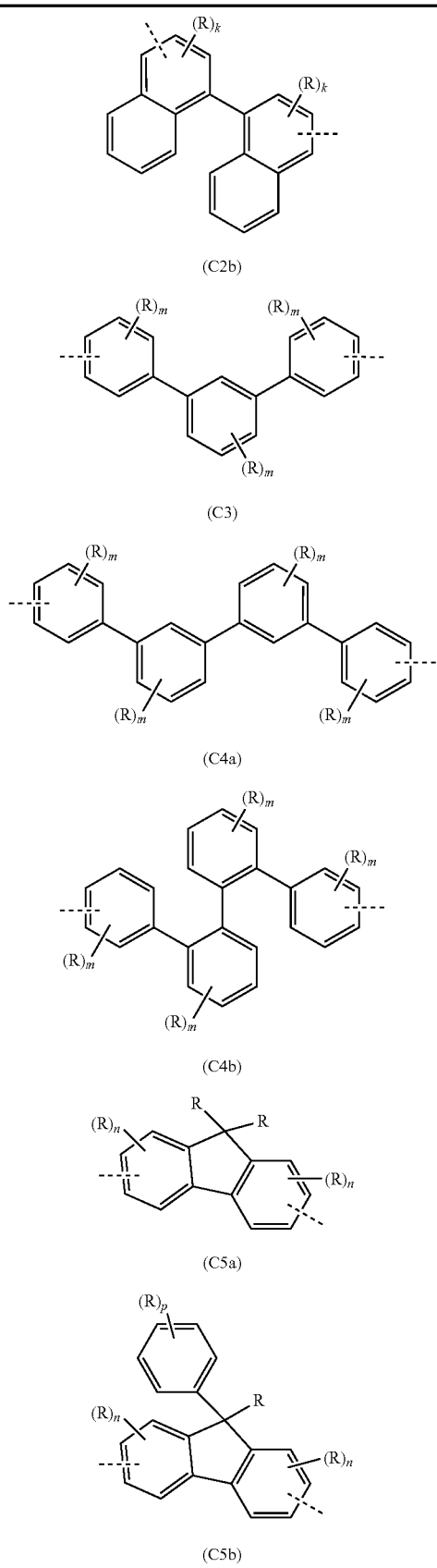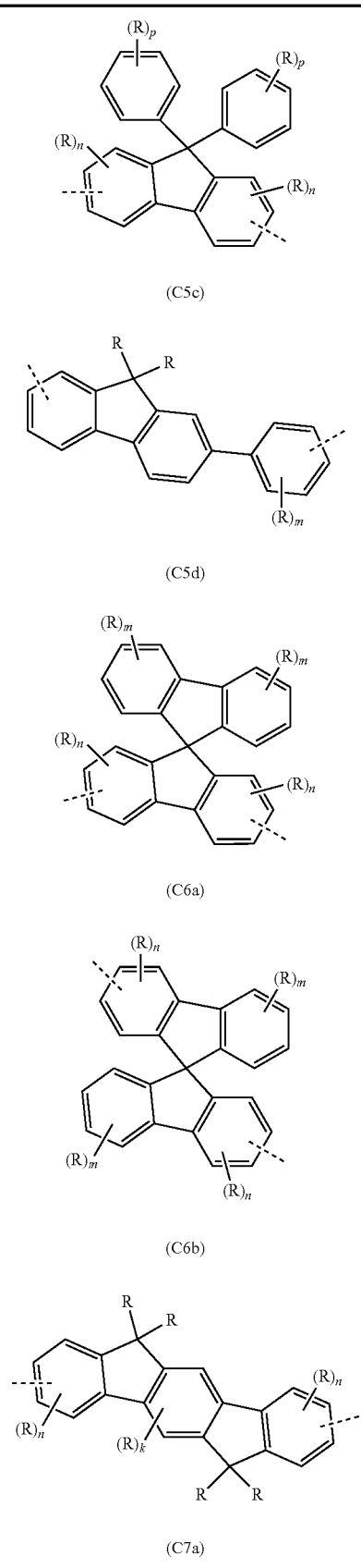

-continued

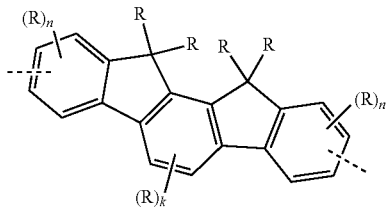

(C7b)

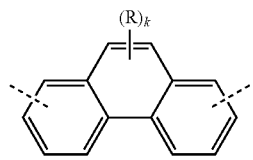

(C8)

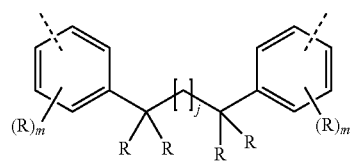

(C9)

where
R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals $R^1$, where one or more non-adjacent $CH_2$ groups may be replaced by $R^1C=CR^1$, C≡C, $Si(R^1)_2$, C=O, C=S, $C=NR^1$, $P(=O)(R^1)$, SO, $SO_2$, $NR^1$, O, S or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroarylaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a cross-linkable group Q, where two or more radicals R may also form a mono- or polycyclic, aliphatic, aromatic and/or benzo-fused ring system with one another;

$R^1$ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents $R^1$ may also form a mono- or polycyclic, aliphatic or aromatic ring system with one another;

p is 0, 1, 2, 3, 4 or 5,
m is 0, 1, 2, 3 or 4,
n is 0, 1, 2 or 3,
k is 0, 1 or 2,
j is 0, 1, 2, 3, 4, 5, 6, 7 or 8, and
the dashed lines represent bonds to adjacent structural units in the polymer.

Particularly preferred further recurring units C are the structural units of the formulae (C1a) to (C9a) depicted in the following table.

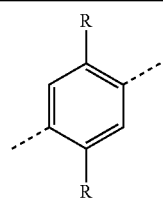

(C1a)

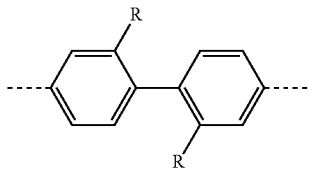

(C2a1)

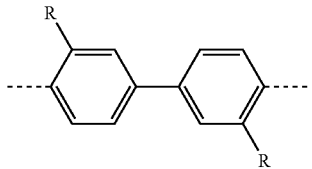

(C2a2)

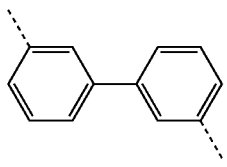

(C2a3)

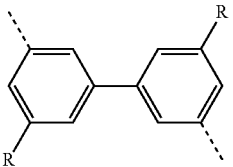

(C2a4)

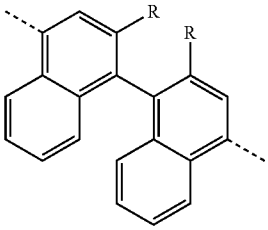

(C2b1)

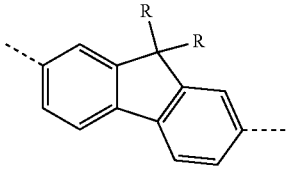

(C5a1)

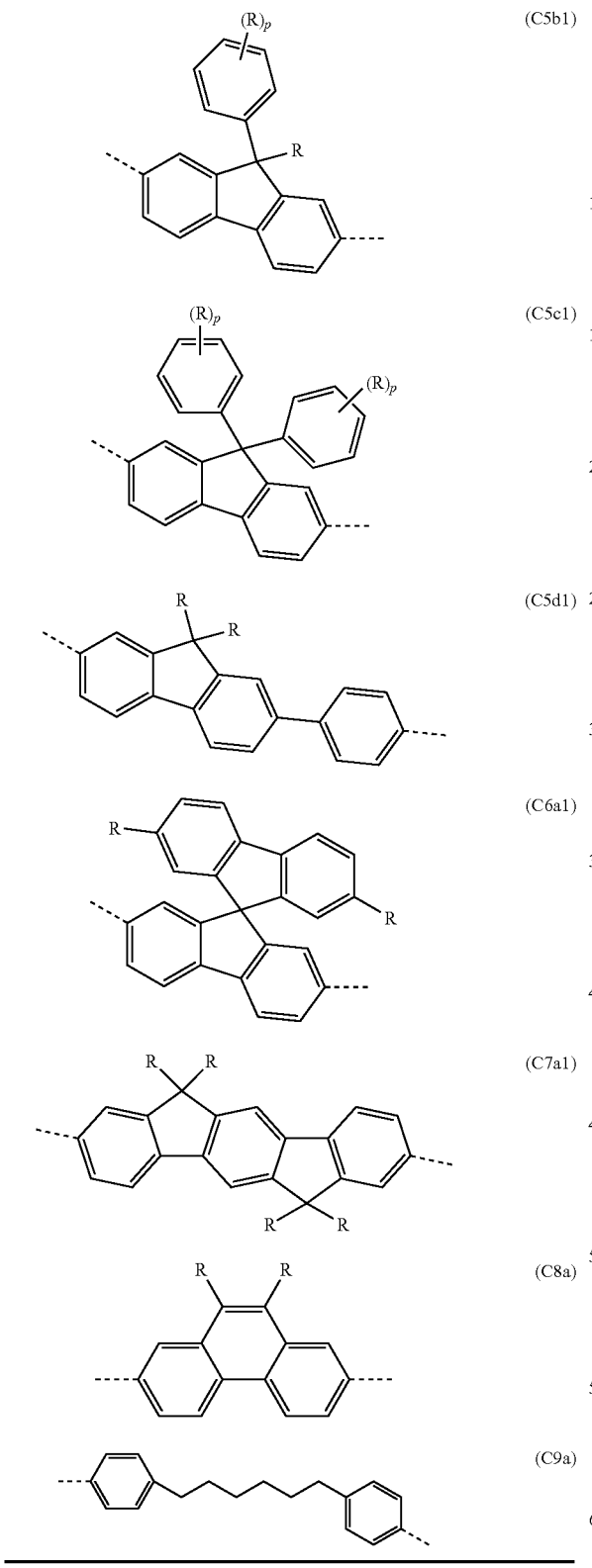

where R and p can adopt the meanings indicated in relation to the formulae (C1) to (C9).

The highly branched polymer contains 5 to 40 mol %, preferably 5 to 30 mol %, of at least one end group (E).

End groups (E) that can be employed are all end groups known to the person skilled in the art that have a bond to an adjacent structural unit in the polymer.

Preferred end groups (E) are the structural units of the formulae (E1) to (E13) depicted in the following table.

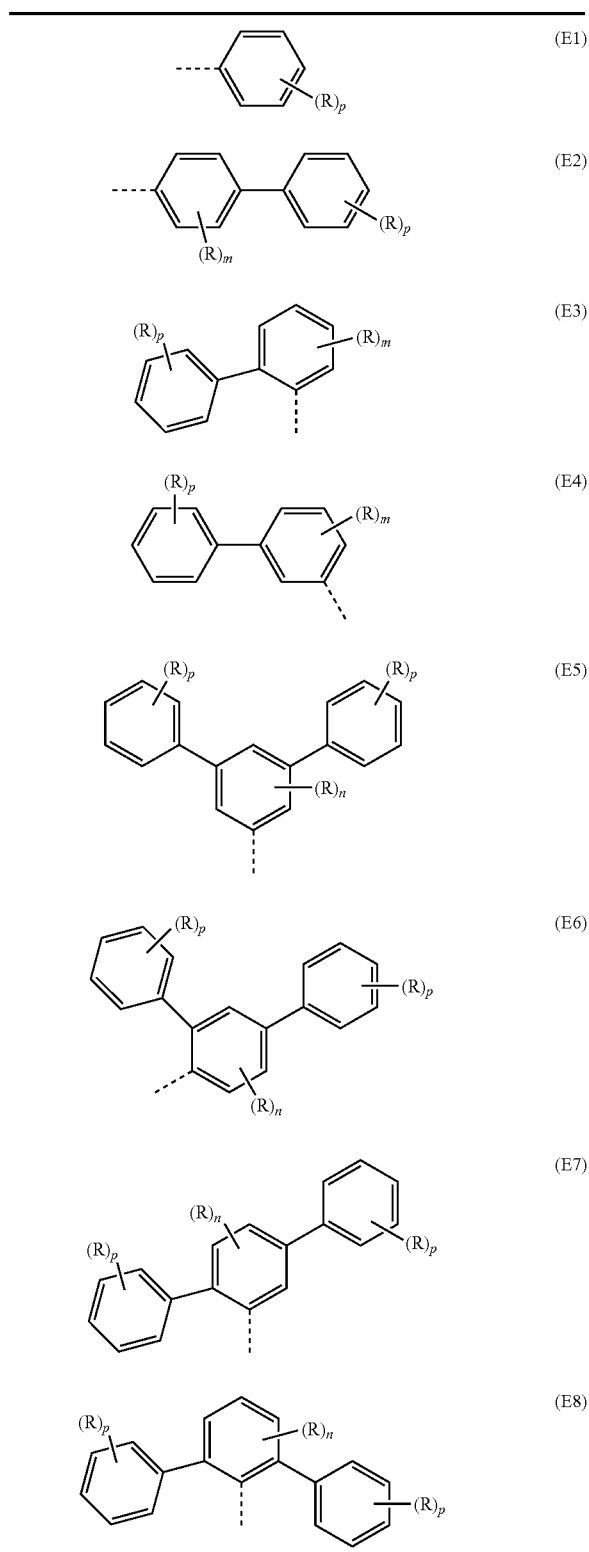

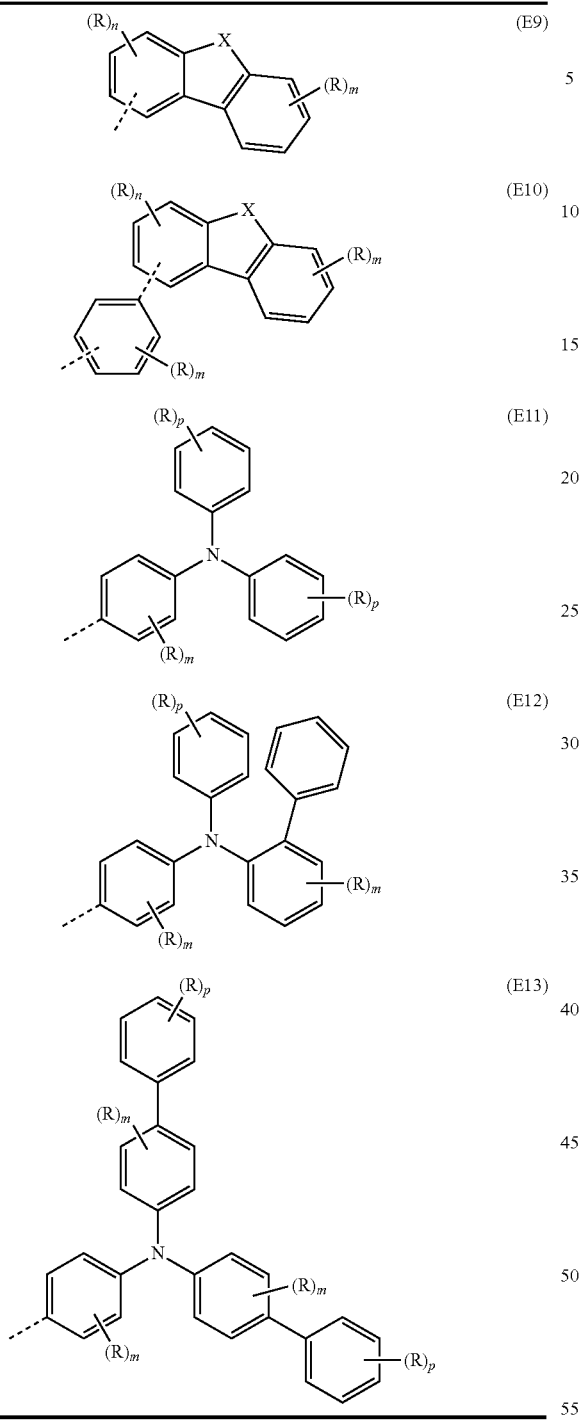

where
R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals $R^1$, where one or more non-adjacent $CH_2$ groups may be replaced by $R^1C=CR^1$, $C≡C$, $Si(R^1)_2$, $C=O$, $C=S$, $C=NR^1$, $P(=O)(R^1)$, SO, $SO_2$, $NR^1$, O, S or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroarylaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a cross-linkable group Q, where two or more radicals R may also form a mono- or polycyclic, aliphatic, aromatic and/or benzo-fused ring system with one another;

$R^1$ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents $R^1$ may also form a mono- or polycyclic, aliphatic or aromatic ring system with one another;

X is $CR^2$, NR, $SiR^2$, O, S, C=O or P=O, preferably $CR^2$, NR, O or S, p is 0, 1, 2, 3, 4 or 5, m is 0, 1, 2, 3 or 4, n is 0, 1, 2 or 3, and the dashed line represents the bond to an adjacent structural unit in the polymer.

Particularly preferred end groups (E) are the structural units of the formulae (E1a) to (E13a) depicted in the following table.

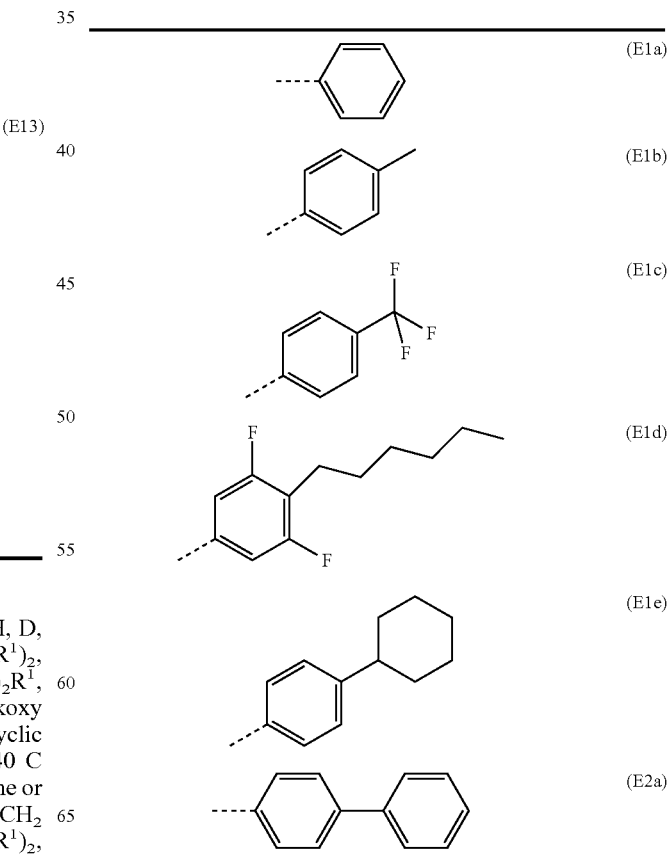

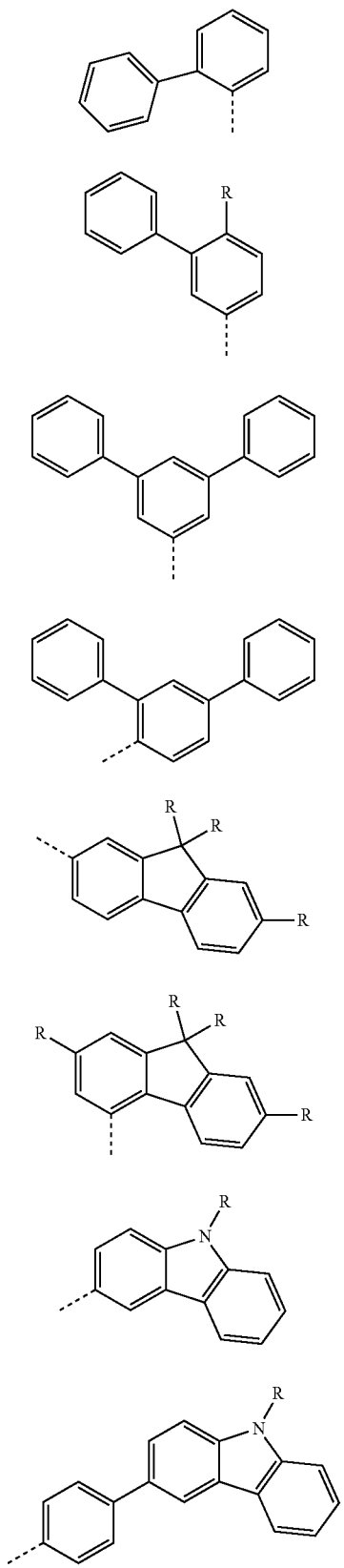
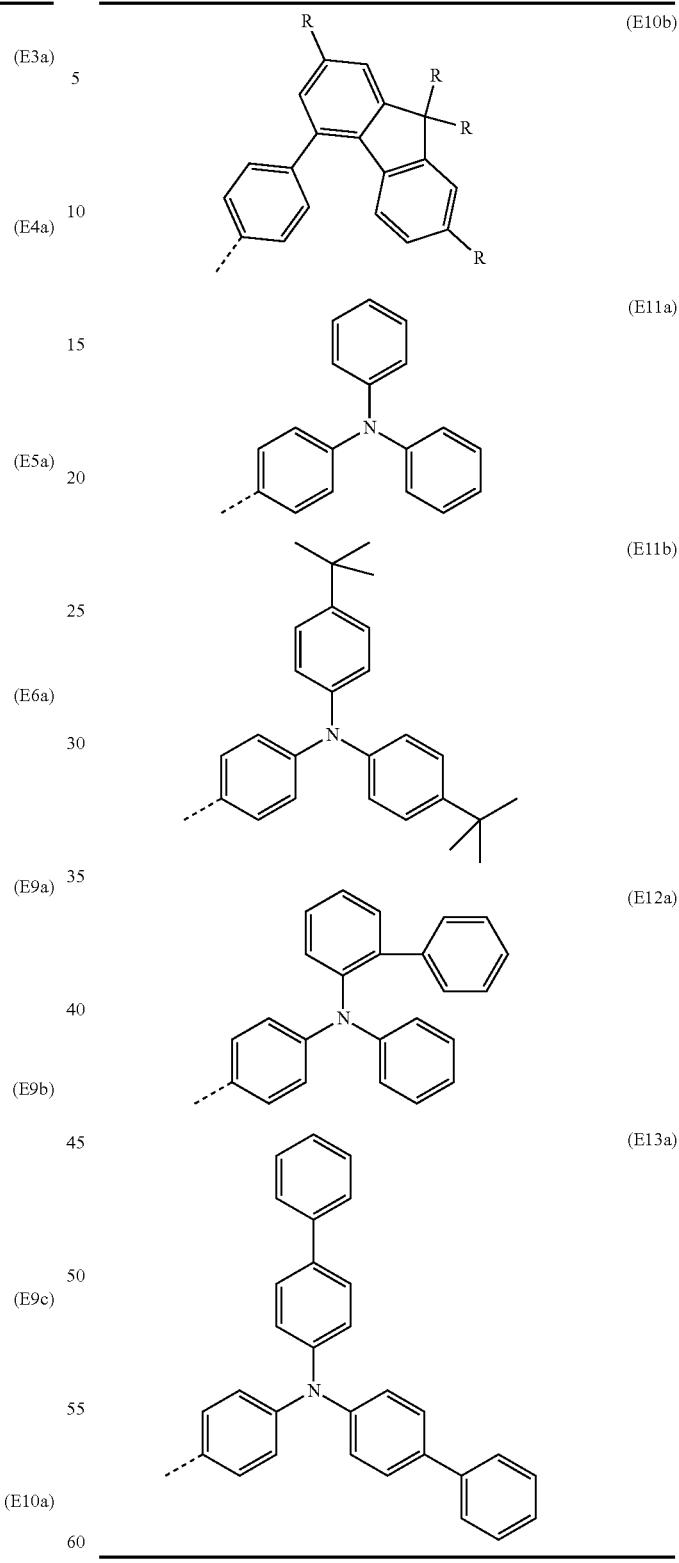
where R can adopt the meanings indicated above in relation to the formulae (E1) to (E13).
Very particularly preferred end groups (E) are the structural units of the formulae (E1a) and (E2a) depicted in the table above.

In a further embodiment, the end groups (E) may contain at least one, preferably one, crosslinkable group Q.
Preferred end groups (E) which contain at least one crosslinkable group Q are the structural units of the formulae (G1) to (G13) depicted in the following table.
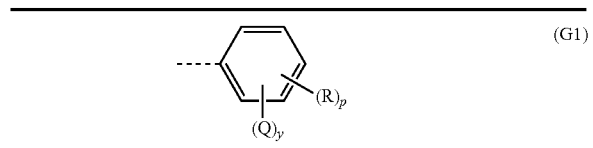
(G1)
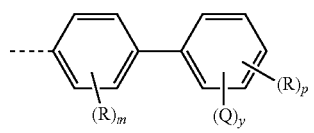
(G2)
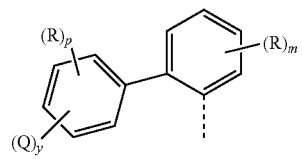
(G3a)
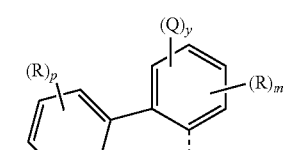
(G3b)
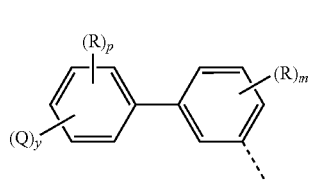
(G4a)
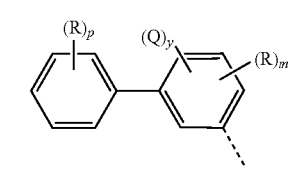
(G4b)
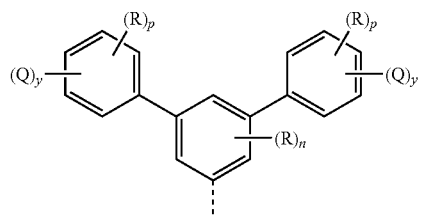
(G5)
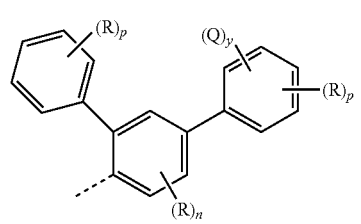
(G6a)
-continued
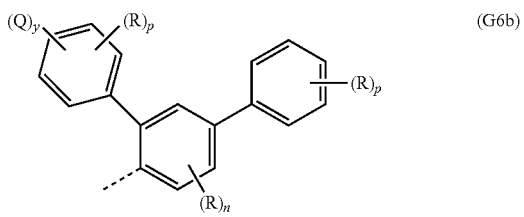
(G6b)
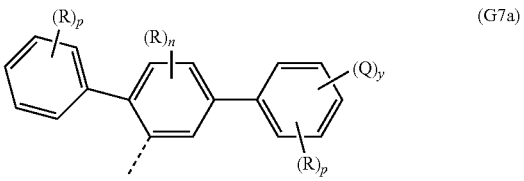
(G7a)
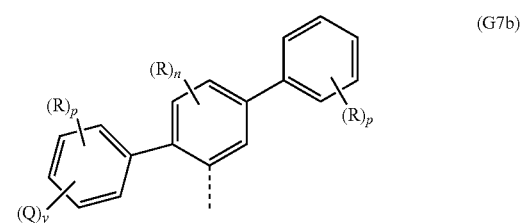
(G7b)
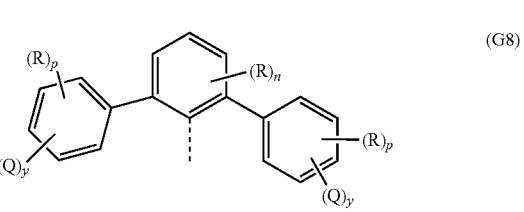
(G8)
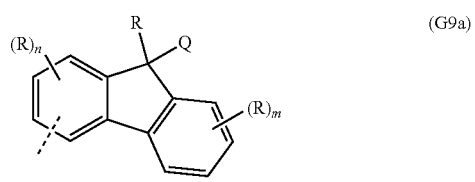
(G9a)
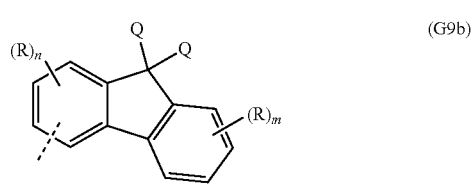
(G9b)
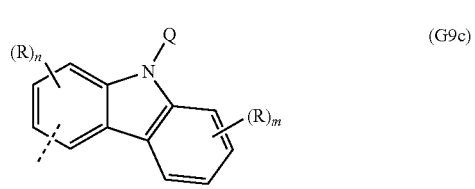
(G9c)

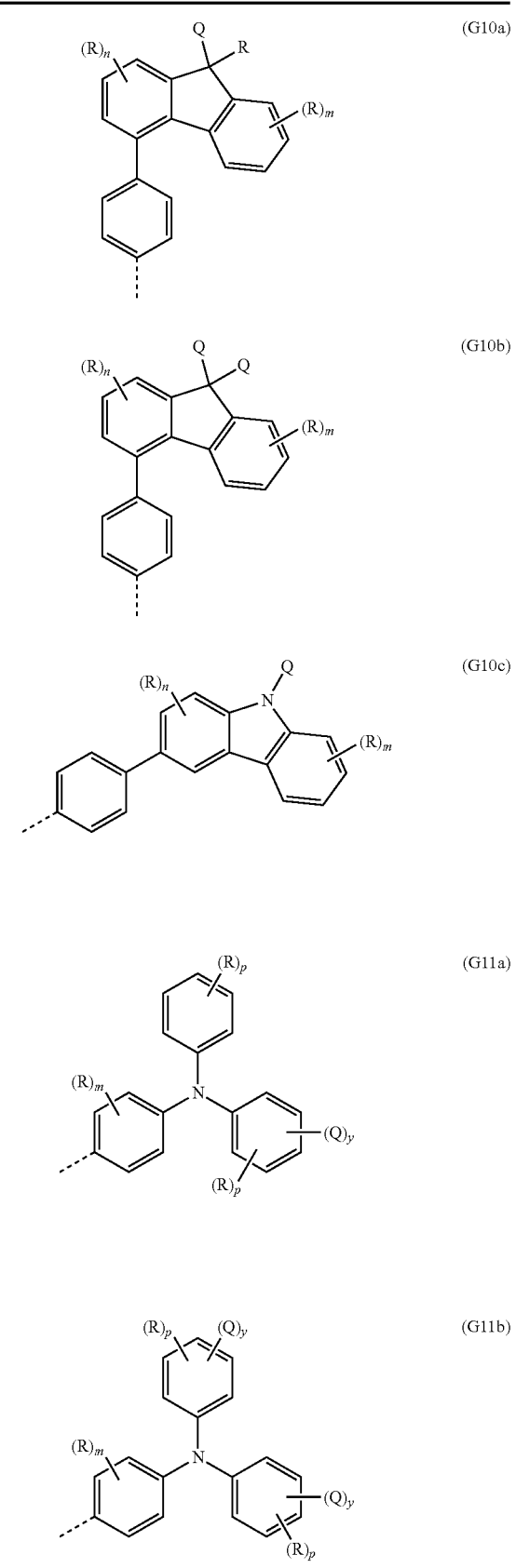
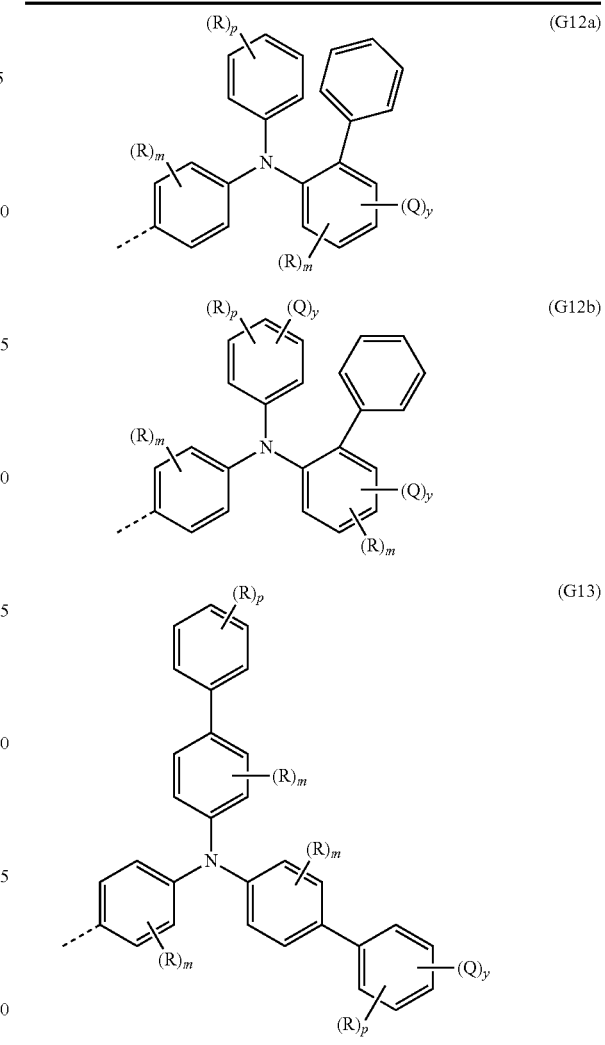

where
R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals $R^1$, where one or more non-adjacent $CH_2$ groups may be replaced by $R^1C=CR^1$, C≡C, $Si(R^1)_2$, C=O, C=S, $C=NR^1$, $P(=O)(R^1)$, SO, $SO_2$, $NR^1$, O, S or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroarylaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a crosslinkable group Q, where two or more radicals R may also form a mono- or polycyclic, aliphatic, aromatic and/or benzo-fused ring system with one another, $R^1$ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents $R^1$ may also form a mono- or polycyclic, aliphatic or aromatic ring system with one another;

Q is a crosslinkable group, p is 0, 1, 2, 3, 4 or 5, m is 0, 1, 2, 3 or 4, n is 0, 1, 2 or 3, y is 0, 1 or 2, the dashed line represents the bond to an adjacent structural unit in the polymer, but with the proviso that, in relation to a phenylene group, the sum (p+y) is ≤5 and the sum (m+y) is ≤4, and with the proviso that at least one y in each structural unit is ≥1.

Particularly preferred end groups (G) which contain at least one crosslinkable group Q are the structural units of the formulae (G1a) to (G13b) depicted in the following table.

(G1a)

(G1b)

(G2a1)

(G2a2)

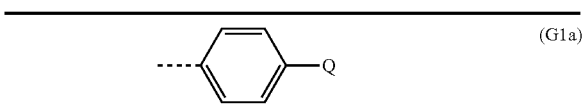

(G3a1)

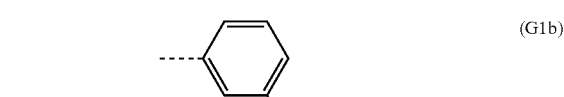

(G4a1)

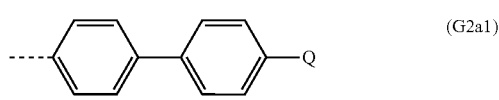

-continued (G4a2)

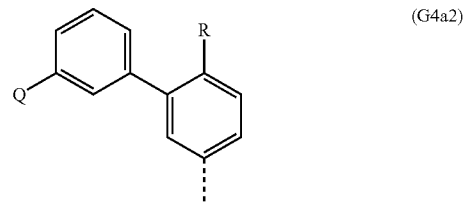

(G9a1)

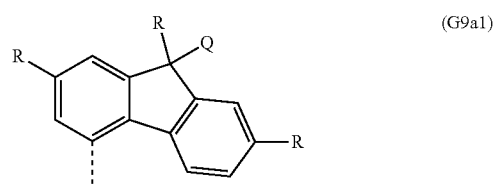

(G9a2)

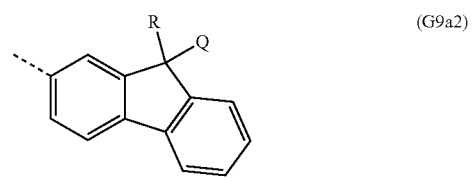

(G9b1)

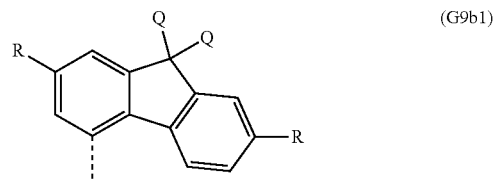

(G9b2)

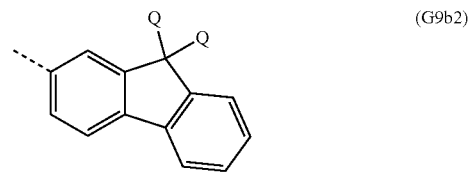

(G9c1)

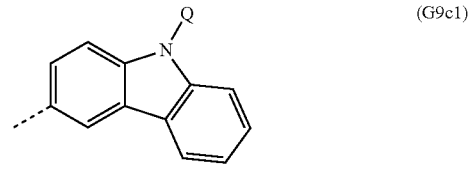

(G10a1)

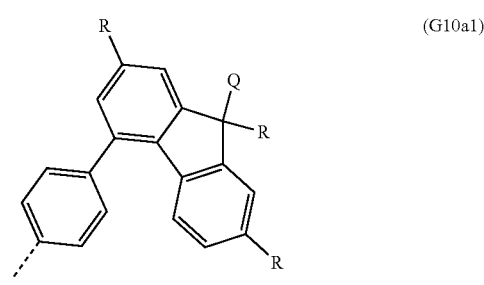

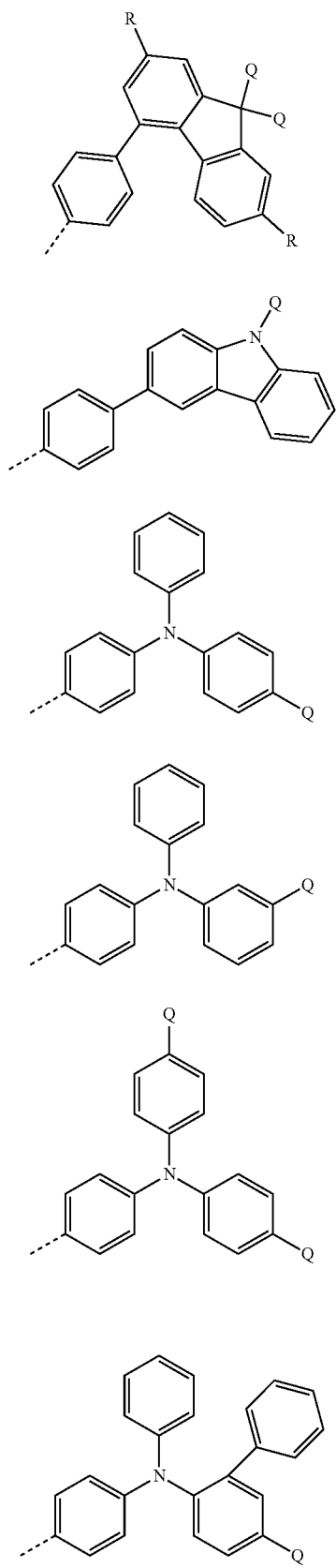
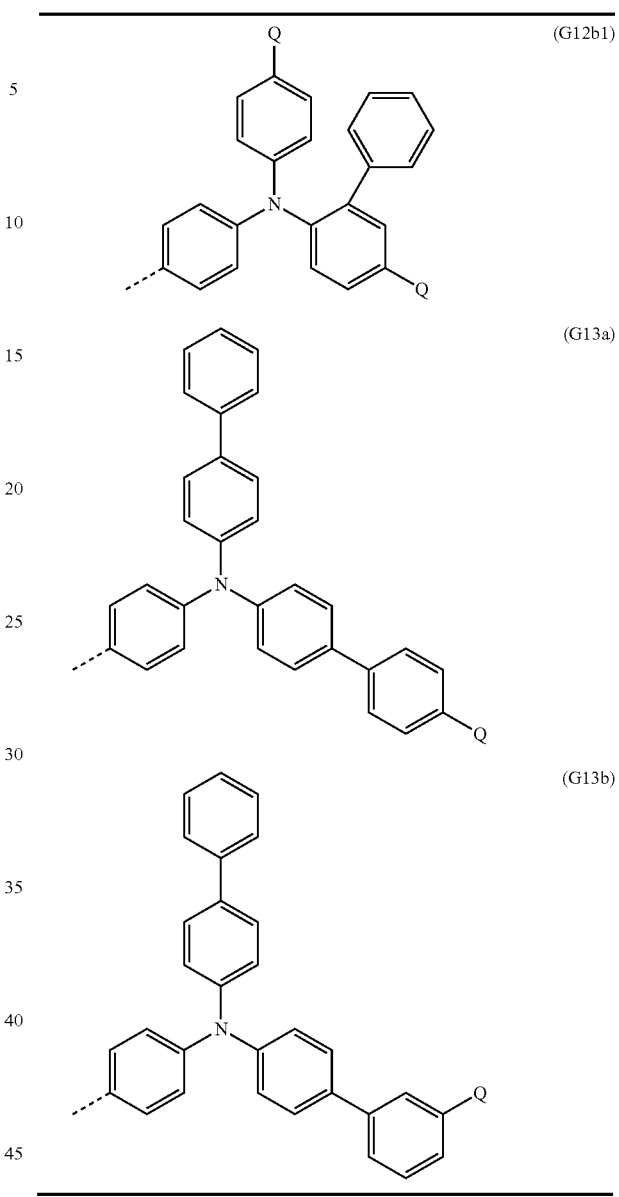

where R and Q can have the meanings indicated above in relation to the formulae (G1) to (G13).

Very particularly preferred end groups (G) which contain at least one cross-linkable group Q are the structural units of the formulae (G1a) to (G4a2) depicted in the table above.

"Crosslinkable group Q" in the sense of the present invention denotes a functional group which is capable of undergoing a reaction and thus forming an insoluble compound. The reaction here can take place with a further, identical group Q, a further, different group Q or any desired other part thereof or another polymer chain. The crosslinkable group is thus a reactive group. A correspondingly crosslinked compound is obtained here as a result of the reaction of the crosslinkable group. The chemical reaction can also be carried out in the layer, in which case an insoluble layer forms. The crosslinking can usually be supported by heat or by UV, microwave, X-ray or electron radiation, optionally in the presence of an initiator. "Insoluble" in the sense of the present invention preferably means that the polymer according to the invention after the crosslinking reaction, i.e. after the reaction of the crosslinkable groups, has a solubility at room temperature in an organic solvent which is at least a factor of 3, preferably at least a factor of 10, lower than that of the corresponding uncrosslinked polymer according to the invention in the same organic solvent.

Crosslinkable groups Q which are preferred in accordance with the invention are the groups mentioned below:

a) Terminal or Cyclic Alkenyl or Terminal Dienyl and Alkynl Groups:
   Suitable units are those which contain a terminal or cyclic double bond, a terminal dienyl group or a terminal triple bond, in particular terminal or cyclic alkenyl, terminal dienyl or terminal alkynyl groups having 2 to 40 C atoms, preferably having 2 to 10 C atoms, where individual $CH_2$ groups and/or individual H atoms may also be replaced by the above-mentioned groups R. Furthermore suitable are also groups which are to be regarded as precursors and are capable of the in-situ formation of a double or triple bond.

b) Alkenyloxy, Dienyloxy or Alkynyloxy Groups:
   Furthermore suitable are alkenyloxy, dienyloxy or alkynyloxy groups, preferably alkenyloxy groups.

c) Acrylic Acid Groups:
   Furthermore suitable are acrylic acid units in the broadest sense, preferably acrylates, acrylamides, methacrylates and methacrylamides. $C_{1-10}$-alkyl acrylate and $C_{1-10}$-alkyl methacrylate are particularly preferred.
   The crosslinking reaction of the groups mentioned above under a) to c) can take place via a free-radical, cationic or anionic mechanism, but also via cycloaddition.
   It may be helpful to add a corresponding initiator for the crosslinking reaction. Suitable initiators for free-radical crosslinking are, for example, dibenzoyl peroxide, AIBN or TEMPO. Suitable initiators for cationic crosslinking are, for example, $AlCl_3$, $BF_3$, triphenylmethyl perchlorate or tropylium hexachloroantimonate. Suitable initiators for anionic crosslinking are bases, in particular butyllithium.

In a preferred embodiment of the present invention, however, the crosslinking is carried out without the addition of an initiator and is initiated exclusively thermally. This preference is due to the fact that the absence of the initiator prevents contamination of the layer, which could result in impairment of the device properties.

d) Oxetanes and Oxiranes:
   A further suitable class of crosslinkable groups Q are oxetanes and oxiranes, which crosslink cationically by ring opening.
   It may be helpful to add a corresponding initiator for the crosslinking reaction. Suitable initiators are, for example, $AlCl_3$, $BF_3$, triphenylmethyl perchlorate or tropylium hexachloroantimonate. Photoacids can likewise be added as initiators.

e) Silanes:
   Furthermore suitable as a class of crosslinkable groups are silane groups $SiR_3$, where at least two groups R, preferably all three groups R, stand for Cl or an alkoxy group having 1 to 20 C atoms.
   This group reacts in the presence of water to give an oligo- or polysiloxane.

f) Cyclobutane Groups
   The crosslinkable groups Q mentioned above under a) to f) are generally known to the person skilled in the art, as are the suitable reaction conditions which are used for the reaction of these groups.

Preferred crosslinkable groups Q include alkenyl groups of the following formula (Q1), dienyl groups of the following formula (Q2), alkynyl groups of the following formula (Q3), alkenyloxy groups of the following formula (Q4), dienyloxy groups of the following formulae (Q5), alkynyloxy groups of the following formula (Q6), acrylic acid groups of the following formulae (Q7) and (Q8), oxetane groups of the following formulae (Q9) and (Q10) oxirane groups of the following formula (Q11) and cyclobutane groups of the following formulae (Q12), (Q13) and (Q14):

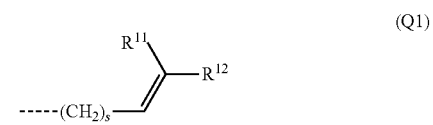

(Q1)

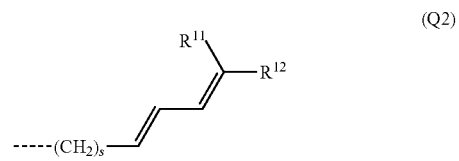

(Q2)

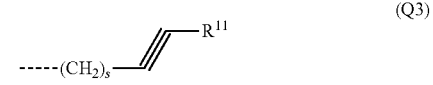

(Q3)

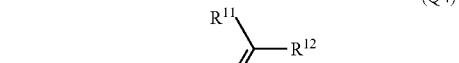

(Q4)

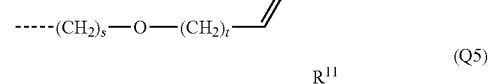

(Q5)

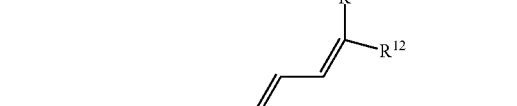

(Q6)

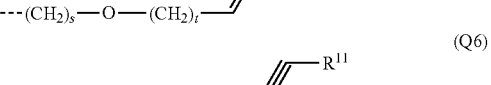

(Q7)

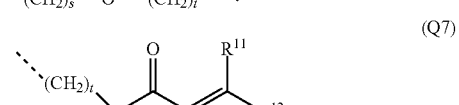

(Q8)

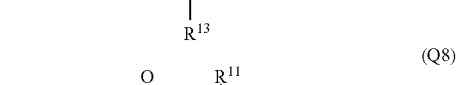

(Q9)

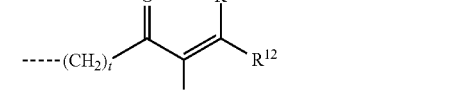

(Q10)

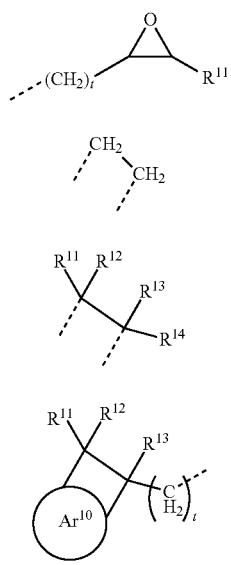

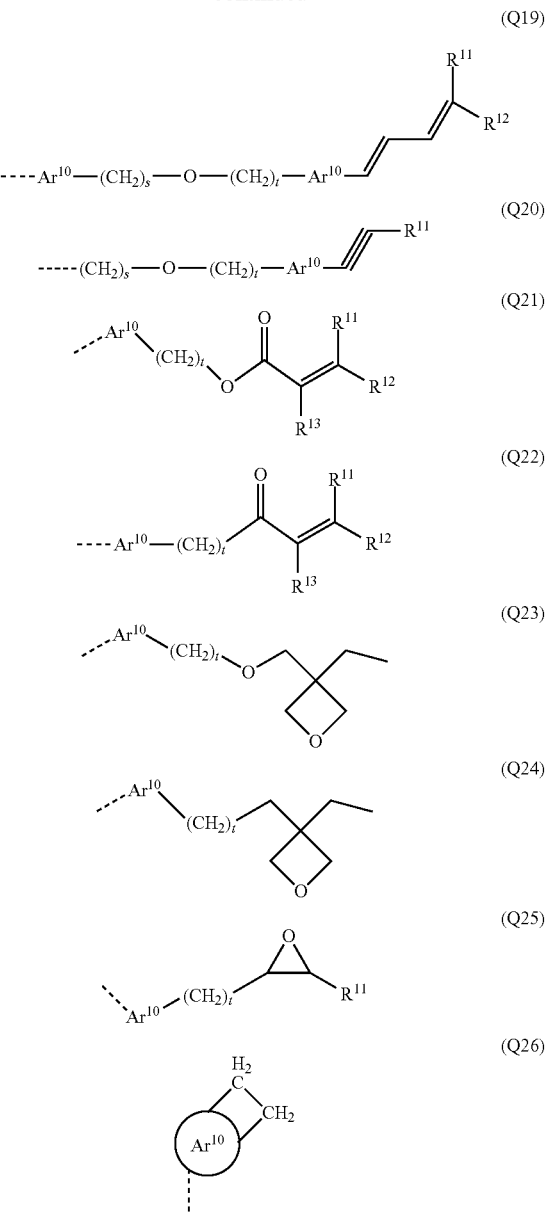

The radicals $R^{11}$, $R^{12}$, $R^{13}$ and $R^{14}$ in the formulae (Q1) to (Q8), (Q11), (Q13) and (Q14) are on each occurrence, identically or differently, H, a straight-chain or branched alkyl group having 1 to 6 C atoms, preferably 1 to 4 C atoms. $R^{11}$, $R^{12}$, $R^{13}$ and $R^{14}$ are particularly preferably H, methyl, ethyl, n-propyl, isopropyl, n-butyl, sec-butyl or tert-butyl and very particularly preferably H or methyl. The indices used have the following meaning: s=0 to 8; and t=1 to 8.

$Ar^{10}$ in the formula (Q14) can adopt the same meanings as $Ar^1$ in formula (A).

The dashed bond in the formulae (Q1) to (Q11) and (014) and the dashed bonds in the formulae (Q12) and (Q13) represent the linking of the cross-linkable group to the structural units.

The crosslinkable groups of the formulae (Q1) to (Q14) can be linked directly to the structural unit, or else indirectly, via a further mono- or polycyclic, aromatic or heteroaromatic ring system $Ar^{10}$, as depicted in the following formulae (Q15) to (Q28):

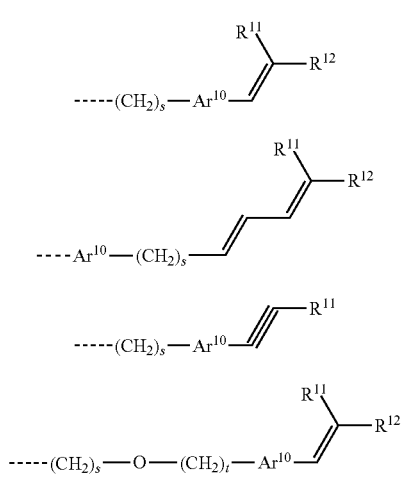

where $Ar^{10}$ in the formulae (Q15) to (Q28) can adopt the same meanings as $Ar^1$ in formula (A).

Particularly preferred crosslinkable groups Q are the following:

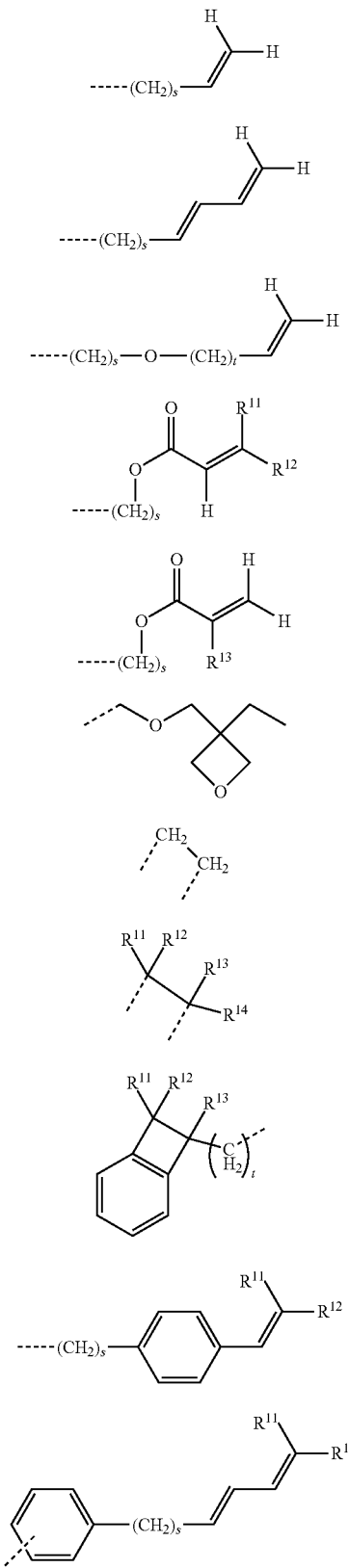
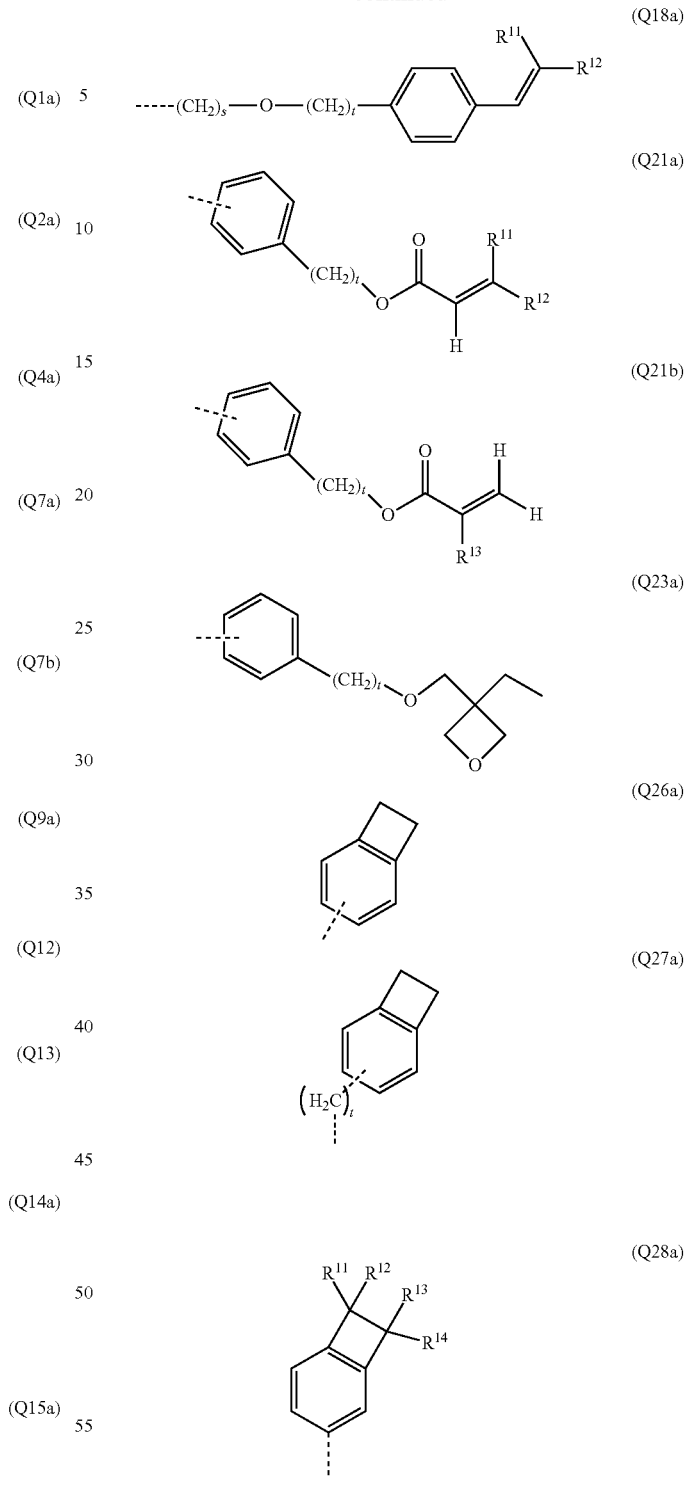

The radicals $R^{11}$, $R^{12}$, $R^{13}$ and $R^{14}$ are on each occurrence, identically or differently, H or a straight-chain or branched alkyl group having 1 to 6 C atoms, preferably 1 to 4 C atoms. The radicals $R^{11}$, $R^{12}$, $R^{13}$ and $R^{14}$ are particularly preferably methyl, ethyl, n-propyl, isopropyl, n-butyl, sec-butyl or tert-butyl and very particularly preferably methyl.

The indices used have the following meaning: s=0 to 8 and t=1 to 8.

Very particularly preferred crosslinkable groups Q are the following:
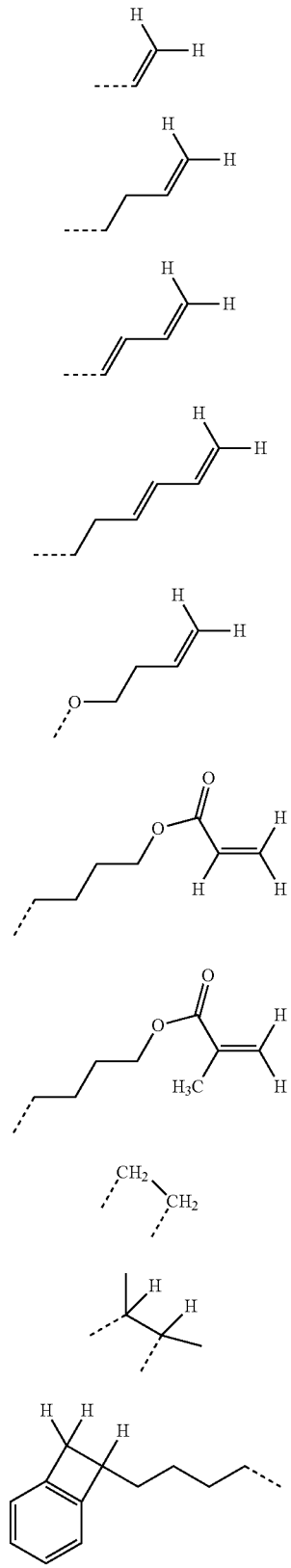
(Q1b)
(Q1c)
(Q2b)
(Q2c)
(Q4b)
(Q7c)
(Q7d)
(Q12)
(Q13a)
(Q14b)
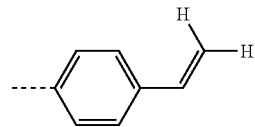
(Q15b)
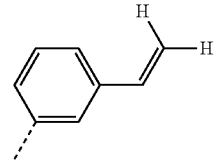
(Q15c)
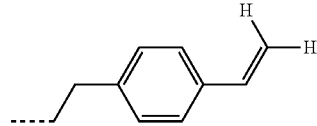
(Q15d)
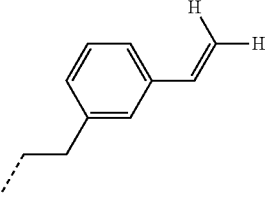
(Q15e)
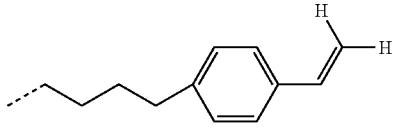
(Q15f)
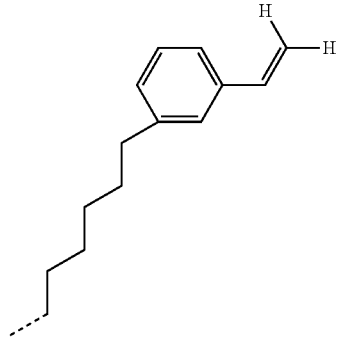
(Q15g)
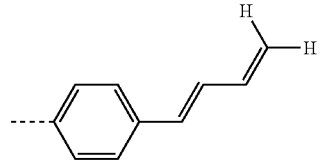
(Q16b)
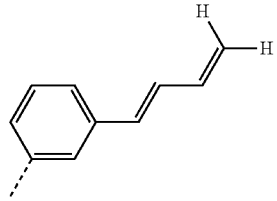
(Q16c)

-continued

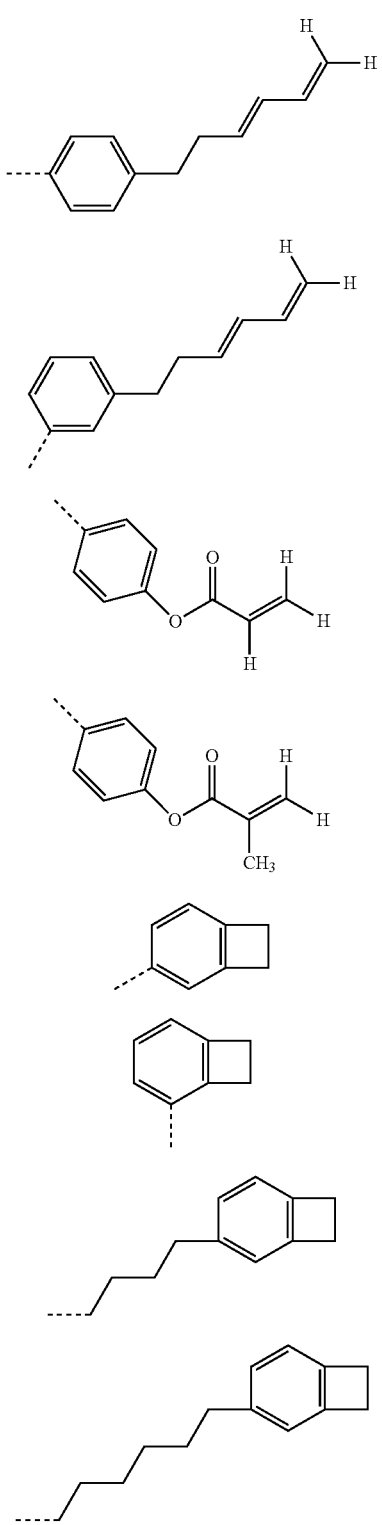

In a preferred embodiment, the highly branched polymer contains 1 to 35 mol %, preferably 2 to 30 mol % and particularly preferably 5 to 25 mol %, of at least one crosslinkable structural unit D.

Crosslinkable structural units D that can be employed are all structural units known to the person skilled in the art that contain at least one, preferably one, crosslinkable group.

Preferred crosslinkable structural units D which contain at least one cross-linkable group Q are the structural units of the formulae (D1) to (D7) depicted in the following table.

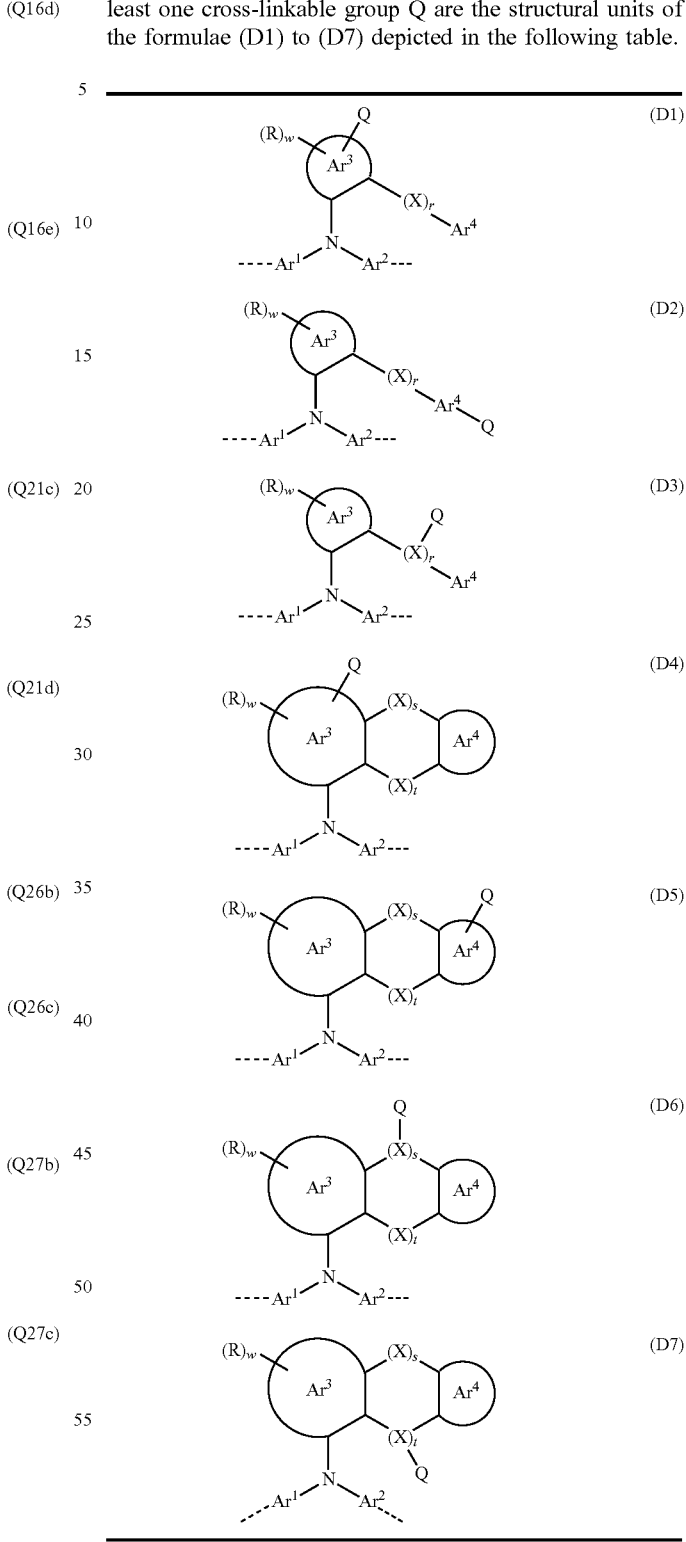

where

Ar$^1$ to Ar$^4$ are on each occurrence, in each case identically or differently, a mono- or polycyclic, aromatic or heteroaromatic ring system having 5 to 60 aromatic ring atoms, which may be substituted by one or more radicals R;

Q is a crosslinkable group;

R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals $R^1$, where one or more non-adjacent $CH_2$ groups may be replaced by $R^1C=CR^1$, C≡C, $Si(R^1)_2$, C=O, C=S, $C=NR^1$, $P(=O)(R^1)$, SO, $SO_2$, $NR^1$, O, S or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroarylaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a crosslinkable group Q, where two or more radicals R may also form a mono- or polycyclic, aliphatic, aromatic and/or benzo-fused ring system with one another;

$R^1$ is on each occurrence, identically or differently, H, D. F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents $R^1$ may also form a mono- or polycyclic, aliphatic or aromatic ring system with one another;

X is $CR_2$, NR, $SiR_2$, O, S, C=O or P=O, preferably $CR_2$, NR, O or S, w is 0, 1, 2, 3, 4, 5 or 6, preferably 0, 1, 2, 3 or 4, r is 0 or 1, preferably 0, s and t are each 0 or 1, where the sum (s+t)=1 or 2, preferably 1; and the dashed lines represent bonds to adjacent structural units in the polymer.

Further preferred crosslinkable structural units D which contain at least one crosslinkable group Q are the structural units of the formulae (D8) to (D21) depicted in the following table.

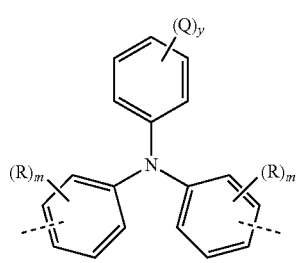 (D8)

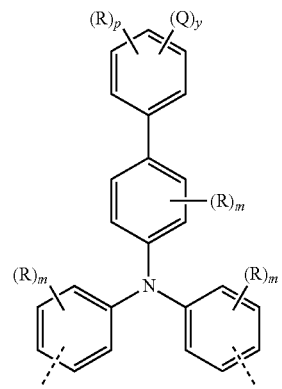 (D9)

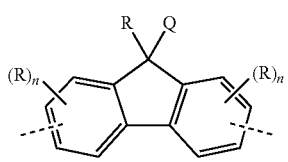 (D10)

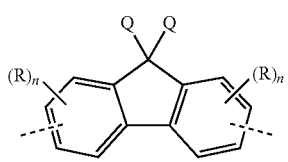 (D11)

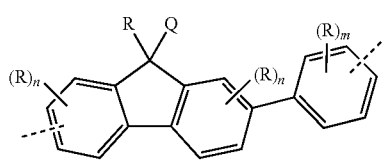 (D12)

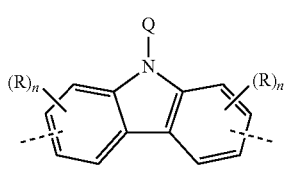 (D13)

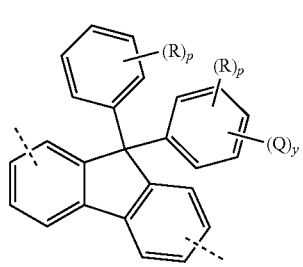 (D14)

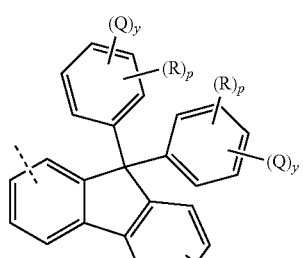 (D15)

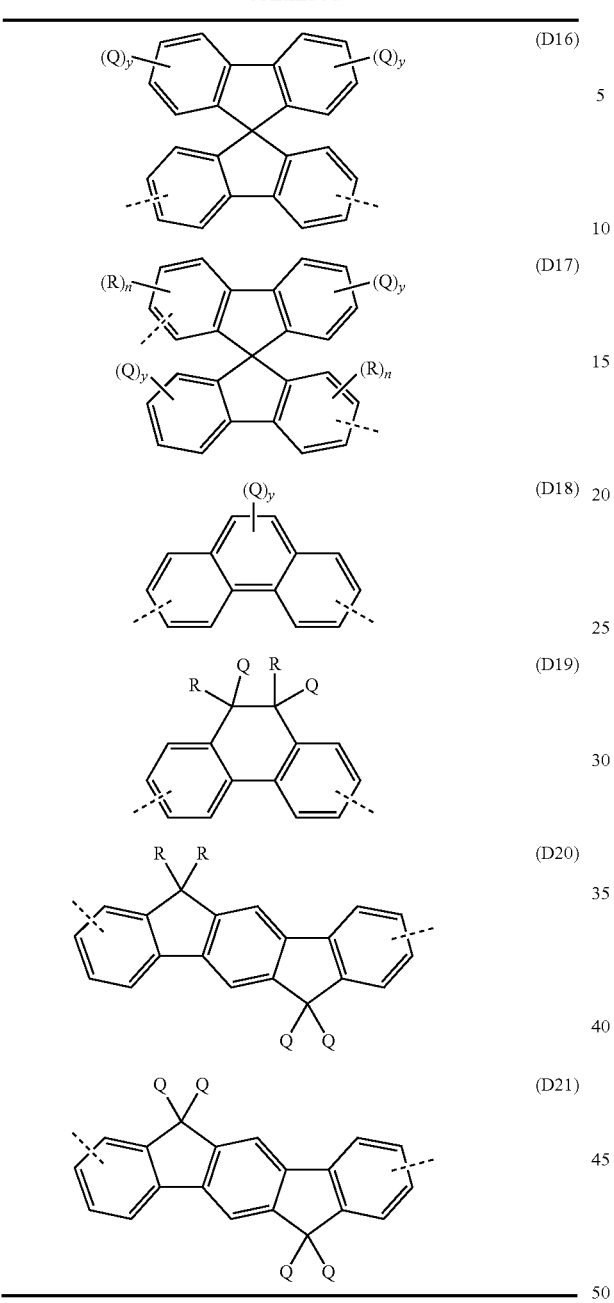

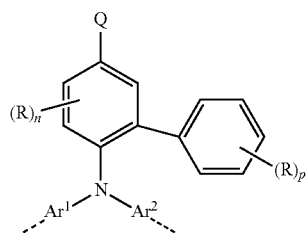

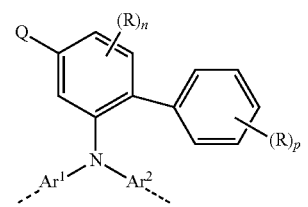

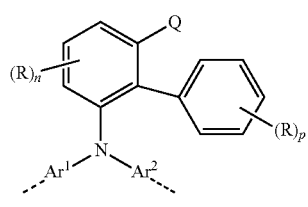

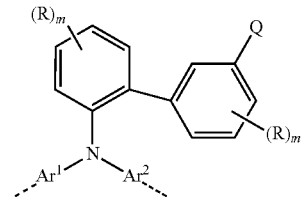

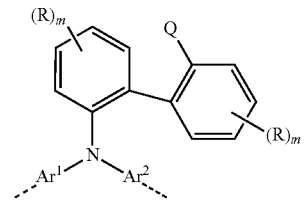

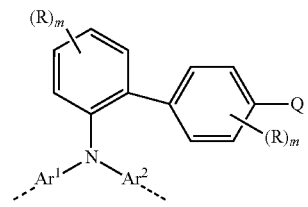

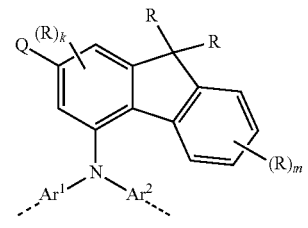

where R and Q can adopt the meanings indicated above in relation to the structural units of the formulae (D1) to (D7), p is 0, 1, 2, 3, 4 or 5,
m is 0, 1, 2, 3 or 4,
n is 0, 1, 2 or 3,
y is 0, 1 or 2, and
the dashed lines represent bonds to adjacent structural units in the polymer,
but with the proviso that, in relation to a phenylene group, the sum (p+y) is ≤5, and with the proviso that at least one y in each structural unit is ≥1.

Particularly preferred crosslinkable structural units D which contain at least one crosslinkable group Q are the structural units of the formulae (D1a) to (D7a) depicted in the following table.

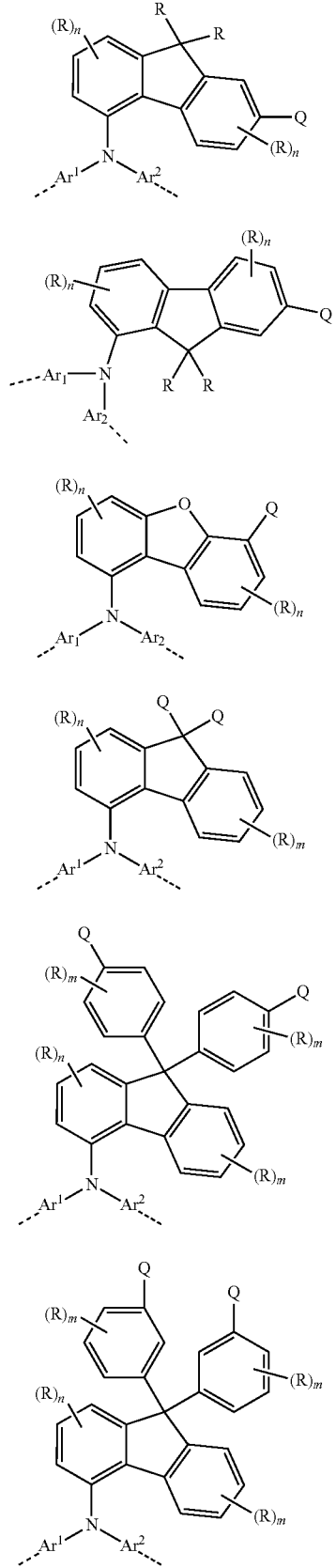

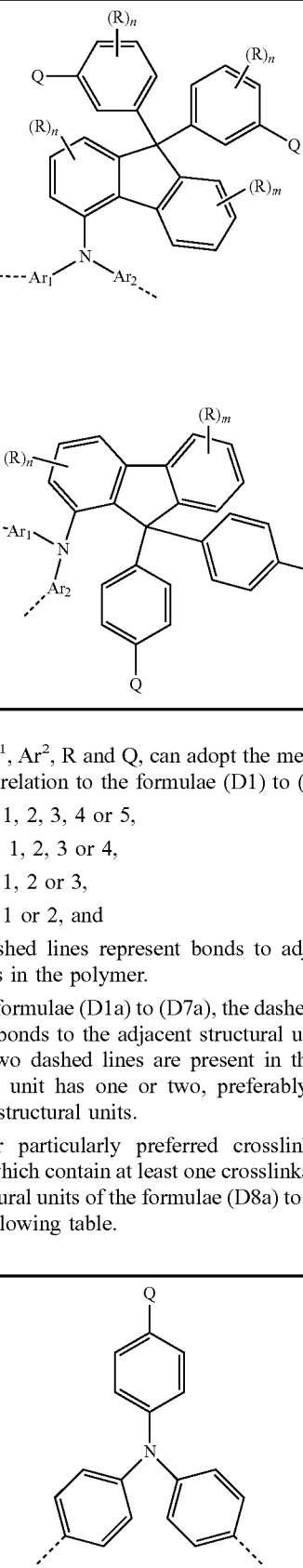

where $Ar^1$, $Ar^2$, R and Q, can adopt the meanings indicated above in relation to the formulae (D1) to (1D7), p is 0, 1, 2, 3, 4 or 5, m is 0, 1, 2, 3 or 4, n is 0, 1, 2 or 3, k is 0, 1 or 2, and the dashed lines represent bonds to adjacent structural units in the polymer.

In the formulae (D1a) to (D7a), the dashed lines represent possible bonds to the adjacent structural units in the polymer. If two dashed lines are present in the formulae, the structural unit has one or two, preferably two, bonds to adjacent structural units.

Further particularly preferred crosslinkable structural units D which contain at least one crosslinkable group Q are the structural units of the formulae (D8a) to (D16a) depicted in the following table.

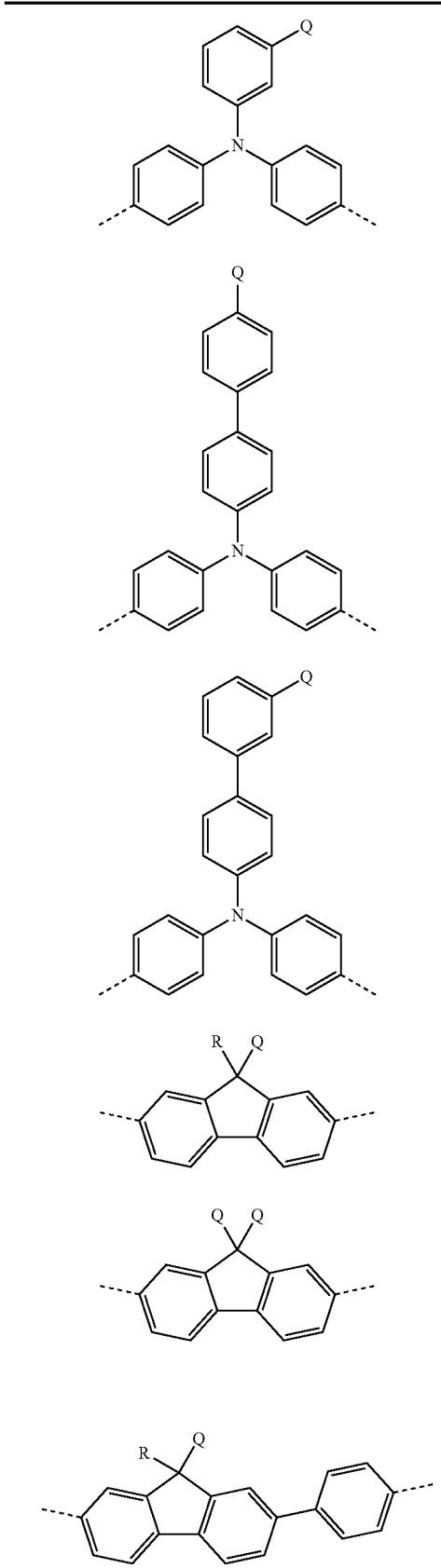
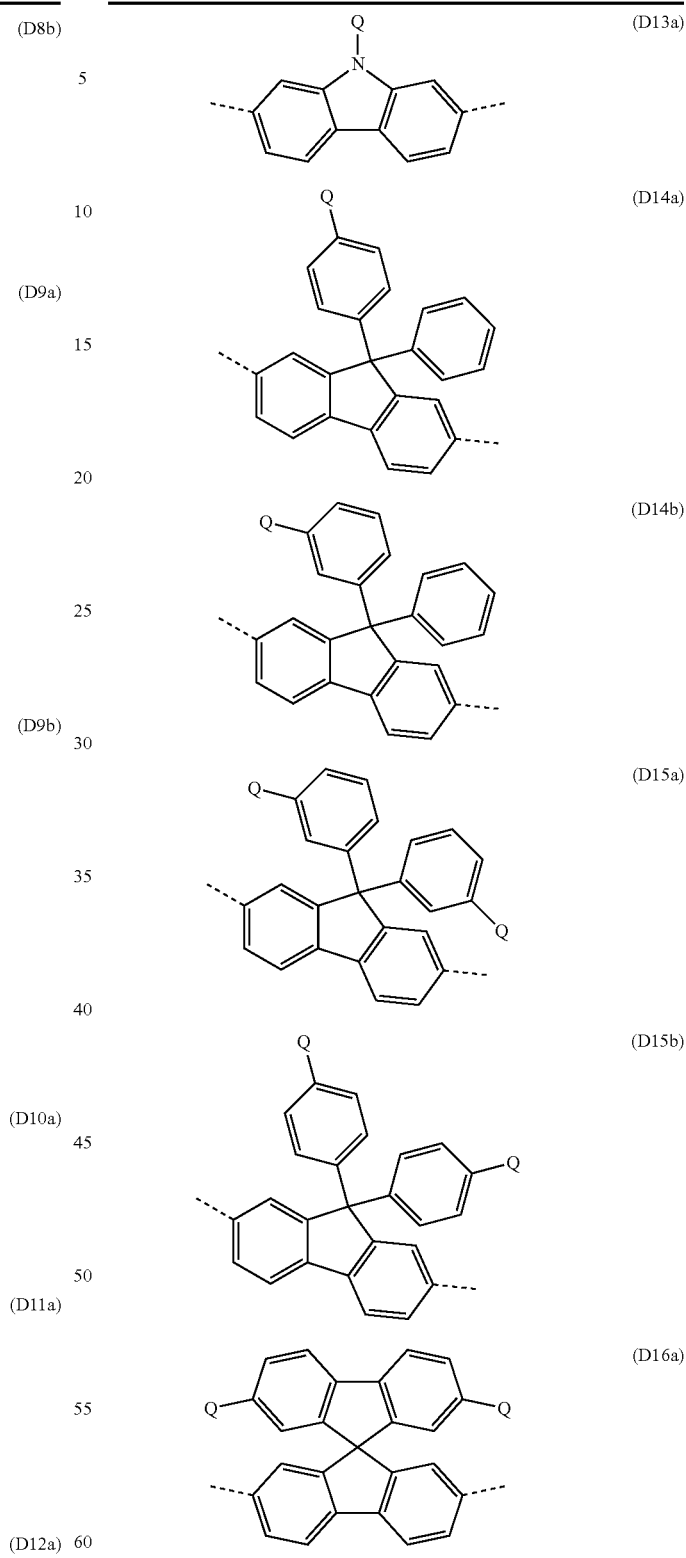
where R and Q can adopt the meanings indicated above in relation to the formulae (D1) to (D7).
A very particularly preferred crosslinkable group D is the structural unit of the formula (D8a) depicted in the table above.

The polymers according to the invention containing at least one hole-transporting structural unit A, at least one branching structural unit B, at least one further structural unit C and at least one end group E and optionally at least one crosslinkable structural unit D are generally prepared by polymerisation of in each case one or more of the corresponding types of monomer, at least one monomer of which leads to structural units of the formulae A, B, C, E and optionally D in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymersation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C—C linking reactions are preferably selected from the groups of SUZUKI coupling, YAMAMOTO coupling and STILLE coupling.; the C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

For the synthesis of the polymers according to the invention, the corresponding monomers are required.

The monomers which lead to structural units A, B, C, E and optionally D in the polymers according to the invention are compounds which are correspondingly substituted and have at one or two positions suitable functionalities Y which allow this monomer unit to be incorporated into the polymer. The group Y represents, identically or differently, a leaving group which is suitable for a polymerisation reaction, so that the incorporation of the monomer units into polymeric compounds is facilitated. Y preferably represents a chemical functionality which is selected, identically or differently, from the class of the halogens, O-tosylates, O-triflates, O-sulfonates, boric acid esters, partially fluorinated silyl groups, diazonium groups and organotin compounds.

The basic structure of the monomer compounds can be functionalised by standard methods, for example by Friedel-Crafts alkylation or acylation. Furthermore, the basic structure can be halogenated by standard methods of organic chemistry. The halogenated compounds can optionally be reacted further in additional functionalisation steps. For example, the halogenated compounds can be employed, either directly or after conversion into a boronic acid derivative or organotin derivative, as starting materials for the reaction to give polymers, oligomers or dendrimers.

The said methods merely represent a selection from the reactions known to the person skilled in the art which he can employ, without being inventive, for the synthesis of the compounds according to the invention.

Polymers containing structural units which contain a crosslinkable group Q are particularly suitable for the production of films or coatings, in particular for the production of structured coatings, for example by thermal or light-induced in-situ polymerisation and in-situ crosslinking, such as, for example, in-situ UV photopolymerisation or photopatterning. It is possible here to use both corresponding polymers in pure substance, but it is also possible to use formulations or mixtures of these polymers as described above. These can be used with or without addition of solvents and/or binders. Suitable materials, processes and devices for the methods described above are described, for example, in WO 2005/083812 A2. Possible binders are, for example, polystyrene, polycarbonate, poly(meth)acrylates, polyacrylates, polyvinylbutyral and similar, opto-electronically neutral polymers.

The present invention thus furthermore relates to the use of a polymer which contains structural units which contain a crosslinkable group Q for the preparation of a crosslinked polymer. The crosslinkable group, which is particularly preferably a vinyl group or alkenyl group, is preferably incorporated into the polymer by the WITTIG reaction or a WITTIG-analogous reaction. If the crosslinkable group is a vinyl group or alkenyl group, the crosslinking can take place by free-radical or ionic polymerisation, which can be induced thermally or by radiation. Preference is given to free-radical polymerisation which is induced thermally, preferably at temperatures of less than 250° C., particularly preferably at temperatures of less than 230° C.

The present invention thus also relates to a process for the preparation of a crosslinked polymer which comprises the following steps:

(a) provision of polymers which contain structural units which contain one or more crosslinkable groups Q; and
(b) free-radical or ionic crosslinking, preferably free-radical crosslinking, which can be induced both thermally and also by radiation, preferably thermally.

The crosslinked polymers prepared by the process according to the invention are insoluble in all common solvents. In this way, it is possible to produce defined layer thicknesses which are not dissolved or partially dissolved again, even by the application of subsequent layers.

The present invention thus also relates to a crosslinked polymer which is obtainable by the process mentioned above. The crosslinked polymer is—as described above—preferably produced in the form of a crosslinked polymer layer. Owing to the insolubility of the crosslinked polymer in all solvents, a further layer can be applied to the surface of a crosslinked polymer layer of this type from a solvent using the techniques described above.

The highly branched polymers according to the invention can be used in electronic or opto-electronic devices or for the production thereof.

The present invention thus furthermore relates to the use of the highly branched polymers according to the invention in electronic or opto-electronic devices, preferably in organic electroluminescent devices (OLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic electroluminescent devices (OLEDs).

The way in which OLEDs can be produced is known to the person skilled in the art and is described in detail, for example, as a general process in WO 2004/070772 A2, which should be adapted correspondingly for the individual case.

As described above, the polymers according to the invention are very particularly suitable as hole-transport materials in OLEDs or displays produced in this way.

The present invention therefore preferably also relates to the use of the highly branched polymers according to the invention in OLEDs, in particular as hole-transport material.

The present invention furthermore relates to electronic or opto-electronic components, preferably organic electroluminescent devices (OLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices and organic photoreceptors (OPCs), particularly preferably organic electro-luminescent devices, having one or more active layers, where at least one of these active layers comprises one or more highly branched polymers according to the invention. The active layer can be, for example, a light-emitting layer, a hole-transport layer and/or a hole-injection layer. The active layer is preferably a hole-transport layer.

The present application text and also the examples below are principally directed to the use of the highly branched polymers according to the invention in relation to OLEDs and corresponding displays. In spite of this restriction of the description, it is possible for the person skilled in the art, without further inventive step, also to use the polymers according to the invention as semiconductors for the further uses described above in other electronic devices.

The following examples are intended to explain the invention without restricting it. In particular, the features, properties and advantages described therein of the defined compounds on which the relevant example is based can also be applied to other compounds which are not described in detail, but fall within the scope of protection of the claims, unless stated otherwise elsewhere.

WORKING EXAMPLES

Part A: Synthesis of the Monomers

The monomers for the preparation of the polymers according to the invention have already been described in the prior art, are commercially available or are prepared in accordance with literature procedures and are summarised in Table 1 below:

TABLE 1

| Monomer | Structure | Synthesis in accordance with |
|---------|-----------|------------------------------|
| Mo1-Bo  |           | WO 99/048160 A1              |
| Mo2-Br  |           | WO 2013/156130               |
| Mo2-Bo  |           | WO 2013/156130               |

TABLE 1-continued
| Monomer | Structure | Synthesis in accordance with |
|---|---|---|
| Mo3-Br | 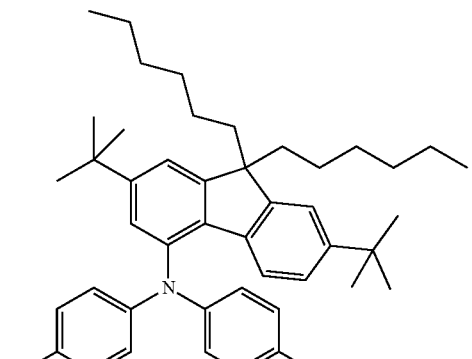 | Borylation analogously to WO 2013/156130 |
| Mo4-Br | 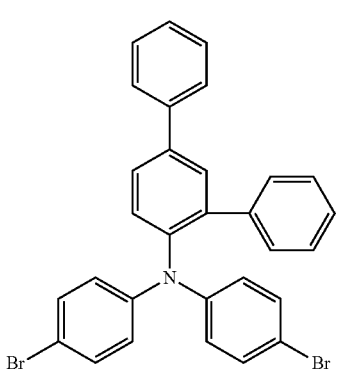 [SMILES: Brc1ccc(N(c2ccc(Br)cc2)c2ccc(-c3ccccc3)cc2-c2ccccc2)cc1] | CAS 2043618-74-0 |
| Mo5-Bo | 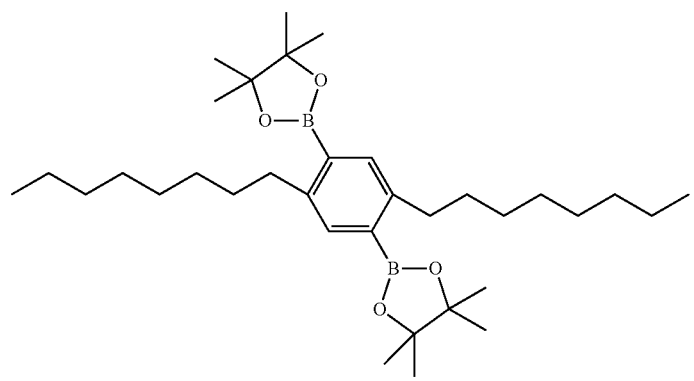 [SMILES: CCCCCCCCc1cc(B2OC(C)(C)C(C)(C)O2)c(CCCCCCCC)cc1B1OC(C)(C)C(C)(C)O1] | CAS 897404-05-6 |
| Mo5-Br | 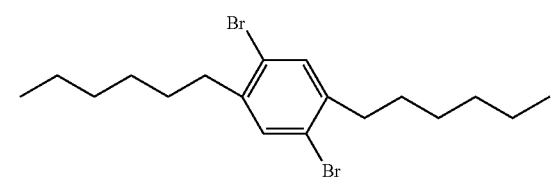 [SMILES: CCCCCCc1cc(Br)c(CCCCCC)cc1Br] | CAS 117635-21-9 |
| Mo6-Br | 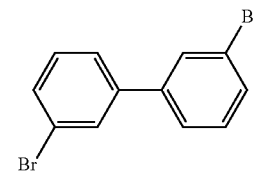 | CAS 16400-51-4 |

TABLE 1-continued
| Monomer | Structure | Synthesis in accordance with |
|---|---|---|
| Mo7-Br | 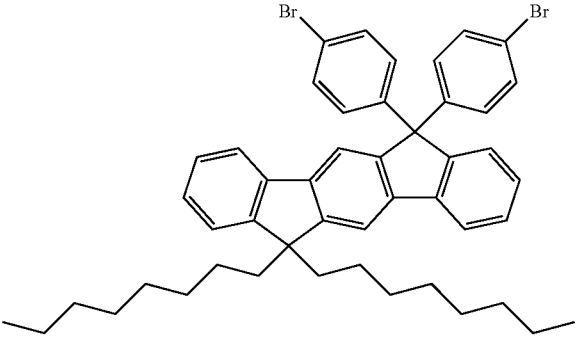 [SMILES: CCCCCCCCC1(CCCCCCCC)c2ccccc2-c2cc3c(cc21)-c1ccccc1C3(c1ccc(Br)cc1)c1ccc(Br)cc1] | WO 2010/136111 |
| Mo7-Bo | 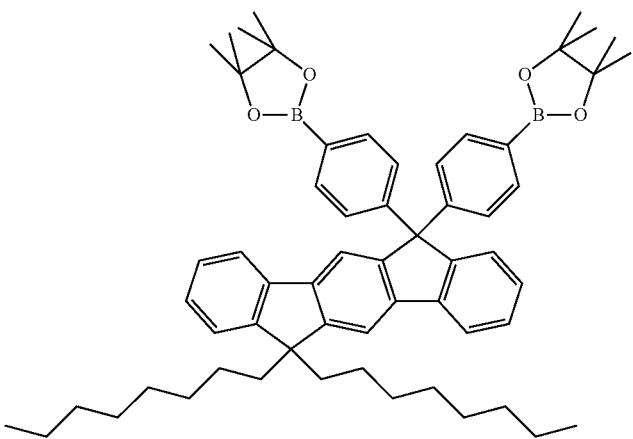 [SMILES: CCCCCCCCC1(CCCCCCCC)c2ccccc2-c2cc3c(cc21)-c1ccccc1C3(c1ccc(B2OC(C)(C)C(C)(C)O2)cc1)c1ccc(B2OC(C)(C)C(C)(C)O2)cc1] | WO 2010/136111 |
| Mo8-Bo | 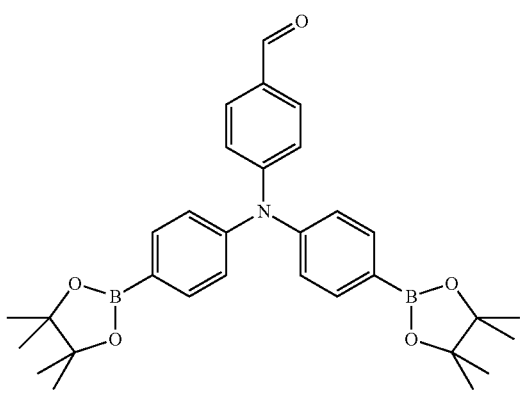 | WO 2010/097155 A1 |
| Mo8-Br | 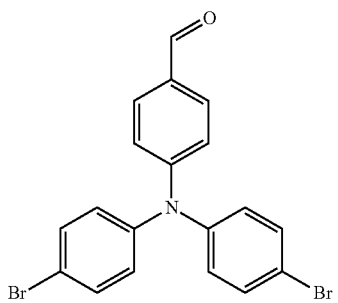 [SMILES: O=Cc1ccc(N(c2ccc(Br)cc2)c2ccc(Br)cc2)cc1] | WO 2010/097155 A1 |

TABLE 1-continued

| Monomer | Structure | Synthesis in accordance with |
|---------|-----------|------------------------------|
| Mo9-Br  |           | PCT/EP2017/083436 |
| Mo9-Bo  |           | Borylation analogously to WO 2013/156130 |
| Mo10-Br |           | PCT/EP2017/083436 |
| Mo10-Bo |           | Borylation analogously to WO 2013/156130 |

TABLE 1-continued

| Monomer | Structure | Synthesis in accordance with |
|---|---|---|
| Mo11-Br | | PCT/EP2017/083436 |
| Mo12-Br | | WO 2009/102027 |
| Mo12-Bo | | WO 2009/102027 |
| Mo12-Br | | CAS 198964-46-4 |
| Mo13-Br | | CAS 868704-91-0 |

TABLE 1-continued

| Monomer | Structure | Synthesis in accordance with |
|---------|-----------|------------------------------|
| Mo14-Bo | | WO 03/020790 |
| Mo15-Br | | Macromolecules 2000, 33, 2016-2020 |
| Mo15-Bo | | CAS 628303-20-8 |
| Mo16-Br | | CAS 626-39-1 |
| Mo16-Bo | | CAS 365564-05-2 |

TABLE 1-continued

| Monomer | Structure | Synthesis in accordance with |
|---|---|---|
| Mo17-Br | tris(4-bromophenyl)amine | CAS 4316-58-9 |
| Mo18-Br | 2,2',7,7'-tetrabromo-9,9'-spirobifluorene | CAS 128055-74-3 |
| Mo19-Br | 4-bromobiphenyl | CAS 92-66-0 |
| Mo19-Bo | 4-biphenylboronic acid pinacol ester | CAS 14432-79-1 |
| Mo20-Br | Tert-butylphenyl bromide | CAS 3972-65-4 |
| Mo21-Br | 4-Bromobenzaldehyde | CAS 1122-91-4 |

Part B: Synthesis of the Polymers

Preparation of comparative polymers V1 and V2 and polymers P1 to P22 according to the invention.

Comparative polymers V1 and V2 and polymers P1 to P22 according to the invention are prepared from the monomers disclosed in Part A by SUZUKI coupling by the process described in WO 2010/097155.

Polymers V1 and V2 as well as P1 to P22 prepared in this way contain the structural units in the percentage proportions indicated in Table 2 (percent figures=mol %) after the leaving groups have been cleaved off. In the case of the polymers prepared from monomers containing aldehyde groups, these are converted, after the polymerisation, into crosslinkable vinyl groups by WITTIG reaction by the process described in WO 2010/097155. The polymers shown correspondingly in Table 2 and employed in Part C thus contain crosslinkable vinyl groups instead of the aldehyde groups originally present.

The palladium and bromine contents of the polymers are determined by ICP-MS. The values determined are below 10 ppm.

The molecular weights $M_w$ and the polydispersities D are determined by means of gel permeation chromatography (GPC) (model: Agilent HPLC System Series 1100) (column: PL-RapidH from Polymer Laboratories; solvent: THE with 0.12 vol % of o-dichlorobenzene; detection: UV and refractive index; temperature: 40° C.). Calibrated using polystyrene standards.

TABLE 2

| Polymer | Mo A | % | Mo B | % | Mo C | % | Mo D | % | Mo E | % | Mw/D |
|---|---|---|---|---|---|---|---|---|---|---|---|
| V1 | Mo15-Br | 50 | Mo2-Bo | 50 | | | | | | | 80K/2.3 |

TABLE 2-continued

| Polymer | Mo A | % | Mo B | % | Mo C | % | Mo D | % | Mo E | % | Mw/D |
|---|---|---|---|---|---|---|---|---|---|---|---|
| V1a | Mo15-Br | 50 | Mo2-Bo | 50 | | | | | | | 200K/2.9 |
| V1b | Mo15-Br | 50 | Mo2-Bo | 50 | | | | | | | 310K/23.8 |
| V1c | Mo15-Br | 50 | Mo2-Bo | 50 | | | | | | | 175K/2.3 |
| V2 | Mo15-Br | 50 | Mo2-Bo | 40 | Mo8-Bo | 10 | | | | | 95K |
| P1 | Mo15-Br | 10.1 | Mo2-Bo | 47.8 | Mo16-Br | 15.8 | Mo19-Br | 26.24 | | | 26.5K/3.6 |
| P2 | Mo15-Br | 20 | Mo2-Bo | 50 | Mo16-Br | 15 | Mo19-Br | 15 | | | 500K/27.8 |
| P3 | Mo15-Br | 17.5 | Mo2-Bo | 50 | Mo16-Br | 15 | Mo19-Br | 20 | | | 90K/7.3 |
| P4 | Mo15-Br | 17.5 | Mo2-Bo | 40 | Mo16-Br | 15 | Mo19-Br | 20 | Mo8-Bo | 10 | 90K/5.7 |
| P5 | Mo2-Bo | 50 | Mo16-Br | 15 | Mo5-Br | 17.5 | Mo19-Br | 20 | | | 27K/4.6 |
| P6 | Mo15-Br | 17.5 | Mo2-Bo | 30 | Mo16-Br | 15 | Mo19-Br | 20 | Mo8-Bo | 20 | 75K/4.3 |
| P7 | Mo15-Bo | 17.5 | Mo4-Br | 40 | Mo16-Bo | 15 | Mo8-Br | 10 | Mo19-Bo | 20 | 95K/8.6 |
| P8 | Mo15-Br | 28.3 | Mo2-Bo | 40 | Mo16-Br | 10 | Mo19-Br | 13.3 | Mo8-Bo | 10 | 66K/6 |
| P9 | Mo15-Br | 39.2 | Mo2-Bo | 40 | Mo16-Br | 5 | Mo19-Br | 6.6 | Mo8-Bo | 10 | 280K/10.4 |
| P10 | Mo3-Br | 17.5 | Mo2-Bo | 40 | Mo16-Br | 15 | Mo19-Br | 20 | Mo8-Bo | 10 | |
| P11 | Mo15-Br | 17.5 | Mo2-Bo | 40 | Mo17-Br | 15 | Mo19-Br | 20 | Mo8-Bo | 10 | |
| P12 | Mo12-Br | 17.5 | Mo2-Bo | 40 | Mo16-Br | 15 | Mo19-Br | 20 | Mo8-Bo | 10 | 85K/5.5 |
| P13 | Mo13-Br | 17.5 | Mo2-Bo | 40 | Mo16-Br | 15 | Mo19-Br | 20 | Mo8-Bo | 10 | 100K/6.3 |
| P14 | Mo15-Br | 17.5 | Mo2-Bo | 40 | Mo16-Br | 15 | Mo19-Br | 20 | Mo10-Bo | 10 | 95K/4.5 |
| P15 | Mo15-Br | 17.5 | Mo2-Bo | 40 | Mo16-Br | 15 | Mo19-Br | 20 | Mo9-Bo | 10 | 80K/6.0 |
| P16 | Mo15-Br | 17.5 | Mo2-Bo | 40 | Mo16-Br | 15 | Mo20-Br | 20 | Mo9-Bo | 10 | 105K/5.8 |
| P17 | Mo13-Br | 17.5 | Mo2-Bo | 40 | Mo16-Br | 15 | Mo17-Br | 20 | Mo12-Bo | 10 | |
| P18 | Mo2-Bo | 40 | Mo16-Br | 15 | Mo5-Br | 17.5 | Mo19-Br | 20 | Mo9-Bo | 10 | |
| P19 | Mo1-Bo | 40 | Mo16-Br | 15 | Mo7-Br | 17.5 | Mo19-Br | 20 | Mo9-Bo | 10 | 50K/4.8 |
| P20 | Mo15-Br | 10 | Mo18-Br | 15 | Mo2-Bo | 40 | Mo19-Br | 20 | Mo8-Bo | 10 | |
| P21 | Mo14-Bo | 17.5 | Mo4-Br | 40 | Mo16-Bo | 15 | Mo19-Bo | 20 | Mo11-Br | 10 | |
| P22 | Mo15-Br | 17.5 | Mo2-Bo | 50 | Mo16-Br | 15 | Mo21-Br | 20 | | | 75K/7.5 |

Part C: Characterisation of the Polymers

Part C1: Test Method for the Dissolution Behaviour of the Polymers According to the Invention The polymer to be analysed is weighed out into a vessel, and a magnetic stirrer bar is added to the vessel. The solvent (or a mixture of a plurality of solvents produced in advance) is added to the solid. The amount of solvent is calculated so that a final solids concentration of 5 or 10 g/l is achieved in the solution. The suspension is stirred at 600 revolutions per minute at room temperature (25° C.) until the solid has completely dissolved. The end point of the dissolution is determined by visual examination. Towards the end of the dissolution operation, the solution is held in a light beam incident perpendicular to the viewing direction in order to be able to recognise still undissolved particles optimally.

The dissolution time, i.e. the time for complete dissolution of the solid material, also described as $t_{diss}$, is recorded and describes the time between addition of the solvent (or solvent mixture) and the disappearance of the final undissolved solid particles. The dissolution rate is determined by division of the dissolution time by the target concentration, here 5 or 10 g/l. The polymers are described by their dissolution rate in cyclohexyl caproate.

TABLE 3

Target composition of the solutions for determination of the dissolution behaviour.

| Material | Solvent | Target concentration [g/l] | Solution name |
|---|---|---|---|
| P1 | Cyclohexyl caproate | 5 | Solution A |
| P1 | Cyclohexyl caproate | 10 | Solution B |
| P2 | Cyclohexyl caproate | 5 | Solution C |
| P2 | Cyclohexyl caproate | 10 | Solution D |
| P3 | Cyclohexyl caproate | 5 | Solution E |
| P3 | Cyclohexyl caproate | 10 | Solution F |

TABLE 3-continued

Target composition of the solutions for
determination of the dissolution behaviour.

| Material | Solvent | Target concentration [g/l] | Solution name |
|---|---|---|---|
| V1 | Cyclohexyl caproate | 5 | Solution G |
| V1 | Cyclohexyl caproate | 10 | Solution H |
| V1a | Cyclohexyl caproate | 5 | Solution I |
| V1a | Cyclohexyl caproate | 10 | Solution J |

The materials are subsequently categorised in groups corresponding to the dissolution type in accordance with Table 4.

TABLE 4

Categorisation of the dissolution behaviour.

| Dissolution type | Dissolution time $t_{DISS}$ at 25° C. | Dissolution rate [g/(l · min)] |
|---|---|---|
| Type A | 0 to 14 minutes | >0.466 |
| Type B | 15 to 29 minutes | 0.466-0.233 |
| Type C | 30 to 59 minutes | 0.233-0.116 |
| Type D | 60 to 120 minutes | 0.116-0.058 |
| Type E | More than 120 minutes | <0.058 |
| Type F | Clear solution not obtained | 0 |

The results of the dissolution test are summarised in Table 5.

TABLE 5

Results of the dissolution test.

| Solution | Dissolution type |
|---|---|
| Solution A | Type E |
| Solution B | Type E |
| Solution C | Type E |
| Solution D | Type E |
| Solution E | Type E |
| Solution F | Type E |
| Solution G | Type D |
| Solution H | Type C |
| Solution I | Type D |
| Solution J | Type C |

As is clearly evident from the results, the polymers according to the invention are very highly suitable for the preparation of printing inks. In addition to this property, these materials, even without crosslinkable groups, are suitable, in combination with correspondingly selected solvents, for conversion into solution-processed multilayer components.

Part C2: Layer Stability Test Under Ink-Jet Printing Conditions

The polymers according to the invention are investigated with respect to their layer stability to solvents. To this end, the experiment described below is carried out.

1. Layer Preparation

A thin film of the polymer to be investigated is applied to a glass substrate measuring 30000×30000×1100 microns by spin coating from toluene. The solution has a solids content of 5 to 50 g/l. The solution is prepared by weighing out the material and addition of the solvent. The suspension is subsequently stirred for one to six hours at room temperature by means of a magnetic stirrer bar until the solid has completely dissolved. The solution is subsequently transferred into a glove box and filtered under protective gas using a PTFE filter with a pore diameter of 0.2 microns. The formulation is converted into an approximately 50 nm thick film on a flat glass substrate by spin coating. The layer thickness and homogeneity are monitored using an Alpha-step D-500 profilometer. The resultant layers typically have an average roughness (RMS) of less than one nanometre. After application of the layer, the substrates are annealed on a hotplate at a temperature of 220° C. for 60 minutes.

2. Layer Stability Test Conditions

In order to determine the layer stability, a test solvent is introduced into a solvent-resistant disposable ink cartridge, here a ten picolitre cartridge fitting a Fujifilm Dimatix DMP-2831. The cartridge is characterised by the resultant droplet size. The printer is operated in a low-vibration environment on a flat base.

The printing parameters are adjusted for a droplet speed of 4 m/s (for a detailed description of the procedure, see documentation from the printer manufacturer Fujifilm Dimatix). The stability test is carried out with droplets from just one print head nozzle.

Figure 2:
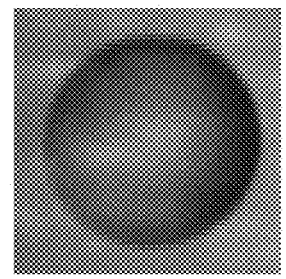
Figure 3:
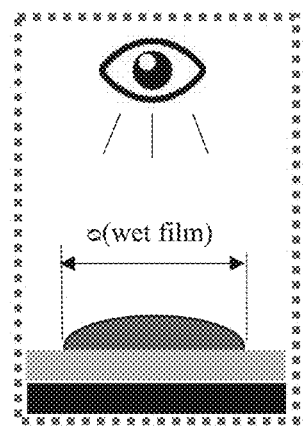

The prepared substrate from Step 1 is placed in the sample holder of the printer. The droplet pattern to be printed produces droplets of defined size on the substrate. To this end, 9 print droplets are arranged in a tight three by three matrix (see FIG. 1), so that they coalesce to form a droplet of greater volume (approximately ninety picolitres). The droplet volume can be varied by number and size of the droplets, but must be kept constant within an experiment. After the printing, the droplet appears on the substrate surface as sketched in FIG. 2. A droplet image of this type can be recorded using the camera built into the printer, which is installed on the print head carriage with viewing direction onto the substrate, parallel to the droplet flying direction (FIG. 3).

3. Layer Damage Test Evaluation

Immediately after printing, a photo is taken with the printer's internal camera (FIG. 2) and the time measurement is started. A number of photos are taken over a period of five minutes, the so-called exposure time (see Table 6). The diameter of the droplet above the view camera is determined from the photo immediately after printing. The size of the droplet in the image and the actual diameter of the droplet can be calculated true to scale from the x/y coordinates. The value describes the droplet diameter on the surface and thus the interaction of the solvent with the substrate (material layer). Comparison of the images during the exposure time allows an initial estimation of the layer stability (FIG. 6). The formation of a dark ring at the contact line of the droplet indicates damage to the material layer by the solvent.

Figure 4:
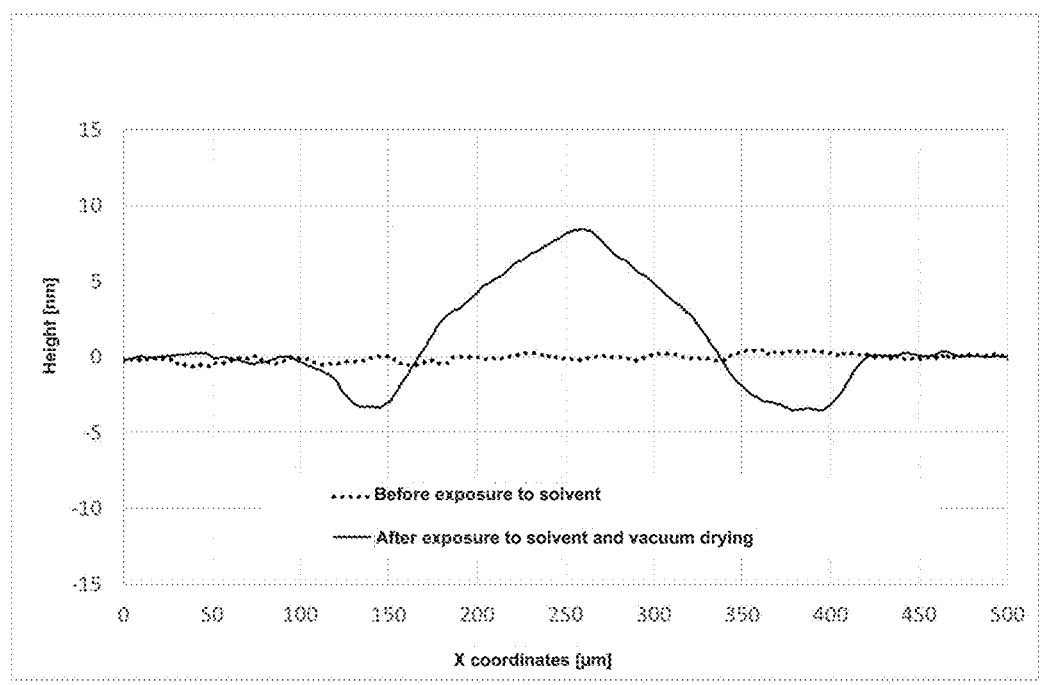
Figure 5:
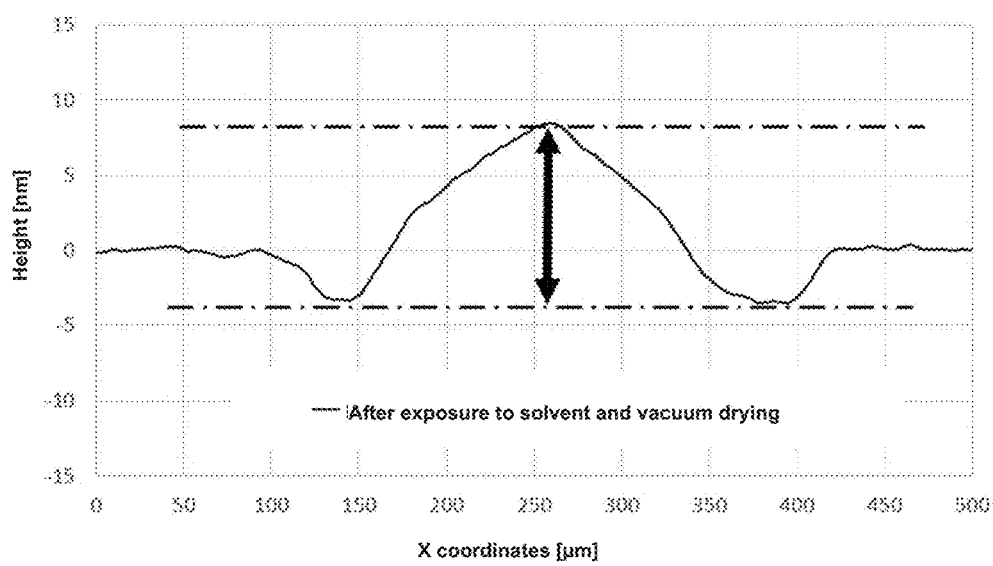

After an exposure time of five minutes, the substrate is placed in a vacuum drying chamber, and the solvent is removed in vacuo, giving a dry film again. The vacuum chamber is of such a size that a pressure of $1 \cdot 10^{-3}$ mbar is achieved about 60 seconds after the vacuum pump has been switched on. The substrate remains in the vacuum chamber for at least 10 minutes. After the drying step, the substrate is removed from the vacuum chamber, and the damage to the material surface is quantified. Firstly, the substrate is placed under the camera of the inkjet printer again and a photo is taken in the dried state. The damage or layer stability is quantified by determination of the film profile and the layer thickness at the position of the original droplet (FIG. 4). The method used is profilometry by means of a fine diamond tip; other methods for the determination of surface structures, such as, for example, but not exclusively, scanning force microscopy, are likewise possible. In order to quantify the layer stability, a key performance indicator (KPI) is defined, which describes the difference between the highest and lowest points of a profile line through the centre point of the droplet location (FIG. 5). The performance indicator has the unit nanometers. The key performance indicator is converted into a layer damage indicator LDI in accordance with the criteria indicated in FIG. 7. This indicator can then be used to describe the relative stability of a combination of a material and a solvent. This procedure is repeated at least 10 times and a maximum of 50 times per material in order to ensure reproducibility of the measurement values.

TABLE 6

Layer damage evaluation.

| Exposure time [sec] | 0 | 60 | 120 | 180 | 300 | dry |
|---|---|---|---|---|---|---|
| Photo? | Yes | Yes | Yes | Yes | Yes | Yes |
| Determine droplet diameter | Yes | No | No | No | No | No |

In order to determine a layer damage rate, a quantity for describing the rate of damage, the key performance indicator of the layer stability is divided by the exposure time, in this case 300 seconds. The unit for this damage rate is nanometers per second. The exposure time should be selected so that the experiment represents a realistic test scenario for the production of a solution-processed layer in an opto-electronic component. In accordance with the LDI, a damage rate of 0.066 nanometres per second is an acceptable value for use for a certain combination of a material and a solvent (see Table 7).

TABLE 7

| Material | Drying temperature | Test solvent | Damage experiment |
|---|---|---|---|
| P5 | 220 | 1-Methyl-3-phenoxybenzene | Exp 1 |
| P5 | 220 | Cyclohexyl caproate | Exp 2 |
| P2 | 220 | 3-Phenoxytoluene | Exp 3 |
| P2 | 220 | Cyclohexyl hexanoate | Exp 4 |
| P3 | 220 | 1-Methyl-3-phenoxybenzene | Exp 5 |
| P3 | 220 | Cyclohexyl caproate | Exp 6 |
| V1 | 180 | 1-Methyl-3-phenoxybenzene | Ref Exp 1 |
| V2 | 220 | 3-Methyldiphenyl ether | Ref Exp 2 |
| V1 | 180 | Cyclohexyl hexanoate | Ref Exp 3 |
| V2 | 220 | Cyclohexyl hexanoate | Ref Exp 4 |

TABLE 8

| Damage experiment | Layer damage indicator LDI |
|---|---|
| Exp1 | ○ |
| Exp2 | ++ |
| Exp3 | − |
| Exp4 | + |
| Exp5 | − |
| Exp6 | + |
| RefExp1 | − |
| RefExp2 | − |
| RefExp3 | − |
| RefExp4 | + |

It can clearly be seen from the examples shown (see Table 8) that the polymers according to the invention exhibit excellent solvent resistance as a layer and are highly suitable for the production of multilayered components.

Part C3: Solution Rheology

The viscosity of the formulations according to the invention (see Table 9) was determined using a Haake Mars III rotational rheometer in a plate-and-cone measurement geometry (1° cone angle). The measurement of the viscosity is carried out with temperature control at a temperature 25° C. (+/−0.2° C.) and at a shear rate of 500 s$^{-1}$ (experiment index low) or 1000 s$^{-1}$ (experiment index high). Each sample is measured at least three times, and the measured values are averaged. As can clearly be seen from the results (Table 9), linear, conjugated polymers in particular exhibit a certain tendency towards non-Newtonian behaviour. For use of these solutions as an ink in inkjet printing, non-Newtonian behaviour is an undesired complication in the planning of a homogeneous print image.

TABLE 9

| Material | Solvent | Concentration [% by weight] | Experiment number | Viscosity [mPas] |
|---|---|---|---|---|
| P3 | Cyclohexyl caproate | 0.467 | Visco1 $_{low}$ | 3.87 |
| P3 | Cyclohexyl hexanoate | 0.935 | Visco2 $_{low}$ | 4.36 |
| P3 | 1-Methyl-3-phenoxybenzene | 0.525 | Visco3 $_{low}$ | 4.91 |
| P3 | 1-Methyl-3-phenoxybenzene | 0.525 | Visco3 $_{high}$ | 4.95 |
| P3 | 3-Methyldiphenyl ether | 1.051 | Visco4 $_{low}$ | 5.65 |
| P3 | 3-Methyldiphenyl ether | 1.051 | Visco4 $_{high}$ | 5.68 |
| P3 | 3-Phenoxytoluene | 3.153 | Visco5 $_{low}$ | 9.98 |
| P3 | 3-Phenoxytoluene | 3.153 | Visco5 $_{high}$ | 10.1 |
| P1 | Cyclohexyl caproate | 0.467 | Visco6 $_{low}$ | 3.68 |
| P1 | 1-Methyl-3-phenoxybenzene | 0.525 | Visco7 $_{low}$ | 4.61 |
| P1 | 3-Methyldiphenyl ether | 1.051 | Visco8 $_{low}$ | 4.96 |
| P1 | 3-Phenoxytoluene | 3.153 | Visco9 $_{low}$ | 7.12 |
| P2 | Cyclohexyl caproate | 0.467 | Visco10 $_{low}$ | 4.12 |
| P2 | 1-Methyl-3-phenoxybenzene | 0.525 | Visco11 $_{low}$ | 5.78 |
| P2 | 1-Methyl-3-phenoxybenzene | 0.525 | Visco11 $_{high}$ | 5.78 |
| P2 | 3-Methyldiphenyl ether | 1.051 | Visco12 $_{low}$ | 7.84 |
| P2 | 3-Methyldiphenyl ether | 1.051 | Visco12 $_{high}$ | 7.77 |
| P2 | 3-Phenoxytoluene | 3.153 | Visco13 $_{low}$ | 20.97 |
| P2 | 3-Phenoxytoluene | 3.153 | Visco13 $_{high}$ | 20.2 |
| V1 | Cyclohexyl caproate | 0.467 | Visco14 $_{low}$ | 4.52 |
| V1 | Cyclohexyl caproate | 0.467 | Visco14 $_{high}$ | 4.57 |
| V1 | Cyclohexyl hexanoate | 0.935 | Visco15 $_{low}$ | 6.15 |
| V1 | Cyclohexyl hexanoate | 0.935 | Visco15 $_{high}$ | 6.21 |
| V1 | Cyclohexyl hexanoate | 2.805 | Visco16 $_{low}$ | 18.69 |
| V1 | Cyclohexyl hexanoate | 2.805 | Visco16 $_{high}$ | 18.8 |
| V1 | 1-Methyl-3-phenoxybenzene | 0.525 | Visco17 $_{low}$ | 5.81 |
| V1 | 3-Methyldiphenyl ether | 1.051 | Visco18 $_{low}$ | 7.82 |
| V1 | 3-Phenoxytoluene | 3.153 | Visco19 $_{low}$ | 21.08 |
| V1a | Cyclohexyl caproate | 0.467 | Visco20 $_{low}$ | 6.36 |
| V1a | Cyclohexyl caproate | 0.467 | Visco20 $_{high}$ | 6.4 |

TABLE 9-continued

| Material | Solvent | Concentration [% by weight] | Experiment number | Viscosity [mPas] |
|---|---|---|---|---|
| V1a | Cyclohexyl hexanoate | 0.935 | Visco21 $_{low}$ | 10.61 |
| V1a | Cyclohexyl hexanoate | 0.935 | Visco21 $_{high}$ | 10.7 |
| V1a | Cyclohexyl hexanoate | 2.805 | Visco22 $_{low}$ | 61.84 |
| V1a | Cyclohexyl hexanoate | 2.805 | Visco22 $_{high}$ | 61.2 |
| V1a | 1-Methyl-3-phenoxybenzene | 0.525 | Visco23 $_{low}$ | 7.73 |
| V1a | 3-Methyldiphenyl ether | 1.051 | Visco24 $_{low}$ | 12.73 |
| V1a | 3-Phenoxytoluene | 3.153 | Visco25 $_{low}$ | 66.25 |
| V1c | 1-Methyl-3-phenoxybenzene | 0.525 | Visco26 $_{low}$ | 9.37 |
| V1c | 1-Methyl-3-phenoxybenzene | 0.525 | Visco26 $_{high}$ | 9.39 |
| V1c | 3-Methyldiphenyl ether | 1.051 | Visco27 $_{low}$ | 19.74 |
| V1c | 3-Methyldiphenyl ether | 1.051 | Visco27 $_{high}$ | 19.1 |
| V1c | 3-Phenoxytoluene | 3.153 | Visco28 $_{low}$ | 130.01 |
| V1c | 3-Phenoxytoluene | 3.153 | Visco28 $_{high}$ | 114 |
| V1b | 1-Methyl-3-phenoxybenzene | 0.525 | Visco29 $_{low}$ | 8.13 |
| V1b | 1-Methyl-3-phenoxybenzene | 0.525 | Visco29 $_{high}$ | 8.11 |
| V1b | 3-Methyldiphenyl ether | 1.051 | Visco30 $_{low}$ | 13.19 |
| V1b | 3-Methyldiphenyl ether | 1.051 | Visco30 $_{high}$ | 13.1 |
| V1b | 3-Phenoxytoluene | 3.153 | Visco31 $_{low}$ | 72.00 |
| V1b | 3-Phenoxytoluene | 3.153 | Visco31 $_{high}$ | 66.1 |

It can be seen from the results shown in Table 9 that the polymers according to the invention exhibit Newtonian behaviour over the entire range of possible molecular weights. This is of great advantage for control of important printing parameters, for example control of droplet size and droplet weight in ink-jet printing. The absolute values of the shear viscosity increase significantly less strongly with increasing molecular weights and increasing concentrations than in the case of the comparable linear polymers. This enables processing of more highly concentrated inks. This enables both printing of higher resolution structures and also shorter process times.

Part C4: Printability Investigation

In order to determine the printability of the polymer inks, in each case a test solution is introduced into a solvent-resistant disposable ink cartridge, here a ten picolitre cartridge fitting a Dimatix DMP-2831 ink-jet printer. The cartridge here is characterised by the resultant droplet size. The printer is operated in a low-vibration environment on a flat base.

With the aid of a camera focused on the outlet opening of the print head of the cartridge, it is possible to determine the shape and speed of the droplets on leaving the print head.

As printing parameter for control of the droplet speed, principally, but not exclusively, the voltage to be applied is adjusted (for a detailed description of the procedure, see the printer manufacturers documentation). The printability investigation is carried out over the entire parameter range to be investigated with droplets from a print head nozzle.

Table 10 below gives an overview of the experiments carried out, with details on material, solvent and concentration.

TABLE 10

| Material | Solvent | Concentration [g/l] | Ink |
|---|---|---|---|
| P4 | 3-Phenoxytoluene | 5 | Ink 1 |
| P2 | 3-Phenoxytoluene | 5 | Ink 2 |
| V2 | 3-Phenoxytoluene | 5 | Ink 3 |
| V1c | 3-Phenoxytoluene | 5 | Ink 4 |
| V1b | 3-Phenoxytoluene | 5 | Ink 5 |

These inks were characterised corresponding to the procedure described. Table 11 below indicates what voltage is necessary in order to achieve a target droplet speed.

TABLE 11

| Ink | Voltage [V] | Droplet speed [m/s] |
|---|---|---|
| Ink1 | 12.2 | 1 |
| Ink1 | 13.5 | 2 |
| Ink1 | 14.7 | 3 |
| Ink1 | 15.8 | 4 |
| Ink1 | 17.9 | 5 |
| Ink1 | 19.5 | 6 |
| Ink1 | 20.7 | 7 |
| Ink1 | 21.9 | 8 |
| Ink1 | 23.2 | 9 |
| Ink1 | 24.7 | 10 |
| Ink1 | 26.1 | 11 |
| Ink1 | 27.3 | 12 |
| Ink 2 | 13.4 | 1 |
| Ink 2 | 14.6 | 2 |
| Ink 2 | 15.9 | 3 |
| Ink 2 | 17.4 | 4 |
| Ink 2 | 19.2 | 5 |
| Ink 2 | 20.5 | 6 |
| Ink 2 | 21.9 | 7 |
| Ink 2 | 23.3 | 8 |
| Ink 2 | 24.9 | 9 |
| Ink 2 | 26.5 | 10 |
| Ink 2 | 28.1 | 11 |
| Ink 2 | 29.7 | 12 |
| Ink 3 | 12.5 | 1 |
| Ink 3 | 13.7 | 2 |
| Ink 3 | 14.9 | 3 |
| Ink 3 | 16.3 | 4 |
| Ink 3 | 17.3 | 5 |
| Ink 3 | 19.1 | 6 |
| Ink 3 | 20.7 | 7 |
| Ink 3 | 21.9 | 8 |
| Ink 3 | 23.3 | 9 |
| Ink 3 | 24.7 | 10 |
| Ink 3 | 26.1 | 11 |
| Ink 3 | 27.7 | 12 |
| Ink 4 | 13.8 | 1 |
| Ink 4 | 15 | 2 |
| Ink 4 | 16 | 3 |
| Ink 4 | 17.4 | 4 |
| Ink 4 | 19 | 5 |
| Ink 4 | 20.4 | 6 |
| Ink 4 | 21 | 7 |
| Ink 4 | 22.6 | 8 |
| Ink 4 | 24 | 9 |
| Ink 4 | 25.2 | 10 |
| Ink 4 | 26.8 | 11 |
| Ink 4 | 28.2 | 12 |
| Ink 5 | 16 | 1 |
| Ink 5 | 16.8 | 2 |
| Ink 5 | 18.2 | 3 |
| Ink 5 | 19.6 | 4 |
| Ink 5 | 20.6 | 5 |
| Ink 5 | 22.2 | 6 |
| Ink 5 | 23.4 | 7 |

TABLE 11-continued

| Ink | Voltage [V] | Droplet speed [m/s] |
|---|---|---|
| Ink 5 | 24.8 | 8 |
| Ink 5 | 26.2 | 9 |
| Ink 5 | 27.8 | 10 |
| Ink 5 | 29.4 | 11 |
| Ink 5 | 30.8 | 12 |

Figure 8:
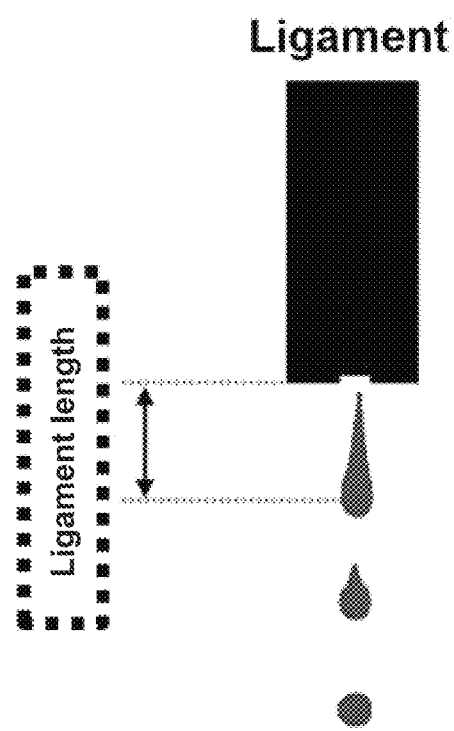

Finally, the ligament length of a droplet is evaluated at a droplet speed on leaving the print head nozzle that is to be compared in advance. This value is a measure of the viscoelastic properties of the printing fluid. An explanatory depiction is shown in FIG. 8. This value must not exceed a critical value depending on the application, the print head/substrate separation and a target droplet speed as well as a specific resolution to be printed. Shorter ligament lengths are thus desirable, and, as is clearly evident in Table 12, the highly branched polymers according to the invention are, surprisingly, clearly advantageous here over the linear polymers.

TABLE 12

| Material in ink | Voltage [V] | Ligament length [µm] |
|---|---|---|
| P4 | 17.9 | 150 |
| P2 | 19.2 | 180 |
| V2 | 17.3 | 180 |
| V1c | 19 | 220 |
| V1a | 20.6 | 350 |

Part C5: Layer Thickness Determination

The comparative polymers and the polymers according to the invention are processed from solution.

Whether the crosslinkable variants of the polymers give a completely insoluble layer after crosslinking is tested analogously to WO 2010/097155.

Table C13 shows the remaining layer thickness of the originally 100 nm after the washing operation described in WO 2010/097155. If the layer thickness does not reduce, the polymer is insoluble and the crosslinking is thus adequate.

TABLE 13

Control of the residual layer thickness of originally 100 nm after washing test

| Polymer | Temp [° C.] | Residual layer thickness after washing test [in nm] Crosslinking at 220° C. for 30 minutes |
|---|---|---|
| V2 | 220 | 99 |
| P4 | 220 | 94 |
| P22 | 220 | 98 |

As can be seen in Table 13, comparative polymer V2 and polymers P4 and P22 according to the invention crosslink completely at 220° C.

Part C6: Determination of the Energy Level

Table 14 lists the energy levels measured for the polymers. The HOMOs are determined by means of a Riken AC3 measurement, whereas the energy gap is determined by means of the edge of the absorption spectrum. It can be seen that the polymers according to the invention have no deviating values of the energy levels, with the exception of polymer P5, which was specially designed to have a greater energy gap.

TABLE 14

Energy levels of the polymers

| HTL | HOMO [eV] | Egap [eV] |
|---|---|---|
| V1 | −5.59 | 2.85 |
| V2 | −5.61 | 2.85 |
| P1 | −5.57 | 2.87 |
| P2 | −5.62 | 2.86 |
| P3 | −5.59 | 2.86 |
| P4 | −5.62 | 2.86 |
| P22 | −5.57 | 2.86 |
| P5 | −5.70 | 3.14 |

Part D: Production of OLEDs

The production of solution-based OLEDs of this type has already been described many times in the literature, for example in WO 2004/037887 and WO 2010/097155. The process is adapted to the circumstances described below (layer-thickness variation, materials).

The polymers according to the invention are used in two different layer sequences:

A)
  substrate,
  ITO (50 nm),
  PEDOT:PSS (20 nm),
  hole-transport layer (HTL) (20 nm),
  emission layer (EML) (60 nm),
  hole-blocking layer (HBL) (10 nm),
  electron-transport layer (ETL) (40 nm),
  cathode.
or
B)
  substrate,
  ITO (50 nm),
  PEDOT:PSS (60 nm),
  hole-transport layer (HTL) (20 nm),
  emission layer (EML) (60 nm),
  hole-blocking layer (HBL) (10 nm),
  electron-transport layer (ETL) (40 nm),
  cathode.

Furthermore, the components are produced using two different processes: a) by means of spin coating or b) by means of ink-jet printing.

Processing Sequence A)

Cleaned glass plates coated with structured ITO (indium tin oxide) in a thickness of 50 nm serve as substrate. These are coated with PEDOT:PSS. The spin coating is carried out from water in air. The layer is dried by heating at 180° C. for 10 minutes. PEDOT:PSS is purchased from Heraeus Precious Metals GmbH & Co. KG, Germany. The hole-transport and emission layers are applied to these coated glass plates.

The polymers according to the invention and comparative polymers, in each case dissolved in toluene, are used as hole-transport layer. The typical solids content of such solutions is about 5 g/l if, as here, the layer thicknesses of 20 nm which are typical for a device is to be achieved by means of spin coating. The layers are applied by spin coating in an inert-gas atmosphere, in the present case argon, and dried by heating at 220° C. for 30 minutes.

The emission layer is always composed of at least one matrix material (host material) and an emitting dopant (emitter). Furthermore, mixtures of a plurality of matrix materials and co-dopants may occur. An expression such as H1 30%: H2 55%: C1 15% here means that the first host material H1 is present in the emission layer in a proportion by weight of 30%, the second host material is present in the emission layer in a proportion by weight of 55% and the third co-dopant is present in the emission layer in a proportion by weight of 15%. The mixture for the emission layer is dissolved in toluene for structure A. The typical solids content of such solutions is about 17 g/l if, as here, the layer thickness of 60 nm which is typical for a device is to be achieved by means of spin coating. The layers are applied by spin coating in an inert-gas atmosphere, in the present case argon, and dried by heating at 150° C. for 10 minutes.

The materials used in the examples are shown in Table 15.

The materials for the hole-blocking layer and electron-transport layer are applied by thermal vapour deposition in a vacuum chamber and are shown in Table 16. The hole-blocking layer consists of ETM1. The electron-transport layer consists of the two materials ETM1 and ETM2, which are admixed with one another by co-evaporation in a proportion by volume of 50% each.

The cathode is formed by thermal vapour deposition of an aluminium layer with a thickness of 100 nm.

Processing Sequence B)

The substrates used are cleaned glass plates which have been coated with structured ITO (indium tin oxide) in a thickness of 50 nm and pixelated bank material.

The hole-injection layer used here is again PEDOT:PSS, which is printed onto the substrates by means of ink-jet printing. It is subsequently dried in vacuo and baked at 180° C. in air for 30 minutes. PEDOT:PSS is obtained from Heraeus Precious Metals GmbH & Co. KG, Germany.

This is followed by application of the hole-transport layer. The hole-transport layer used is the polymers according to invention and comparative polymers. The polymers are dissolved in 3-phenoxytoluene and diethylene glycol butyl methyl ether in the volume ratio 7:3. The ink is printed by means of ink-jet printing and subsequently likewise dried in vacuo and baked at 230° C. in an inert-gas atmosphere (argon) for 30 minutes.

The light-emitting layer is likewise deposited by means of ink-jet printing. The emission layer is always composed of at least one matrix material (host material) and an emitting dopant (emitter). It is also possible for mixtures of a plurality of matrix materials and co-dopants to occur. An expression such as H1 30%; H2 55%; C1 15% here means that material H1 is present in the emission layer in a proportion by weight of 30%, the second matrix material H2 is present in a proportion by weight 55% and the dopant is present in a proportion by weight of 15%.

The emission layer in structure B is printed from pure 3-phenoxytoluene. After the printing, the layers are dried in vacuo and baked at 160° C. in an inert-gas atmosphere (argon) for 10 minutes. The composition of the emitting layer is shown in Table 17, with the materials being shown in Table 15.

All ink-printing processes are carried out under yellow light and in an air atmosphere.

The hole-blocking and electron-transport layers are applied by thermal vapour deposition in a vacuum chamber and are shown in Table 16. The hole-blocking layer consists of ETM1. The electron-transport layer consists of the two materials ETM1 and ETM2, which are admixed with one another by co-evaporation in a proportion by volume of 50% each.

The cathode is formed by thermal vapour deposition of an aluminium layer with a thickness of 100 nm.

TABLE 15

Structural formulae of the materials used in the emission layer

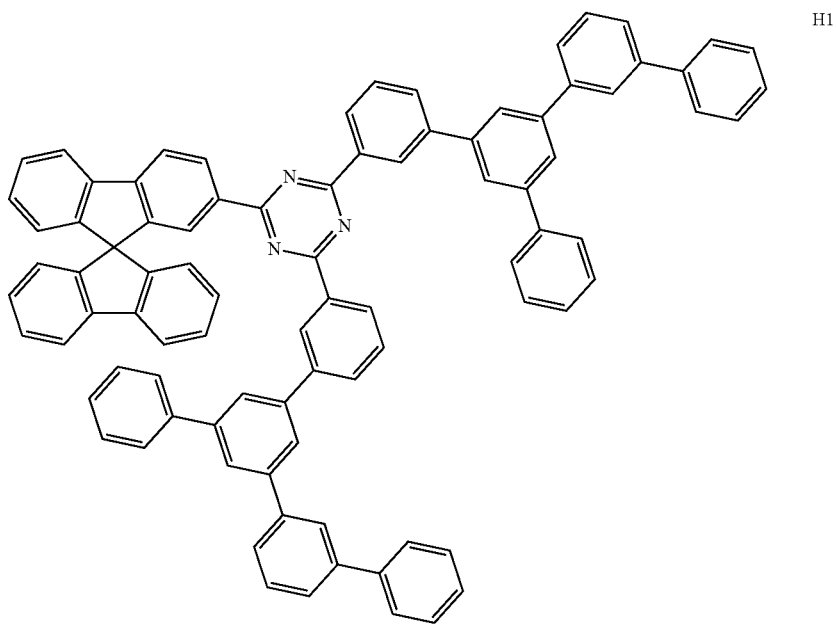

TABLE 15-continued
Structural formulae of the materials used in the emission layer
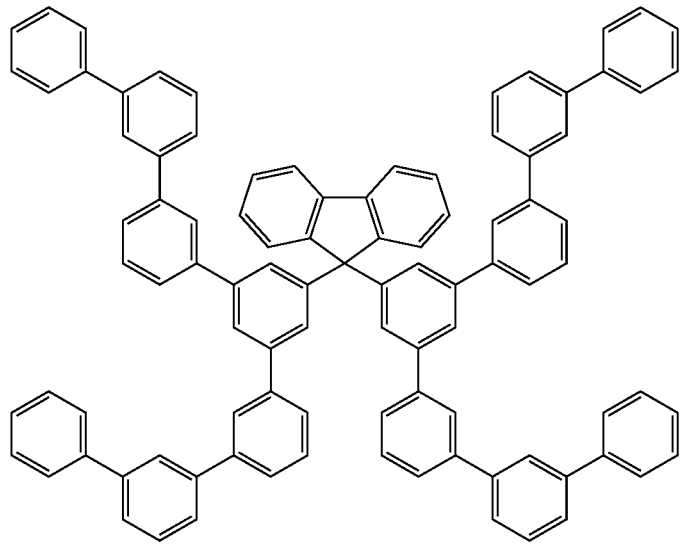 [SMILES: c1ccc(-c2cccc(-c3cccc(-c4cc(-c5cccc(-c6cccc(-c7ccccc7)c6)c5)cc(C5(c6cc(-c7cccc(-c8cccc(-c9ccccc9)c8)c7)cc(-c7cccc(-c8cccc(-c9ccccc9)c8)c7)c6)c6ccccc6-c6ccccc65)c4)c3)c2)cc1]
H2
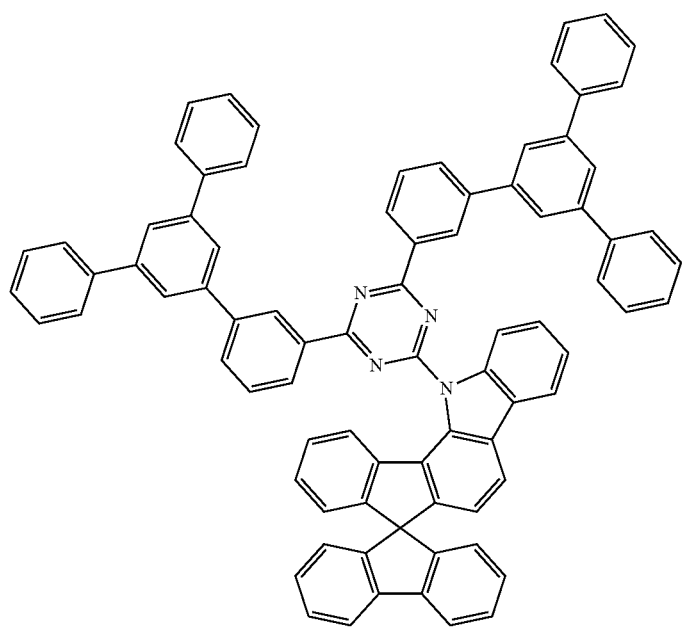 [SMILES: c1ccc(-c2cc(-c3ccccc3)cc(-c3cccc(-c4nc(-c5cccc(-c6cc(-c7ccccc7)cc(-c7ccccc7)c6)c5)nc(-n5c6ccccc6c6ccc7c(c65)-c5ccccc5C75c6ccccc6-c6ccccc65)n4)c3)c2)cc1]
H3
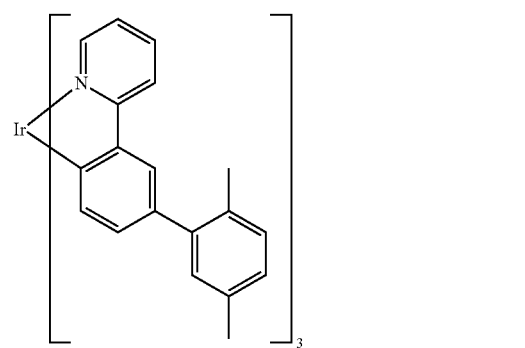
C1

TABLE 15-continued
Structural formulae of the materials used in the emission layer
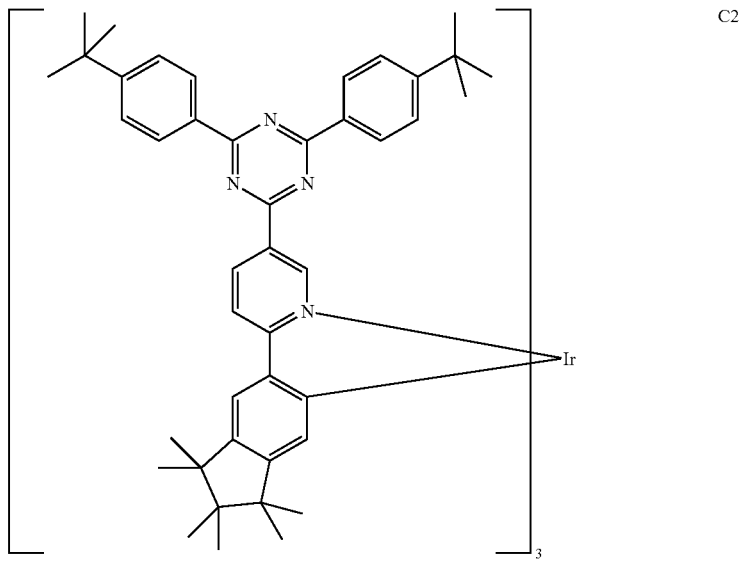
C2
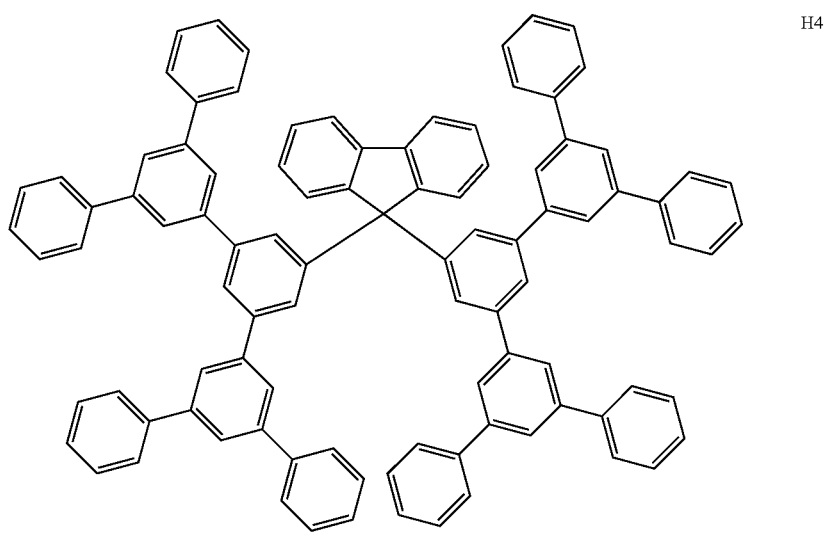
H4
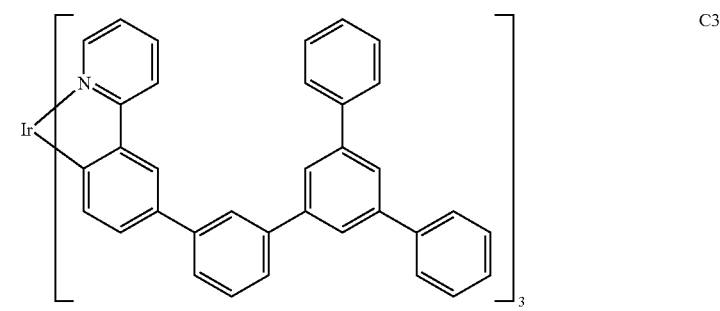
C3

TABLE 16

HBL and ETL materials used

ETM1

ETM2 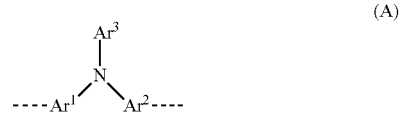

The precise composition of the OLEDs is shown in Table 17. Examples 1 to 3 are produced by means of processing A) and structure A, whereas Examples 4 to 5 are produced by means of processing B) and structure B.

TABLE 17

Structure of the OLEDs

| Example | HTL polymer | EML composition |
| --- | --- | --- |
| 1 | V2 | H1 30%; H2 55%; C1 15% |
| 2 | P4 | H1 30%; H2 55%; C1 15% |
| 3 | P22 | H1 30%; H2 55%; C1 15% |
| 4 | V1 | H3 30%; H4 47%; C3 17%; C2 6% |
| 5 | P3 | H3 30%; H4 47%; C3 17%; C2 6% |

Part E: Characterisation of the OLEDs

The OLEDs are characterised by standard methods. For this purpose, the electroluminescence spectra, current/voltage/luminous density characteristic lines (IUL characteristic lines) assuming Lambert emission characteristics and the (operating) lifetime are determined. The IUL characteristic lines are used to determine characteristic numbers such as the operating voltage (in V) and the external quantum efficiency (in %) at a certain luminance. The electroluminescence spectra are measured at a luminous density of 1000 cd/m², and the CIE 1931 x and y colour coordinates are calculated therefrom. LT80® 1000 cd/m² is the lifetime by which the OLED has dropped from an initial luminance of 1000 cd/m² to 80% of the initial intensity, i.e. to 800 cd/m². The representation of showing the lifetime at a constant current density is likewise used.

The properties of the various OLEDs are summarised in Tables 18a and 18b. Examples 1 and 4 show comparative components and Examples 2, 3 and 5 show properties of OLEDs according to the invention.

In spite of the different structure type with greatly improved process properties (cf. Part C, Characterisation of the polymers), the good properties in OLEDs are retained.

TABLE 18a

Properties of the OLEDs with structure A

| Example | Efficiency at 1000 cd/m² % EQE | Voltage at 1000 cd/m² [V] | LT80 at 1000 cd/m² [h] |
| --- | --- | --- | --- |
| 1 | 17.1 | 4.2 | 112 |
| 2 | 17.1 | 4.5 | 111 |
| 3 | 17.0 | 4.6 | 106 |

TABLE 18b

Properties of the OLEDs with structure B

| Example | Efficiency at 1000 cd/m² % EQE | Voltage at 1000 cd/m² [V] | LT90 at 60 cd/m² [h] |
| --- | --- | --- | --- |
| 4 | 16.3 | 6.6 | 267 |
| 5 | 16.2 | 6.9 | 234 |

The invention claimed is:

1. A formulation comprising
A) at least one highly branched polymer which contains 30 to 70 mol % of at least one hole-transporting recurring unit A selected from triarylamine units of the following formula (A)

$$\text{----Ar}^1\overset{\overset{\displaystyle Ar^3}{|}}{\underset{}{N}}\text{Ar}^2\text{----} \tag{A}$$

where
$Ar^1$ to $Ar^3$ are on each occurrence, in each case identically or differently, a mono- or polycyclic, aromatic or heteroaromatic ring system having 5 to 60 aromatic ring atoms, which may be substituted by one or more radicals R;
R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals $R^1$, where one or more non-adjacent $CH_2$ groups may be replaced by $R^1C=CR^1$, $C≡C$, $Si(R^1)_2$, $C=O$, $C=S$, $C=NR^1$, $P(=O)(R^1)$, SO, $SO_2$, $NR^1$, O, S, or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroarylaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a cross-linkable group Q, where two or more radicals R may also form a mono- or polycyclic, aliphatic, aromatic and/or benzo-fused ring system with one another;

R¹ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents R¹ may also form a mono- or polycyclic, aliphatic or aromatic ring system with one another; and the dashed lines represent bonds to adjacent structural units in the polymer, wherein Ar³ is substituted by Ar⁴ in at least one, of the two ortho positions, where Ar⁴ is a mono- or polycyclic, aromatic or heteroaromatic ring system having 5 to 60 aromatic ring atoms, which may be substituted by one or more radicals R, 5 to 30 mol % of at least one branching recurring unit B, 5 to 30 mol % of at least one further recurring unit C selected from 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, 1,2-: 1,3- or 1,4-phenylene, 1,2-, 1,3- or 1,4-naphthylene, 2,2'-, 3,3'- or 4,4'-biphenylylene, 2,2''-, 3,3''-, or 4,4''-terphenylylene, 2,2'-, 3,3'- or 4,4'-bi-1, 1'-naphthylylene or 2,2'''-, 3,3'''-, or 4,4'''-quaterphenylylene derivatives, and 5 to 40 mol % of at least one end group E, where the recurring units A, B and C are different from one another, wherein the highly branched polymer has a molecular weight $M_w$ in the range from 25,000 to 500,000 g/mol, and B) at least one organic solvent having a boiling point of at least 200° C., wherein the formulation has a viscosity of from 2 to 20 mPas.

2. The formulation according to claim 1, wherein the formulation comprises an organic solvent.

3. The formulation according to claim 1, wherein the formulation comprises a mixture of two or more organic solvents.

4. The formulation according to claim 1, wherein the concentration of the highly branched polymer in the formulation is in the range from 5 to 50 g/l.

5. The formulation according to claim 1, wherein the branching recurring units B are selected from the structural units of the formulae (B1) to (B5)

(B1)

(B2)

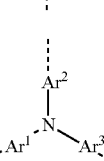

(B3)

-continued

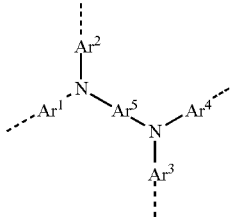

(B4)

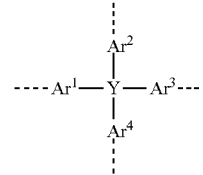

(B5)

where

Ar¹ to Ar⁵ are on each occurrence, in each case identically or differently, a mono- or polycyclic, aromatic or heteroaromatic ring system having 5 to 60 aromatic ring atoms, which may be substituted by one or more radicals R;

R is on each occurrence, identically or differently, H, D, F, Cl, Br, I, N(R¹)₂, CN, NO₂, Si(R¹)₃, B(OR¹)₂, C(=O)R¹, P(=O)(R¹)₂, S(=O)R¹, S(=O)₂R¹, OSO₂R¹, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals R¹, where one or more non-adjacent CH₂ groups may be replaced by R¹C=CR¹, C≡C, Si(R¹)₂, C=O, C=S, C=NR¹, P(=O)(R¹), SO, SO₂, NR¹, O, S, or CONR¹ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals R¹, or an aryloxy or heteroaryloxy group having 5 to 60 aromatic ring atoms, which may be substituted by one or more radicals R¹, or an aralkyl or heteroarylaralkyl group having 5 to 60 aromatic ring atoms, which may be substituted by one or more radicals R¹, or a diarylamino group, diheteroarylamino group or arylheteroarylamino group having 10 to 40 aromatic ring atoms, which may be substituted by one or more radicals R¹, or a crosslinkable group Q, where two or more radicals R may also form a mono- or polycyclic, aliphatic, aromatic and/or benzo-fused ring system with one another;

R¹ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents R¹ may also form a mono- or polycyclic, aliphatic or aromatic ring system with one another;

Y is C or Si, and the dashed lines represent bonds to adjacent structural units in the polymer.

6. The formulation according to claim 1, wherein the end groups E are selected from structural units of the formulae (E1) to (E13)

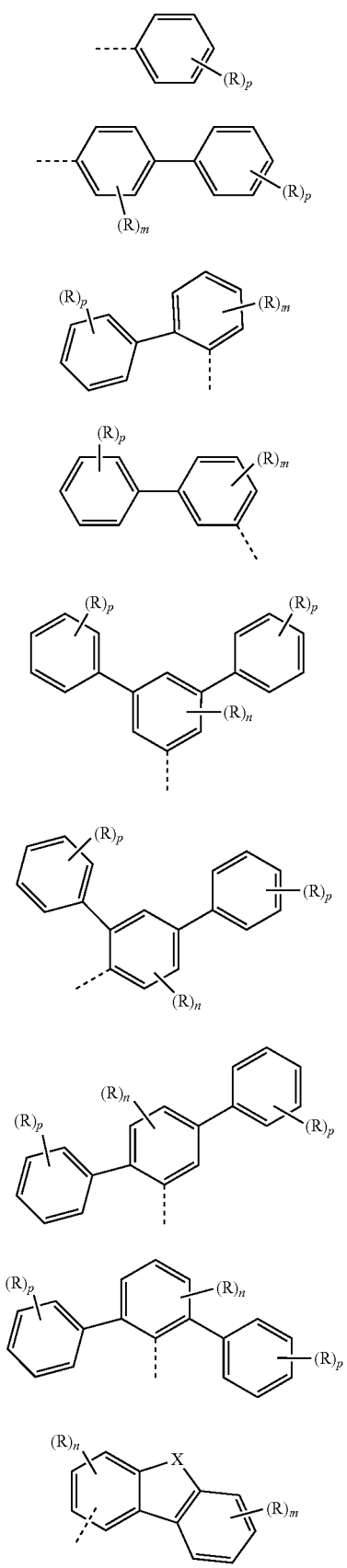
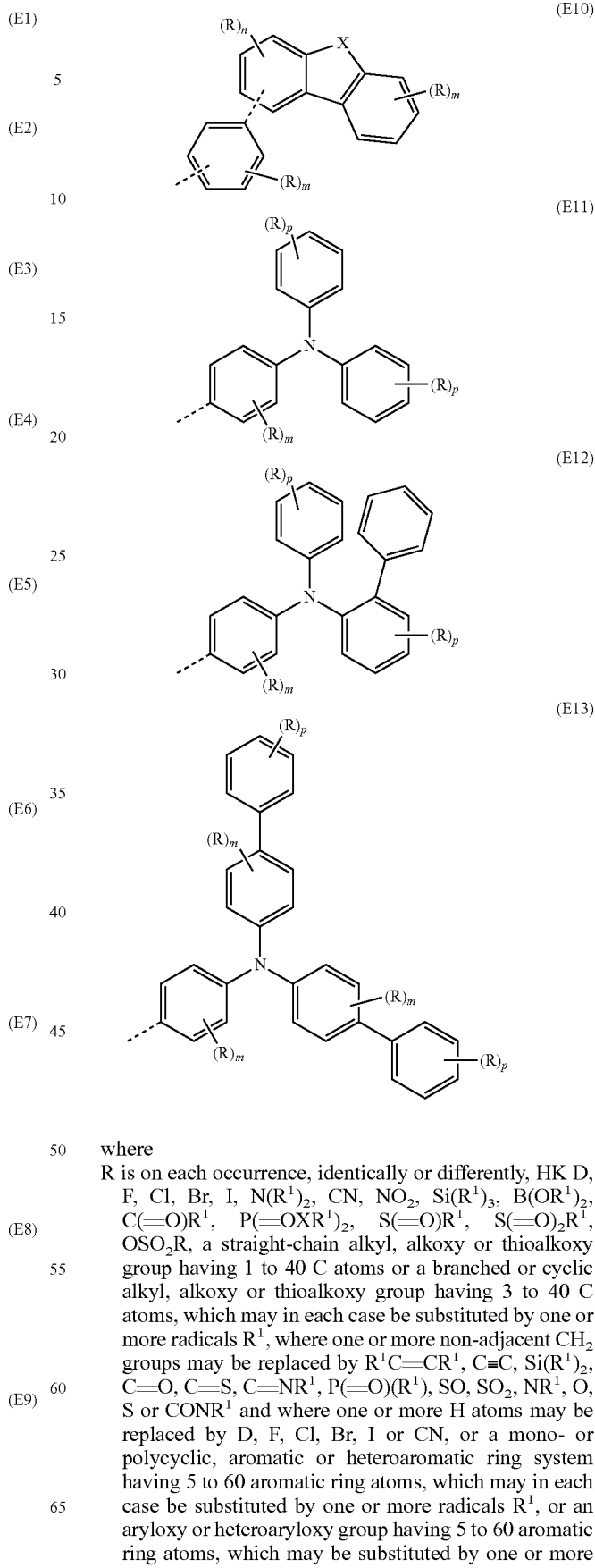

where
R is on each occurrence, identically or differently, HK D, F, Cl, Br, I, $N(R^1)_2$, CN, $NO_2$, $Si(R^1)_3$, $B(OR^1)_2$, $C(=O)R^1$, $P(=OXR^1)_2$, $S(=O)R^1$, $S(=O)_2R^1$, $OSO_2R$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals $R^1$, where one or more non-adjacent $CH_2$ groups may be replaced by $R^1C=CR^1$, $C\equiv C$, $Si(R^1)_2$, $C=O$, $C=S$, $C=NR^1$, $P(=O)(R^1)$, SO, $SO_2$, $NR^1$, O, S or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals R¹, or an aralkyl or heteroarylaralkyl group having 5 to 60 aromatic ring atoms, which may be substituted by one or more radicals R¹, or a diarylamino group, diheteroarylamino group or arylheteroarylamino group having 10 to 40 aromatic ring atoms, which may be substituted by one or more radicals R¹, or a crosslinkable group Q, where two or more radicals R may also form a mono- or polycyclic, aliphatic, aromatic and/or benzo-fused ring system with one another;

R¹ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents R¹ may also form a mono- or polycyclic, aliphatic or aromatic ring system with one another;

X is $CR^2$, NR, $SiR^2$, O, S, C=O or P=O, p is 0, 1, 2, 3, 4 or 5, m is 0, 1, 2, 3 or 4, n is 0, 1, 2 or 3, and the dashed line represents the bond to an adjacent structural unit in the polymer.

7. The formulation according to claim 6, wherein the end groups E contain at least one, crosslinkable group Q.

8. The formulation according to claim 1, wherein the highly branched polymer additionally contains 1 to 35 mol % of at least one crosslinkable structural unit D.

9. The formulation according to claim 8, wherein the structural units D are selected from the structural units of the formulae (D1) to (D7)

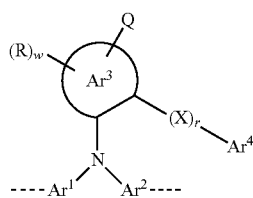
(D1)

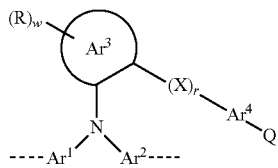
(D2)

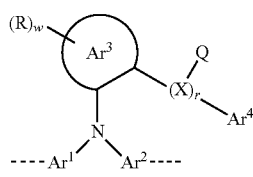
(D3)

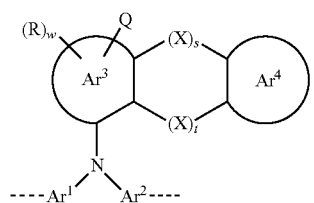
(D4)

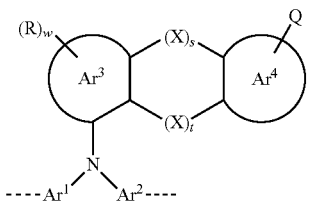
(D5)

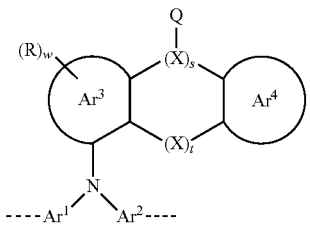
(D6)

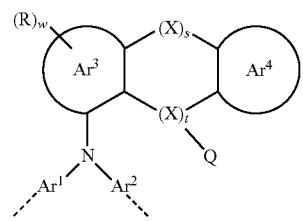
(D7)

where $Ar^1$ or $Ar^4$ are on each occurence, in each case identically or differently, a mono- or polycyclic, aromatic or heteroaromatic ring system having 5 to 60 aromatic ring atoms, which may be substituted by one or more radicals R;

Q is a crosslinkable group;

R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals R¹, where one or more non-adjacent $CH_2$ groups may be replaced by $R^1C=CR^1$, C≡C, $Si(R^1)_2$, C=O, C=S, $C=NR^1$, $P(=O)(R^1)$, SO, $SO_2$, $NR^1$, O, S or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals R¹, or an aryloxy or heteroaryloxy group having 5 to 60 aromatic ring atoms, which may be substituted by one or more radicals R¹, or an aralkyl or heteroarylaralkyl group having 5 to 60 aromatic ring atoms, which may be substituted by one or more radicals R¹, or a diarylamino group, diheteroarylamino group or arylheteroarylamino group having 10 to 40 aromatic ring atoms, which may be substituted by one or more radicals R¹, or a crosslinkable group Q, where two or more radicals R may also form a mono- or polycyclic, aliphatic, aromatic and/or benzo-fused ring system with one another;

R¹ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F; where two or more substituents $R^1$ may also form a mono- or polycyclic, aliphatic or aromatic ring system with one another;

X is $CR^2$, NR, $SiR^2$, O, S, C=O or P=O, w is 0, 1, 2, 3, 4, 5 or 6, r is 0 or 1, s and t are each 0 or 1, where the sum (s+t)=1 or 2; and the dashed lines represent bonds to adjacent structural units in the polymer.

10. The formulation according to claim 8, wherein the structural units D are selected from the structural units of the formulae (D8) to (D21)

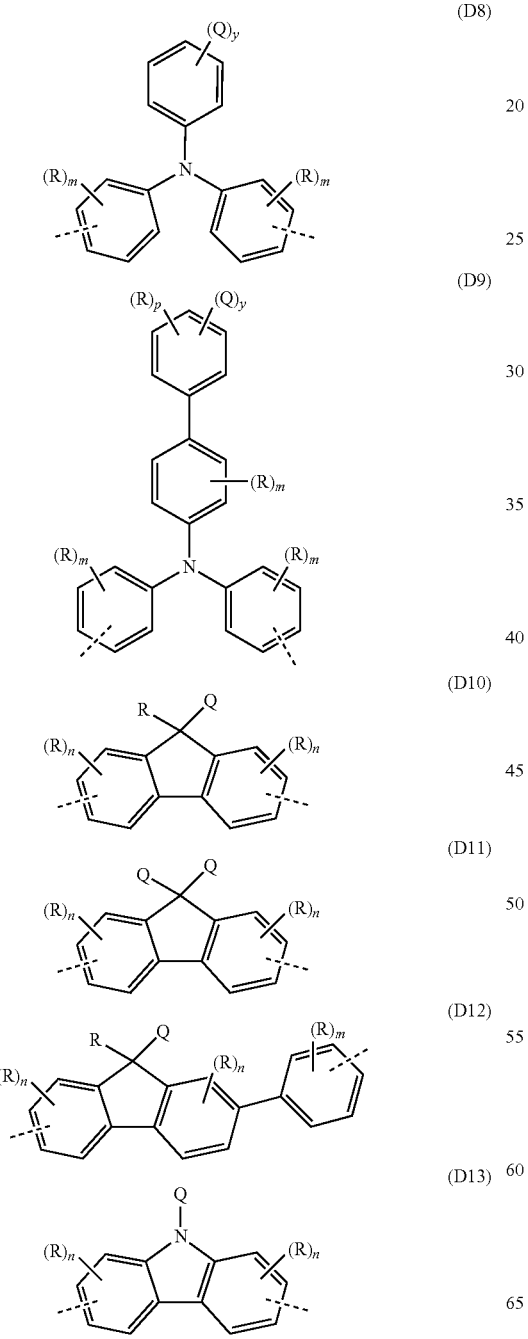

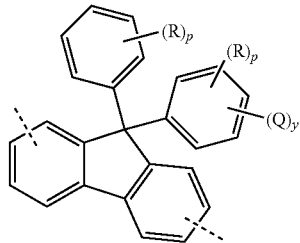

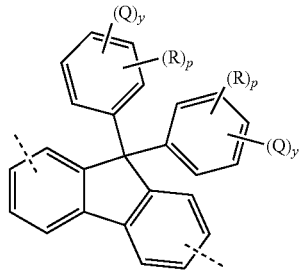

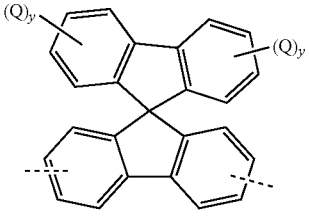

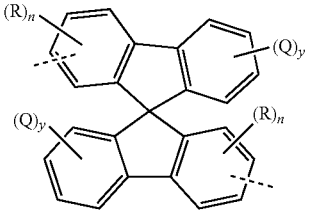

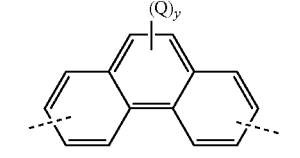

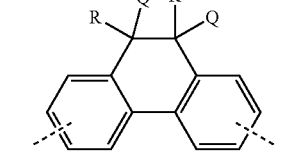

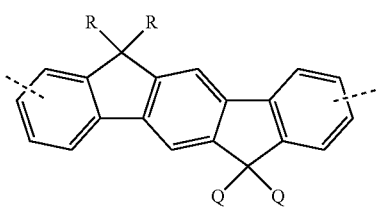

-continued (D21)

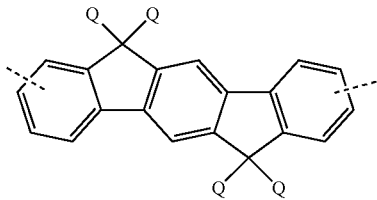

wherein in formulae (D1) to (D7), Q is a crosslinkable group; R is on each occurrence, identically or differently, H, D, F, Ci, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, which may in each case be substituted by one or more radicals $R^1$, where one or more non-adjacent $CH_2$ groups may be replaced by $R^1C=CR^1$, $C\equiv C$, $Si(R^1)_2$, $C=O$, $C=S$, $C=N^1$, $P(=O)(R^1)$, SO, $SO_2$, $NR^1$, O, S or $CONR^1$ and where one or more H atoms may be replaced by B, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroarylaralkyl group having 5 to 60 aromatic ring atoms, which may be substituted by one or more radicals $R^1$ or a diarylamino group, diheteroarylamino group or arylheteroarylamino group having 10 to 40 aromatic ring atoms, which may be substituted by one or more radicals $R^1$, or a crosslinkable group Q, where two or more radicals R may also form a mono- or polycyclic, aliphatic, aromatic and/or benzo-fused ring system with one another; $R^1$ is on each occurrence, identically or differently, H, D, F or an aliphatic hydrocarbon radical having 1 to 20 C atoms, an aromatic and/or heteroaromatic hydrocarbon radical having 5 to 20 C atoms, in which, in addition, one or more H atoms may be replaced by F, where two or more substituents $R^1$ may also form a mono- or polycyclic, aliphatic or aromatic ring system with one another;

p is 0, 1, 2, 3, 4 or 5,
m is 0, 1, 2, 3 or 4,
n is 0, 1, 2 or 3,
y is 0, 1 or 2, and
the dashed lines represent bonds to adjacent structural units in the polymer, but with the proviso that, in relation to a phenylene group, the sum (p+y) is ≤5, and with the proviso that at least one y in each structural unit is ≥1.

11. The formulation according to claim 1, wherein units of formula (A) includes Mo2-Br, Mo2-Bo, Mo3-Br or Mo4-Br (Mo2-Br)

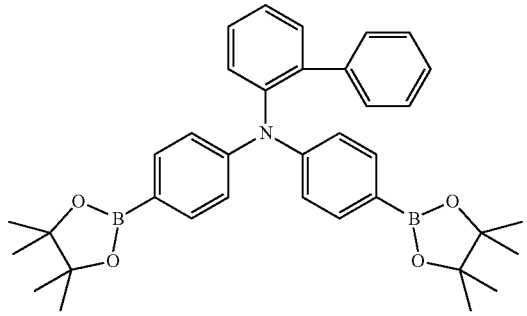

(Mo2-Bo)

(Mo3-Br)

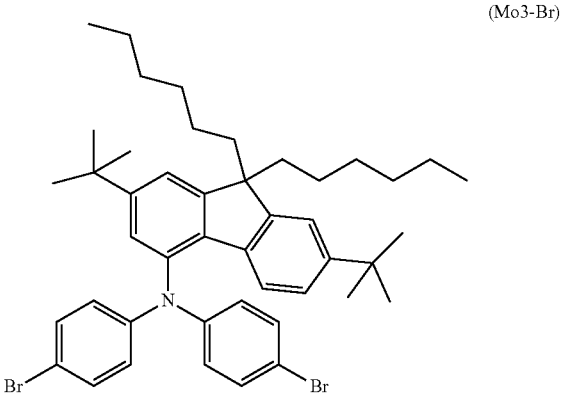

(Mo4-Br)

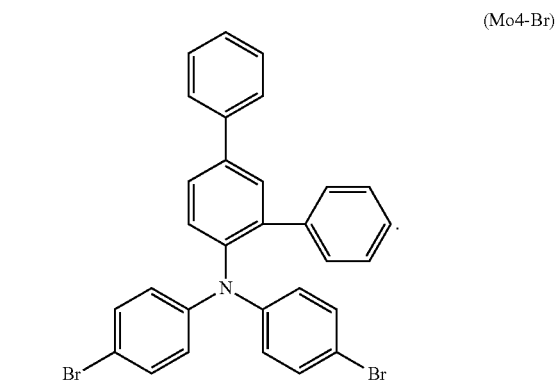

12. The formulation according to claim 1, wherein the at least one structural unit of the formula (A) is selected from the structural units of the following formulae (A3), (A4) and (A5):

(A3)

(A4)
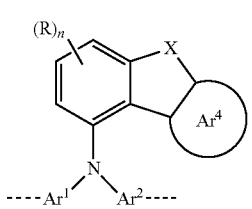
(A5)
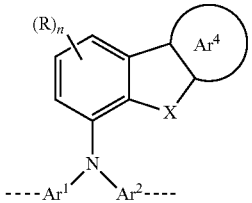
where $Ar^1$, $Ar^2$, $Ar^4$ and R can adopt the meanings indicated above in relation to formula A,
m=0, 1, 2, 3 or 4,
n=0, 1, 2 or 3, and
X=$CR_2$, NR, $SiR_2$, O, S, C=O or P=O.
* * * * *